(12) United States Patent
Li et al.

(10) Patent No.: US 12,464,909 B2
(45) Date of Patent: Nov. 4, 2025

(54) DISPLAY SUBSTRATE, PREPARATION METHOD THEREFOR, AND DISPLAY APPARATUS

(71) Applicant: BOE Technology Group Co., Ltd., Beijing (CN)

(72) Inventors: Mei Li, Beijing (CN); Libin Liu, Beijing (CN)

(73) Assignee: Beijing BOE Technology Development Co., Ltd., Beijing (CN)

(*) Notice: Subject to any disclaimer, the term of this patent is extended or adjusted under 35 U.S.C. 154(b) by 124 days.

(21) Appl. No.: 17/630,172

(22) PCT Filed: Mar. 22, 2021

(86) PCT No.: PCT/CN2021/082057
§ 371 (c)(1),
(2) Date: Sep. 29, 2022

(87) PCT Pub. No.: WO2022/198377
PCT Pub. Date: Sep. 29, 2022

(65) Prior Publication Data
US 2023/0380227 A1   Nov. 23, 2023

(51) Int. Cl.
*H10K 59/131* (2023.01)
*H10K 59/12* (2023.01)
*H10K 59/121* (2023.01)

(52) U.S. Cl.
CPC ....... *H10K 59/131* (2023.02); *H10K 59/1201* (2023.02); *H10K 59/1213* (2023.02)

(58) Field of Classification Search
CPC ............ H10K 59/131; H10K 59/1201; H10K 59/1213; H10D 30/6717; H10D 30/6757; H10D 86/441; H10D 86/60
See application file for complete search history.

(56) References Cited

U.S. PATENT DOCUMENTS

2001/0038134 A1   11/2001   Kumashiro
2004/0066147 A1   4/2004   Park et al.
(Continued)

FOREIGN PATENT DOCUMENTS

CN   103681697 A   3/2014
CN   105742349 A   7/2016
(Continued)

OTHER PUBLICATIONS

European Search Report for 21932012.4 Mailed Jun. 6, 2023.

*Primary Examiner* — Tan N Tran
(74) *Attorney, Agent, or Firm* — Ling Wu; Stephen Yang; Ling and Yang Intellectual Property

(57) ABSTRACT

A display substrate, a preparation method therefor, and a display apparatus are provided. In a plane parallel to the display substrate, the display substrate includes multiple sub-pixels. At least one sub-pixel includes a pixel driving circuit at least including a drive transistor. An active layer of the drive transistor includes a channel region which includes a drain terminal segment extending in a first direction, an intermediate segment connected to the drain terminal segment, and a source terminal segment connected to the intermediate segment. A first end of the drain terminal away from the intermediate segment has a first width, a second end of the drain terminal segment close to the intermediate segment has a second width. The first width is greater than the second width. The first and second widths are dimensions of the drain terminal segment in a second direction. The first direction intersects with the second direction.

19 Claims, 25 Drawing Sheets

(56) References Cited

U.S. PATENT DOCUMENTS

| | | |
|---|---|---|
| 2015/0070253 A1 | 3/2015 | Ono et al. |
| 2015/0129844 A1 | 5/2015 | Kang et al. |
| 2019/0305065 A1 | 10/2019 | Kim et al. |

FOREIGN PATENT DOCUMENTS

| | | | |
|---|---|---|---|
| CN | 105870201 A | | 8/2016 |
| CN | 110323230 A | | 10/2019 |
| JP | 2001-308320 A | | 11/2001 |
| JP | 2002-64195 A | | 2/2002 |
| JP | 2006-222462 A | | 8/2006 |
| JP | 2006-344905 A | * | 12/2006 |
| JP | 2018-157078 A | | 10/2018 |
| KR | 1020190074812 A | | 6/2019 |

* cited by examiner

DISPLAY SUBSTRATE, PREPARATION METHOD THEREFOR, AND DISPLAY APPARATUS

CROSS-REFERENCE TO RELATED APPLICATIONS

The present application is a U.S. National Phase Entry of International Application PCT/CN2021/082057 having an international filing date of Mar. 22, 2021, and the entire contents of the above-identified application are hereby incorporated by reference.

TECHNICAL FIELD

The present disclosure relates, but is not limited, to the technical field of display, and particularly to a display substrate, a method for preparing the display substrate, and a display apparatus.

BACKGROUND

An Organic Light Emitting Diode (OLED for short) is an active light emitting display device having advantages such as self-illumination, wide viewing angle, high contrast, low power consumption, extremely high response speed, thinness, lightness and bendability, and low costs. With constant development of a display technology, a Flexible Display apparatus that uses an OLED as an emitting device and uses a Thin Film Transistor (TFT for short) for signal control has become a mainstream product in the field of display at present.

SUMMARY

The following is a summary of subject matters described in the present disclosure in detail. The summary is not intended to limit the scope of protection of the claims.

The present disclosure provides a display substrate. In a plane parallel to the display substrate, the display substrate includes multiple sub-pixels. At least one of the sub-pixels includes a pixel driving circuit. The pixel driving circuit at least includes a drive transistor. An active layer of the drive transistor includes a channel region. The channel region includes a drain terminal segment extending in a first direction, an intermediate segment connected to the drain terminal segment, and a source terminal segment connected to the intermediate segment. A first end of the drain terminal away from the intermediate segment has a first width, and a second end of the drain terminal close to the intermediate segment has a second width. The first width is greater than the second width. The first width and the second width are dimensions of the drain terminal segment in a second direction. The first direction is intersected with the second direction.

In an exemplary implementation mode, the active layer of the drive transistor further includes a first region connected to the drain terminal segment and a second region connected to the source terminal segment; one end of the first region is connected to the first end of the drain terminal segment, and the other end of the first region is connected to a transistor that receives a data signal; in the plane parallel to the display substrate, a shape of the source terminal segment includes a rectangle.

In an exemplary implementation mode, in the plane parallel to the display substrate, the shape of the drain terminal segment includes a trapezoid; the trapezoid includes a lower base and an upper base of the trapezoid; the first end of the drain terminal segment is the lower base of the trapezoid and has the first width, and the second end of the drain terminal segment is the upper base of the trapezoid and has the second width.

In an exemplary implementation mode, in the plane parallel to the display substrate, the shape of the drain terminal segment includes a combination of a trapezoid and a rectangle, the trapezoid includes a lower base and an upper base of the trapezoid, and the rectangle includes a lower edge and an upper edge of the rectangle; the first end of the drain terminal segment is the lower base of the trapezoid and has the first width, the upper base of the trapezoid is connected to the lower edge of the rectangle and has the second width, and the second end of the drain terminal segment is the upper edge of the rectangle.

In an exemplary implementation mode, in the plane parallel to the display substrate, the shape of the drain terminal segment includes a combination of a rectangle and a trapezoid, the rectangle includes a lower edge and an upper edge of the rectangle, and the trapezoid includes a lower base and an upper base of the trapezoid; the first end of the drain terminal segment is the lower edge of the rectangle, the upper edge of the rectangle is connected to the lower base of the trapezoid and has the first width, and the second end of the drain terminal segment is the upper base of the trapezoid and has the second width.

In an exemplary implementation mode, in the plane parallel to display substrate, the shape of the drain terminal segment includes a combination of a first trapezoid and a second trapezoid, the first trapezoid includes a lower base and an upper base of the first trapezoid, and the second trapezoid includes a lower base and an upper base of the second trapezoid; the first end of the drain terminal segment is the lower base of the first trapezoid and has the first width, the upper base of the first trapezoid is connected to the lower base of the second trapezoid, and the second end of the drain terminal segment is the upper base of the second trapezoid and has the second width.

In an exemplary implementation mode, a ratio of the first width to the second width is 1.5 to 5.

In an exemplary implementation mode, an angle between at least one side of the trapezoid and the first direction is greater than 0° and less than 90°.

In an exemplary implementation mode, in a plane perpendicular to the display substrate, the display substrate includes a semiconductor layer, a first conductive layer, a second conductive layer, and a third conductive layer that are sequentially arranged on a base substrate; the semiconductor layer includes active layers of multiple poly-silicon transistors, the first conductive layer includes gate electrodes of the multiple poly-silicon transistors and a first plate of a storage capacitor, the second conductive layer includes a second plate of the storage capacitor, and the third conductive layer includes a first power supply line, a data signal line, and first electrodes and second electrodes of the multiple poly-silicon transistors.

In an exemplary implementation mode, in a plane perpendicular to the display substrate, the display substrate includes a first semiconductor layer, a first conductive layer, a second conductive layer, a second semiconductor layer, a third conductive layer, a fourth conductive layer, and a fifth conductive layer that are sequentially arranged on a base substrate; the first semiconductor layer includes active layers of multiple poly-silicon transistors, the first conductive layer includes gate electrodes of the multiple poly-silicon transistors and a first plate of a storage capacitor, the second conductive layer includes a second plate of the storage capacitor, the second semiconductor layer includes active layers of multiple oxide transistors, the third conductive layer includes gate electrodes of the multiple oxide transistors, the fourth conductive layer includes first electrodes and second electrodes of the multiple poly-silicon transistors, and first electrodes and second electrodes of the multiple oxide transistors, and the fifth conductive layer includes a first power supply line and a data signal line.

In an exemplary implementation mode, the intermediate segment of the channel region includes a second channel segment, a third channel segment, and a fourth channel segment; the second end of the drain terminal segment is connected to a first end of the second channel segment; a second end of the second channel segment extends in a direction opposite to the second direction, to be connected to a first end of the third channel segment; a second end of the third channel segment extends in the first direction, to be connected to a first end of the fourth channel segment; a second end of the fourth channel segment extends in the second direction, to be connected to a first end of the source terminal segment; and a second end of the source terminal segment is connected to the second region of the active layer.

The present disclosure further provides a display apparatus, which includes the abovementioned display substrate.

The present disclosure further provides a method for preparing a display substrate. In a plane parallel to the display substrate, the display substrate includes multiple sub-pixels, at least one sub-pixel includes a pixel driving circuit, and the pixel driving circuit at least includes a drive transistor. The preparation method includes the following operation.

A semiconductor layer or a first semiconductor layer is formed on a base substrate. The semiconductor layer or the first semiconductor layer at least includes an active layer of the drive transistor, the active layer of the drive transistor includes a channel region, the channel region includes a drain terminal segment extending in a first direction, an intermediate segment connected to the drain terminal segment, and a source terminal segment connected to the intermediate segment; a first end of the drain terminal segment away from the intermediate segment has a first width, and a second end of the drain terminal segment close to the intermediate segment has a second width; the first width is greater than the second width; the first width and the second width are dimensions of the drain terminal segment in a second direction, and the first direction is intersected with the second direction.

Other aspects may be comprehended upon reading and understanding of the drawings and the detailed descriptions.

BRIEF DESCRIPTION OF DRAWINGS

Accompany drawings are used to provide further understanding of technical solutions of the disclosure, and form a part of the description. The accompany drawings and embodiments of the disclosure are used to explain the technical solutions of the disclosure, and do not form limitations on the technical solutions of the disclosure.

FIG. 7b is a sectional view along direction A-A in FIG. 7a.

FIG. 8b is a sectional view along direction A-A in FIG. 8a.

FIG. 8c is an enlarged view of a channel region of a drive transistor in FIG. 8a.

FIG. 9b is a sectional view along direction A-A in FIG. 9a.

FIG. 10b is a sectional view along direction A-A in FIG. 10a.

FIG. 11b is a sectional view along direction A-A in FIG. 11a.

FIG. 12b is a sectional view along direction A-A in FIG. 12a.

FIG. 13b is a sectional view along direction A-A in FIG. 13a.

FIG. 15b is a sectional view along direction B-B in FIG. 15a.

FIG. 16b is a sectional view along direction B-B in FIG. 16a.

FIG. 17b is a sectional view along direction B-B in FIG. 17a.

FIG. 18b is a sectional view along direction B-B in FIG. 18a.

FIG. 19b is a sectional view along direction B-B in FIG. 19a.

FIG. 20b is a sectional view along direction B-B in FIG. 20a.

FIG. 21b is a sectional view along direction B-B in FIG. 21a.

FIG. 22b is a sectional view along direction B-B in FIG. 22a.

FIG. 23b is a sectional view along direction B-B in FIG. 23a.

FIG. 24b is a sectional view along direction B-B in FIG. 24a.

DESCRIPTION OF REFERENCE SIGNS

Figure 1:
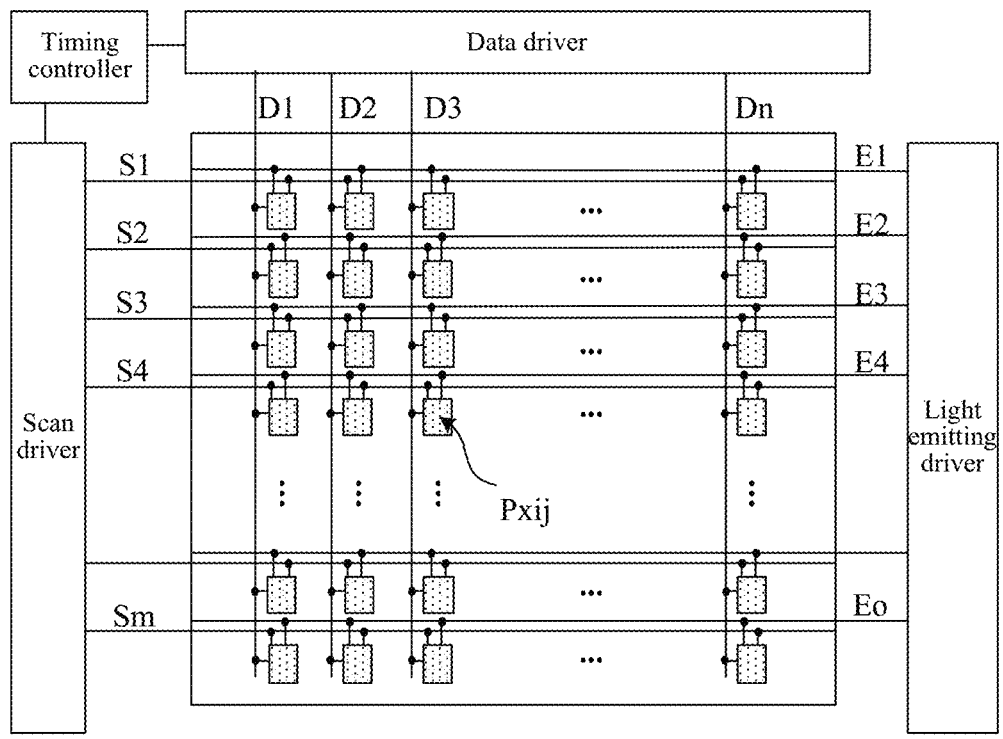
FIG. 1 is a schematic structural diagram of a display apparatus.

10—base; 11—first active layer; 12—second active layer; 13—third active layer; 14—fourth active layer; 15—fifth active layer;
16—sixth active layer; 17—seventh active layer; 18—channel region;
21—first scanning signal line; 22—second scanning signal line; 23—light emitting control line;
24—first plate; 31—initial signal line; 32—second plate; 33—shield electrode; 34—opening; 35—plate connection line;
36—node electrode; 37—first shield layer; 38—second shield layer;
41—first power supply line; 42—data signal line; 43—first connection electrode;
44—second connection electrode; 45—third connection electrode; 48—first auxiliary signal line;
49—second auxiliary signal line; 51—power supply connection line; 52—initial signal line;
53—fifth connection electrode; 54—sixth connection electrode; 55—seventh connection electrode;
56—eighth connection electrode; 61—data signal line; 62—first power supply line;
63—anode connection electrode; 71—anode; 91—first insulating layer;
92—second insulating layer; 93—third insulating layer; 94—fourth insulating layer;
95—fifth insulating layer; 96—sixth insulating layer; 97—seventh insulating layer;
98—first planarization layer; 101—base; 102—driving circuit layer;
103—light emitting structure layer; 104—encapsulation layer; 301—anode;
302—pixel definition layer; 303—organic light emitting layer; 304—cathode;
401—first encapsulation layer; 402—second encapsulation layer; 403—third encapsulation layer.

DETAILED DESCRIPTION

In order to make purposes, technical solutions, and advantages of the present disclosure clearer, the embodiments of the present disclosure will be described in detail below with reference to the accompany drawings. It is to be noted that implementation modes may be implemented in various forms. Those of ordinary skills in the art can easily understand such a fact that implementation modes and contents may be transformed into various forms without departing from the purpose and scope of the present disclosure. Therefore, the present disclosure should not be explained as being limited to the contents described in the following implementation modes only. The embodiments in the present disclosure and features in the embodiments may be combined randomly if there is no conflict.

In the accompanying drawings, sizes of constituent element, thicknesses of layers, or regions may be exaggerated sometimes for clarity. Therefore, an implementation mode of the present disclosure is not always limited to the sizes, and the shapes and size of each component in the drawings do not reflect the actual scale. In addition, the accompanying drawings schematically illustrate ideal examples, and an implementation mode of the present disclosure is not limited to the shapes, numerical values, or the like shown in the drawings.

Ordinal numerals "first", "second", "third", etc., in this specification are set not to form limitations in number but only to avoid confusion between constituent elements.

In this specification, for sake of convenience, expressions "central", "above", "below", "front", "back", "vertical", "horizontal", "top", "bottom", "inside", "outside", etc., indicating directional or positional relationships are used to illustrate positional relationships between the constituent elements, which are only used to facilitate describing this specification and simplifying the present specification, rather than indicating or implying that involved devices or elements must have specific orientations and be structured and operated with the specific orientations, thus they should not be understood as limitations on the present disclosure. The positional relationships between the constituent elements may be changed as appropriate according to a direction according to which each constituent element is described. Therefore, appropriate replacements based on situations are allowed, which are not limited to expressions in the specification.

In this specification, unless otherwise specified and defined, terms "mounting", "mutual connection", and "connection" should be understood in a broad sense. For example, such term may be fixed connection, or detachable connection, or integral connection, it may be mechanical connection or electrical connection, may be direct connection, or indirect connection through an intermediate, or internal communication between two elements. Those of ordinary skills in the art can understand specific meanings of the above terms in the present disclosure according to specific situations.

In this specification, a transistor refers to an element that at least includes three terminals, i.e., a gate electrode, a drain electrode, and a source electrode. The transistor has a channel region between the drain electrode (drain electrode terminal, drain region, or drain electrode) and the source electrode (source electrode terminal, source region, or source electrode), and a current may flow through the drain electrode, the channel region, and the source region. It is to be noted that in this specification, the channel region refers to a region that a current mainly flows through.

In this specification, a first electrode may be the drain electrode, and a second electrode may be the source electrode. Alternatively, the first electrode may be a source electrode, and the second electrode may be a drain electrode. In cases that transistors with opposite polarities are used, or a current direction changes during operation of a circuit, or the like, functions of the "source electrode" and the "drain electrode" are sometimes interchangeable. Therefore, the "source electrode" and the "drain electrode", as well as the "source terminal" and the "drain terminal" are interchangeable in the specification.

In this specification, "electric connection" includes connection of the constituent elements through an element with a certain electric action. The "element with a certain electric action" is not particularly limited as long as electric signals between the connected constituent elements can be sent and received. Examples of the "element with a certain electric action" not only include electrodes and wirings, but also include switch elements such as transistors, resistors, inductors, capacitors, other element with various functions, etc.

In this specification, "parallel" refers to a state that an angle formed by two straight lines is above −10° and below 10°, and thus may also include a state that the angle is above −5° and below 5°. In addition, "perpendicular" refers to a state that an angle formed by two straight lines is above 80° and below 100°, and thus may also include a state that the angle is above 85° and below 95°.

In the specification, "film" and "layer" are interchangeable. For example, "conductive layer" may be replaced with "conductive film" sometimes. Similarly, "insulating film" may be replaced with "insulating layer" sometimes.

In the present disclosure, "about" refers to that a boundary is defined not so strictly and numerical values within process and measurement error ranges are allowed.

FIG. 1 is a schematic structural diagram of a display apparatus. As shown in FIG. 1, an OLED display apparatus may include a timing controller, a data driver, a scanning driver, a light emitting driver, and a pixel array. The pixel array may include multiple scanning signal lines (S1 to Sm), multiple data signal lines (D1 to Dn), multiple light emitting signal lines (E1 to Eo), and multiple sub-pixels Pxij. In an exemplary implementation mode, the timing controller may provide the data driver with a gray-scale value and a control signal which are suitable for a specification of the data driver for, provide the scan driver with a clock signal, a scan starting signal, etc., which are suitable for a specification of the scan driver, and provide the light emitting driver with a clock signal, a transmission stopping signal, etc., which are suitable for a specification of the light emitting driver. The data driver may generate a data voltage to be provided to the data signal lines D1, D2, D3, . . . to Dn using the gray-scale value and the control signal received from the timing controller. For example, the data driver may sample the gray-scale value using the clock signal and apply a data voltage corresponding to the gray-scale value to the data signal lines D1 to Dn by taking a sub-pixel row as a unit, wherein n may be a natural number. The scanning driver may receive the clock signal, the scan starting signal, etc., from the timing controller to generate a scanning signal to be provided to the scanning lines S1, S2, S3, . . . to Sm. For example, the scanning driver may sequentially provide the scanning signal with an on-level pulse for the scanning signal lines S1 to Sm. For example, the scanning driver may be constructed in a form of a shift register and sequentially transmit the scan starting signal provided in form of an on-level pulse to a next-stage circuit to generate the scanning signal under the control of the clock signal, wherein m may be a natural number. The light emitting driver may receive the clock signal, the transmission stopping signal, etc., from the timing controller to generate a transmission signal to be provided to the light emitting signal lines E1, E2, E3, . . . to Eo. For example, the light emitting driver may sequentially provide the emission signal with an off-level pulse to the light emitting signal lines E1 to Eo. For example, the light emitting driver may be constructed into a form of a shift register and can sequentially transmit a transmission stopping signal provided in form of an off-level pulse to a next-stage circuit to generate the transmission signal under the control of the clock signal, wherein o may be a natural number. The pixel array may include multiple sub-pixels Pxij. Each sub-pixel Pxij may be connected to a corresponding data signal line, a corresponding scanning signal line, and a corresponding light emitting signal line. Herein, i and j may be natural numbers. The sub-pixel Pxij may refer to a sub-pixel whose transistor therein is connected to an i-th scanning signal line and a j-th data signal line.

Figure 2:
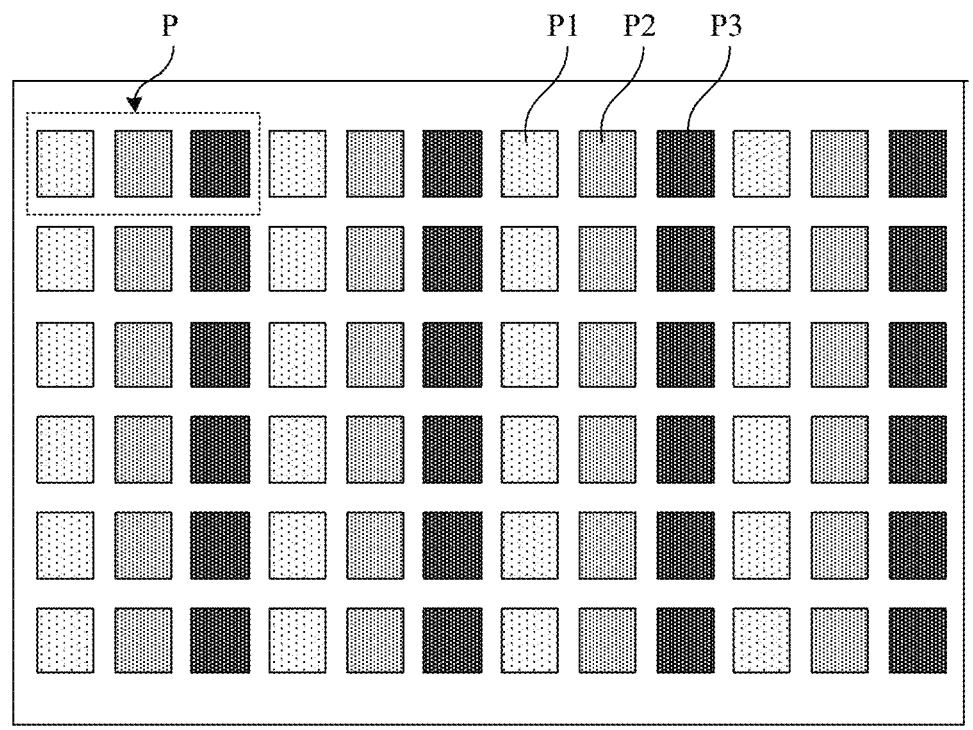
FIG. 2 is a schematic plan view of a display substrate.

FIG. 2 is a schematic plan view of a display substrate. As shown in FIG. 2, the display panel may include multiple pixel units P arranged in an array. At least one of the multiple pixel units P includes a first light emitting unit (sub-pixel) P1 that emits light of a first color, a second light emitting unit P2 that emits light of a second color, and a third light emitting unit P3 that emits light of a third color. The first light emitting unit P1, the second light emitting unit P2, and the third light emitting unit P3 each include a pixel driving circuit and a light emitting device. The pixel driving circuit in each of the first light emitting unit P1, the second light emitting unit P2, and the third light emitting unit P3 is connected to a scanning signal line, a data signal line, and a light emitting signal line respectively. The pixel driving circuit is configured to receive a data voltage transmitted by the data signal line and output a corresponding current to the light emitting device under the control of the scanning signal line and the light emitting signal line. The light emitting device in each of the first light emitting unit P1, the second light emitting unit P2, and the third light emitting unit P3 is connected to the pixel driving circuit of the light emitting unit where it is located. The light emitting device is configured to emit light with a corresponding brightness in response to the current output by the pixel driving circuit of the light emitting unit where it is located.

In an exemplary implementation mode, the pixel unit P may include a Red (R) light emitting unit, a Green (G) light emitting unit, and a Blue (B) light emitting unit, or may include a red light emitting unit, a green light emitting unit, a blue light emitting unit, and a white light emitting unit. No limits are made thereto in the present disclosure. In an exemplary implementation mode, a shape of a light emitting unit in a pixel unit may be a rectangle, a rhombus, a pentagon, or a hexagon. In case that the pixel unit includes three light emitting units, the three light emitting units may be arranged in parallel in a horizontal direction, in parallel in a vertical direction, or in a Delta shape. In case that the pixel unit includes four light emitting units, the four light emitting units may be arranged in parallel in the horizontal direction, in parallel in the vertical direction, or in a square. No limits are made thereto in the present disclosure.

Figure 3:
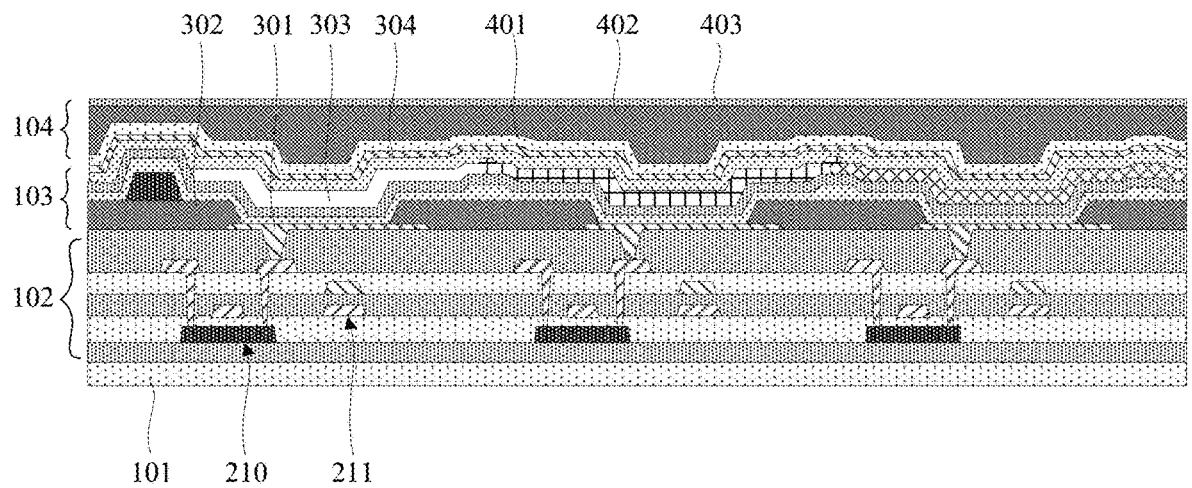
FIG. 3 is a schematic sectional view of a display substrate.

FIG. 3 is a schematic sectional view of a display substrate, illustrating structures of three sub-pixels of an OLED display substrate. As shown in FIG. 3, on a plane perpendicular to the display substrate, the display substrate may include a driving circuit layer 102 arranged on a base substrate 101, a light emitting structure layer 103 arranged on a side of the driving circuit layer 102 away from the base substrate, and an encapsulation layer 104 arranged on a side of the light emitting structure layer 103 away from the base substrate. In some possible implementation modes, the display substrate may include other film layers, such as a spacer, which is not limited in the preset disclosure.

In an exemplary implementation mode, the base substrate 101 may be a flexible base substrate, or a rigid base substrate. The driving circuit layer 102 of each sub-pixel may include multiple transistors and a storage capacitor that form a pixel driving circuit. In FIG. 3, only one drive transistor 210 and one storage capacitor 211 are taken as an example for illustration. The light emitting structure layer 103 of each sub-pixel may include multiple film layers that form a light emitting device. The multiple film layers may include an anode 301, a pixel definition layer 302, an organic light-emitting layer 303, and a cathode 304. The anode 301 is connected to a drain electrode of the drive transistor 210 through a via. The organic light-emitting layer 303 is connected to the anode 301. The cathode 304 is connected to the organic light-emitting layer 303. The organic light-emitting layer 303 is driven by the anode 301 and the cathode 304 to emit light of a corresponding color. The encapsulation layer 104 may include a first encapsulation layer 401, a second encapsulation layer 402, and a third encapsulation layer 403 that are stacked. The first encapsulation layer 401 and the third encapsulation layer 403 may be made of an inorganic material. The second encapsulation layer 402 may be made of an organic material. The second encapsulation layer 402 is arranged between the first encapsulation layer 401 and the third encapsulation layer 403 so that it can be ensured that external water vapor cannot enter the light emitting structure layer 103.

In an exemplary implementation mode, the organic light-emitting layer 303 may include a Hole Injection Layer (HIL for short), a Hole Transport Layer (HTL for short), an Electron Block Layer (EBL for short), an Emitting Layer (EML for short), a Hole Block Layer (HBL for short), an Electron Transport Layer (ETL for short), and an Electron Injection Layer (EIL for short) that are stacked. In an exemplary implementation mode, the hole injection layers and the electron injection layers of all the sub-pixels may be connected together to form a through layer, the hole transport layers and the electron transport layers of all the sub-pixels may be connected together to form a through layer, the hole block layers of all the sub-pixels may be connected together to form a through layer, and the emitting layers and the electron block layers of adjacent sub-pixels may be slightly overlapped, or may be isolated from each other.

Figure 4:
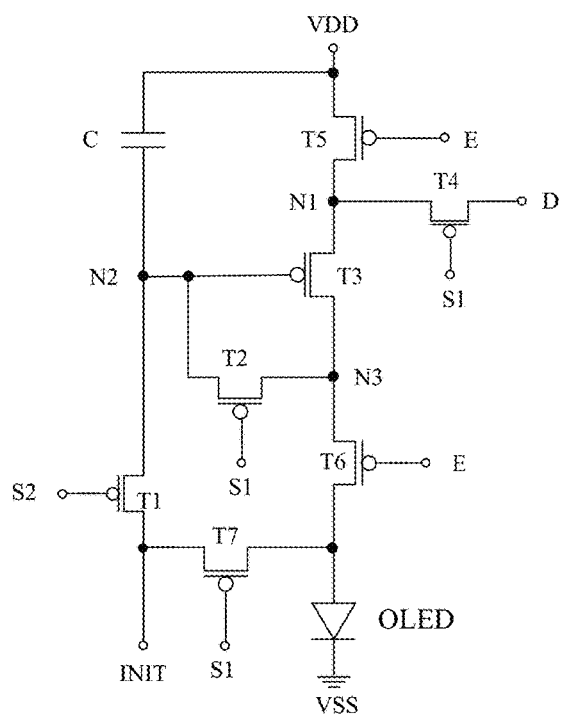
FIG. 4 is an equivalent circuit diagram of a pixel driving circuit.

In an exemplary implementation mode, the pixel driving circuit may be of a structure of 3T1C, 4T1C, 5T1C, 5T2C, 6T1C, or 7T1C. FIG. 4 is an equivalent circuit diagram of a pixel driving circuit. As shown in FIG. 4, the pixel driving circuit may include seven transistors (a first transistor T1 to a seventh transistor T7), a storage capacitor C, and seven signal lines (a data signal line D, a first scanning signal line S1, a second scanning signal line S2, a light emitting signal line E, an initial signal line INIT, a first power supply line VDD, and a second power supply line VSS).

In an exemplary implementation mode, a first terminal of the storage capacitor C is connected to the first power supply line VDD, and a second terminal of the storage capacitor C is connected to a second node N2, that is, the second terminal of the storage capacitor C is connected to a control electrode of a third transistor T3.

A control electrode of the first transistor T1 is connected to the second scanning signal line S2, a first electrode of the first transistor T1 is connected to the initial signal line INIT, and a second electrode of the first transistor is connected to the second node N2. When scanning signal with an on-level is applied to the second scanning signal line S2, the first transistor T1 transmits an initial voltage to the control electrode of the third transistor T3 so as to initialize quantity of electric charge of the control electrode of the third transistor T3.

A control electrode of the second transistor T2 is connected to the first scanning signal line S1, a first electrode of the second transistor T2 is connected to the second node N2, and a second electrode of the second transistor T2 is connected to a third node N3. When the scanning signal with the on-level is applied to the first scanning signal line S1, the second electrode of the second transistor T2 is connected to the control electrode of the third transistor T3.

The control electrode of the third transistor T3 is connected to the second node N2, that is, the control electrode of the third transistor T3 is connected to the second terminal of the storage capacitor C. A first electrode of the third transistor T3 is connected to the first node N1, and a second electrode of the third transistor T3 is connected to the third node N3. The third transistor T3 may be referred to as a drive transistor. The third transistor T3 determines magnitude of a drive current flowing between the first power supply line VDD and the second power supply line VSS according to a potential difference between the control electrode and the first electrode of the third transistor T3.

A control electrode of the fourth transistor T4 is connected to the first scanning signal line S1, a first electrode of the fourth transistor T4 is connected to the data signal line D, and a second electrode of the fourth transistor T4 is connected to the first node N1. The fourth transistor T4 may be referred to as a switch transistor, a scan transistor, etc. When the scanning signal with the on-level is applied to the first scanning signal line S1, the fourth transistor T4 inputs a data voltage of the data signal line D to the pixel driving circuit.

A control electrode of the fifth transistor T5 is connected to the light emitting signal line E, a first electrode of the fifth transistor T5 is connected to the first power supply line VDD, and a second electrode of the fifth transistor T5 is connected to the first node N1. A control electrode of the sixth transistor T6 is connected to the light emitting signal line E, a first electrode of the sixth transistor T6 is connected to the third node N3, and a second electrode of the sixth transistor T6 is connected to a first electrode of the light emitting device. The fifth transistor T5 and the sixth transistor T6 may be referred to as light emitting transistors. When the light emitting signal with the on-level is applied to the light emitting signal line E, a driving circuit path is formed between the first power supply line VDD and the second power supply line VSS by the fifth transistor T5 and the sixth transistor T6, to drive the light emitting device to emit light.

A control electrode of the seventh transistor T7 is connected to the first scanning signal line S1, a first electrode of the seventh transistor T7 is connected to the initial signal line INIT, and a second electrode of the seventh transistor T7 is connected to the first electrode of the light emitting device. When the scanning signal with the on-level is applied to the first scanning signal line S1, the seventh transistor T7 transmits to an initial voltage to the first electrode of the light emitting device, so as to initialize the quantity of electric charge accumulated in the first electrode of the light emitting device or release the quantity of electric charge accumulated in the first electrode of the light emitting device.

In an exemplary implementation mode, a second electrode of the light emitting device is connected to the second power supply line VSS. A signal of the second power supply line VSS is a low-level signal. A signal of the first power supply line VDD is a high-level signal that is continuously provided. The first scanning signal line S1 is a scanning signal line in a pixel driving circuit of a current display row, and the second scanning signal line S2 is a scanning signal line in a pixel driving circuit of a previous display row. That is, for an n-th display row, the first scanning signal line S1 is S(n), and the second scanning signal line S2 is S(n−1). The second scanning signal line S2 of the current display row and the first scanning signal line S1 in the pixel driving circuit of the previous display row are the same signal line, thus signal lines of a display panel can be reduced, so that narrow bezel of the display panel can be achieved.

In an exemplary implementation mode, the first transistor T1 to the seventh transistor T7 may be P-type transistors or N-type transistors. Use of the same type of transistors in the pixel driving circuit may simplify process flows, reduce process difficulties of a display panel, and improve the product yield. In some possible implementation modes, the first transistor T1 to the seventh transistor T7 may include P-type transistors and N-type transistors.

In an exemplary implementation mode, the first transistor T1 to the seventh transistor T7 may be low temperature poly-silicon thin film transistors, or may be oxide thin film transistors, or may be low temperature poly-silicon thin film transistors and oxide thin film transistors. An active layer of the low temperature poly-silicon thin film transistor may be Low Temperature Poly-Silicon (LTPS for short), and an active layer of the oxide thin film transistor may be an Oxide semiconductor. The low temperature poly-silicon thin film transistor has advantages such as high migration rate and fast charging. The oxide thin film transistor has advantages such as low drain current. The low temperature poly-silicon thin film transistor and the oxide thin film transistor are integrated on one display substrate to form a Low Temperature Polycrystalline Oxide (LTPO for short) display substrate, so that advantages of the low temperature poly-silicon thin film transistor and the oxide thin film transistor can be utilized, low-frequency drive can be realized, power consumption can be reduced, and display quality can be improved.

In an exemplary implementation mode, the first scanning signal line S1, the second scanning signal line S2, the light emitting signal line E, and the initial signal line INIT extend horizontally, and the second power supply line VSS, the first power supply line VDD, and the data signal line D extend vertically.

In an exemplary implementation mode, the light emitting device may be an organic light-emitting diode (OLED), including a first electrode (anode), an organic light-emitting layer, and a second electrode (cathode) that are stacked.

Figure 5:
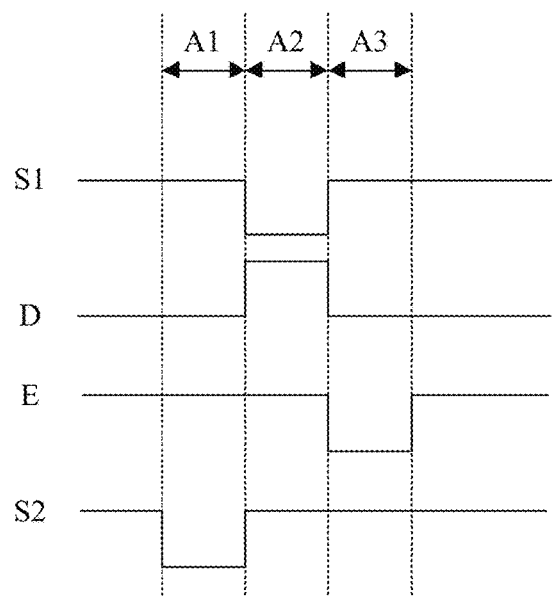
FIG. 5 is an operation timing diagram of a pixel driving circuit.

FIG. 5 is an operation timing diagram of a pixel driving circuit. The exemplary embodiment of the present disclosure will be described through an operation process of the pixel driving circuit shown in FIG. 4. As shown in FIG. 4, the pixel driving circuit includes seven transistors (the first transistor T1 to the seventh transistor T7), a storage capacitor C, and seven signal lines (the data signal line D, the first scanning signal line S1, the second scanning signal line S2, the light emitting signal line E, the initial signal line INIT, the first power supply line VDD, and the second power supply line VSS), and the seven transistors are all P-type transistors.

In an exemplary implementation mode, the operation process of the pixel driving circuit may include the following:

In a first stage A1 that is called a reset stage, a signal of the second scanning signal line S2 is a low-level signal, and signals of the first scanning signal line S1 and the light emitting signal line E are high-level signals. The signal of the second scanning signal line S2 being the low-level signal allows the first transistor T1 to be turned on, a signal of the initial signal line INIT is provided to the second node N2 to initialize the storage capacitor C, thereby clearing an initial data voltage in the storage capacitor. Signals of the first scanning signal line S1 and the light emitting signal line E being high-level signals allow the second transistor T2, the fourth transistor T4, the fifth transistor T5, the sixth transistor T6, and the seventh transistor T7 to be cut off. In this stage, the OLED does not emit light.

In a second stage A2, called a data write stage or a threshold compensation stage, the signal of the first scanning signal line S1 is a low-level signal, the signals of the second scanning signal line S2 and the light emitting signal line E are high-level signals, and the data signal line D outputs a data voltage. In this stage, the second terminal of the storage capacitor C is at a low level, so that the third transistor T3 is turned on. The signal of the first scanning signal line S1 being the low-level signal allows the second transistor T2, the fourth transistor T4, and the seventh transistor T7 to be turned on. The second transistor T2 and the fourth transistor T4 are turned on so that the data voltage output by the data signal line D is provided to the second node N2 through the first node N1, the turned-on third transistor T3, the third node N3, and the turned-on second transistor T2, a voltage difference between the data voltage output by the data signal line D and a threshold voltage of the third transistor T3 is charged into the storage capacitor C, wherein a voltage at the second terminal (the second node N2) of the storage capacitor C is Vd−|Vth|, Vd is the data voltage output by the data signal line D, and Vth is the threshold voltage of the third transistor T3. The seventh transistor T7 is turned on to provide an initial voltage of the initial signal line INIT to a first electrode of the OLED to initialize (reset) the first electrode of the OLED and clear its internal pre-stored voltage, thereby completing the initialization to ensure that the OLED does not emit light. The signal of the second scanning signal line S2 being the high-level signal allows the first transistor T1 to be cut off. The signal of the light emitting signal line E being the high-level signal allows the fifth transistor T5 and the sixth transistor T6 to be cut off.

In a third stage A3 that is called a light emitting stage, the signal of the light emitting signal line E is a low-level signal, and the signals of the first scanning signal line S1 and the second scanning signal line S2 are high-level signals. The signal of the light emitting signal line E being the low-level signal allows the fifth transistor T5 and the sixth transistor T6 to be turned on, a supply voltage output by the first power supply line VDD provides a drive voltage for the first electrode of the OLED through the turned-on fifth transistor T5, the third transistor T3, and the sixth transistor T6, thereby driving the OLED to emit light.

In a process of driving the pixel driving circuit, a drive current flowing through the third transistor T3 (the drive transistor) is determined by a voltage difference between the gate electrode and the first electrode of the drive transistor. A voltage at the second node N2 is Vdata−|Vth|, therefore the drive current of the third transistor T3 is:

$$I=K*(Vgs-Vth)^2=K*[(Vdd-Vd+|Vt|)-Vth]^2=K*[(Vdd-Vd]^2,$$

where I is the drive current flowing through the third transistor T3, that is, the drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is a power supply voltage output by the first power supply line VDD.

Figure 6:
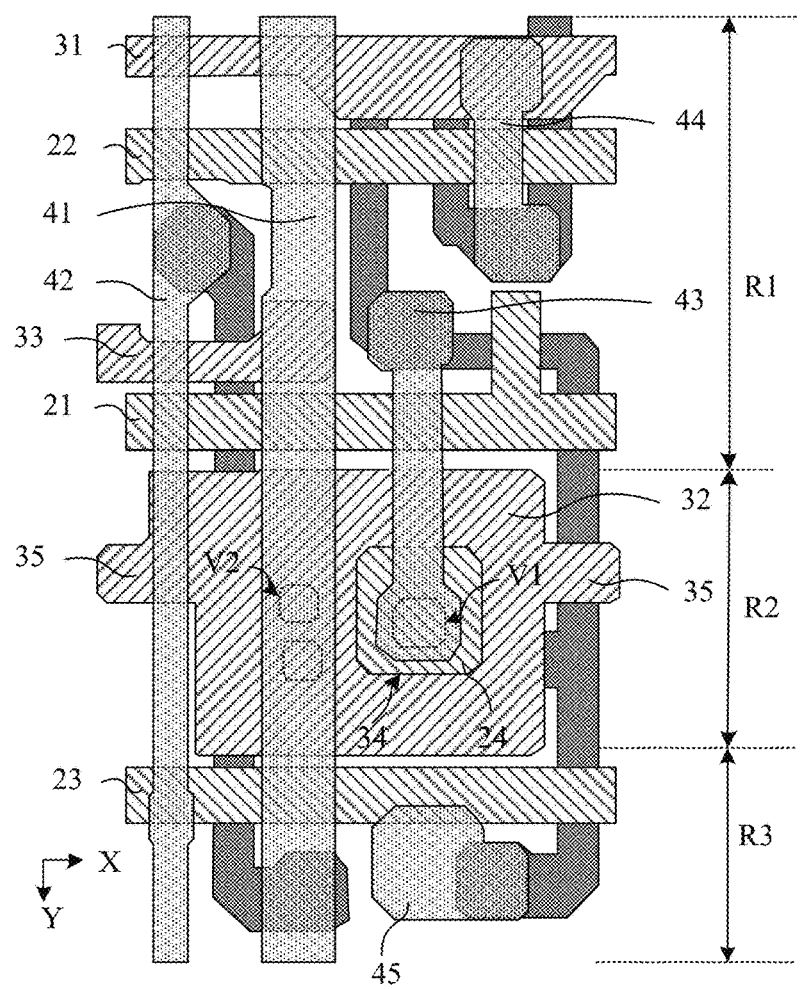
FIG. 6 is a schematic structural diagram of a display substrate according to an exemplary embodiment of the present disclosure.

FIG. 6 is a schematic structural diagram of a display substrate according to an exemplary embodiment of the present disclosure, illustrating a planar structure of one sub-pixel. As shown in FIG. 6, in a plane parallel to the display substrate, a first scanning signal line 21, a second scanning signal line 22, a light emitting control line 23, an initial signal line 31, a first power supply line 41, a data signal line 42, and a pixel driving circuit are arranged in the sub-pixel of the display substrate. The pixel driving circuit may include multiple transistors and a storage capacitor. The storage capacitor includes a first plate 24 and a second plate 32. The multiple transistors may include a first transistor, a second transistor, a third transistor, a fourth transistor, a fifth transistor, a sixth transistor, and a seventh transistor, wherein the third transistor is a drive transistor.

In a plane perpendicular to the display substrate, the display substrate may include a semiconductor layer, a first conductive layer, a second conductive layer, and a third conductive layer that are sequentially arranged on a base substrate. In the exemplary embodiment, the semiconductor layer may include active layers of the multiple transistors. The first conductive layer may include the first scanning signal line 21, the second scanning signal line 22, the light emitting control line 23, the first plate 24 of the storage capacitor, and gate electrodes of the multiple transistors. The second conductive layer may include the initial signal line 31, the second plate 32 of the storage capacitor, a shield electrode 33, and a plate connection line 35. The third conductive layer may include the first power supply line 41, the data signal line 42, a first connection electrode 43, a second connection electrode 44, and a third connection electrode 45.

In an exemplary implementation mode, the display substrate may include a first insulating layer, a second insulating layer, a third insulating layer, and a fourth insulating layer. The first insulating layer is arranged between the base substrate and the semiconductor layer. The second insulating layer is arranged between the semiconductor layer and the first conductive layer. The third insulating layer is arranged between the first conductive layer and the second conductive layer. The fourth insulating layer is arranged between the second conductive layer and the third conductive layer.

In an exemplary implementation mode, in a second direction Y, the sub-pixel may be divided into a first region R1, a second region R2, and a third region R3. The second region R2 is located between the first region R1 and the third region R3. In an exemplary implementation mode, the first scanning signal line 21, the second scanning signal line 22, and the initial signal line 31 that extend in a first direction X are located in the first region R1, the first plate 24 and the second plate 32 are located in the second region R2, and the light emitting control line 23 extending in the first direction X is located in the third region R3. In the exemplary embodiment of the present disclosure, the first direction X is intersected with the second direction Y. In some exemplary implementation modes, the first direction X may be a direction of a sub-pixel row (horizontal direction), and the second direction Y may be a direction of a sub-pixel column (vertical direction).

In an exemplary implementation mode, a gate electrode of the first transistor is connected to the second scanning signal line 22, a first electrode of the first transistor is connected to the initial signal line 31, and a second electrode of the first transistor is connected to a first electrode of the second transistor, a gate electrode of the third transistor, and the first plate 24, respectively. A gate electrode of the second transistor is connected to the first scanning signal line 21, and a second electrode of the second transistor is connected to a second electrode of the third transistor and a first electrode of the sixth transistor. A first electrode of the third transistor is connected to a second electrode of the fourth transistor and a second electrode of the fifth transistor. A gate electrode of the fourth transistor is connected to the first scanning signal line 21, a first electrode of the fourth transistor is connected to the data signal line 42, and a second electrode of the fourth transistor is connected to the first electrode of the third transistor. A gate electrode of the fifth transistor is connected to the light emitting control line 23, and a first electrode of the fifth transistor is connected to the first power supply line 41 and the second plate 32 respectively. A gate electrode of the sixth transistor is connected to the light emitting control line 23, and a second electrode of the sixth transistor is connected to a second electrode of the seventh transistor T7 and a first electrode of the light emitting device respectively. A gate electrode of the seventh transistor is connected to the second scanning signal line 22, a first electrode of the seventh transistor is connected to the initial signal line 31, and the second electrode of the seventh transistor is connected to the second electrode of the sixth transistor and the first electrode of the light emitting device.

In an exemplary implementation mode, the third insulating layer and the fourth insulating layer that cover the first plate 24 are provided with a first via V1. One end of the first connection electrode 43 is connected to the first plate 24 through the first via V1, and the other end of the first connection electrode 43 is connected to the active layer of the first transistor and the active layer of the second transistor through a via. The first connection electrode 43 may be used as the second electrode of the first transistor and the first electrode of the second transistor.

In an exemplary implementation mode, the second connection electrode 44 may be respectively connected to the initial signal line 31 and the active layer of the seventh transistor through a via. The first connection electrode 43 may be used as the first electrode of the seventh transistor and the first electrode of the first transistor.

In an exemplary implementation mode, the third connection electrode 45 may be respectively connected to the active layer of the sixth transistor and the active layer of the seventh transistor through a via. The third connection electrode 45 may be used as the second electrode of the sixth transistor and the second electrode of the seventh transistor.

In an exemplary implementation mode, the fourth insulating layer that covers the second plate 32 is provided with a second via V2, and the first power supply line 41 is connected to the second plate 32 through the second via V2.

In an exemplary implementation mode, the first power supply line 41 is connected to the shield electrode 33 through a via. There is an overlap region between an orthographic projection of the shield electrode 33 on the base substrate and an orthographic projection of the data signal line 42 on the base substrate.

In an exemplary implementation mode, the plate connection line 35 is arranged in the second conductive layer. The plate connection line 35 is in a shape of a straight line and is parallel to the first direction X. A first end of the plate connection line 35 is connected to the second plate 32 of the sub-pixel, and a second end of the plate connection line extends in the first direction X or in a direction opposite to the first direction X, and is connected to the second plate 32 of an adjacent sub-pixel.

In an exemplary implementation mode, the second plate 32 is provided with an opening 34, and an orthographic projection of the opening 34 on the base substrate includes an orthographic projection of the first via V1 on the base substrate.

In an exemplary implementation mode, the data signal line 42 may be connected to the active layer of the fourth transistor through a via.

In an exemplary implementation mode, the first plate 24 is also used as the gate electrode of the third transistor. There is an overlap region between an orthographic projection of the first plate 24 on the base substrate and an orthographic projection of the third active layer on the base substrate. The third active layer in the overlap region is used as a channel region of the third transistor. In an exemplary implementation mode, a first end of the channel region is connected to a first region of the third active layer, and the first region of the third active layer is connected to the fourth transistor that receives a data signal. A second end of the channel region is connected to a second region of the third active layer, and the second region of the third active layer is connected to the second transistor.

In an exemplary implementation mode, the channel region of the third transistor may include a drain terminal segment extending in direction F1, an intermediate segment extending in direction F2, and a source terminal segment extending in direction F3. The direction F1, the direction F2, and the direction F3 may be the same, or may be intersected. In an exemplary embodiment, the direction F1 and the direction F3 may be the same, and the direction F1 and the direction F2 may be intersected. In the exemplary embodiment, the channel region of the third transistor may include a drain terminal segment extending in the first direction X, a source terminal segment extending in the direction X, and an intermediate segment located between the drain terminal segment and the source terminal segment. In the present disclosure, the drain terminal segment extending in the first direction X and the source terminal segment extending in the first direction X may be parallel to each other, or an extension line of the drain terminal segment and an extension line of the source terminal segment may have an included angle less than about 10°. A first end of the drain terminal segment is connected to the first region of the third active layer, and a second end of the drain terminal segment extends in the first direction X, to be connected to a first end of the intermediate segment. A second end of the intermediate segment is connected to a first end of the source terminal segment. A second end of the source terminal segment extends in the first direction X, to be connected to the second region of the third active layer.

In an exemplary implementation mode, the first end of the drain terminal segment away from the intermediate segment has a first width. The second end of the drain terminal segment close to the intermediate segment has a second width. The first width is greater than the second width, so that the drain terminal segment is of a fan shape in which the first width of the first end is greater than the second width of the second end. In an exemplary implementation mode, the first width and the second width are dimensions of the drain terminal segment in the second direction Y.

In the display substrate according to the exemplary embodiment of the present disclosure, the drain terminal segment of the drive transistor is configured as a fan shape, so that the problem of unsaturated output of the thin film transistor caused by shortening of the channel is solved, and output characteristics of the thin film transistor can be flattened.

A preparation process of the display substrate will be exemplarily described below. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for the organic material. Deposition may be any one or more of sputtering, evaporation, and chemical vapor deposition. Coating may be any one or more of spray coating, spin coating, and ink-jet printing. Etching may be any one or more of dry etching and wet etching. No limits are made in the present disclosure. "Thin film" refers to a layer of thin film prepared from a certain material on the base substrate by a process such as depositing, coating, or the like. If the patterning process on the "thin film" is omitted in the entire preparation process, the "thin film" may be still called "layer". If the patterning process on the "thin film" is required in the entire preparation process, it is called "thin film" before the patterning process, and called "layer" after the patterning process. The "layer" obtained after the patterning process includes at least one "pattern". In the present disclosure, "A and B are arranged in the same layer" means that A and B are formed simultaneously through a same patterning process, here a "thickness" of the film layer is a dimension of the film layer in a direction perpendicular to the display substrate. In the exemplary embodiment of the present disclosure, "an orthographic projection of B is within a range of an orthographic projection of A" means a boundary of the orthographic projection of B falls within a boundary range of the orthographic projection of A, or a boundary of the orthographic projection of A is overlapped with a boundary of the orthographic projection of B. "The orthographic projection of A includes the orthographic projection of B" refers to that the boundary of the orthographic projection of B falls in a boundary range of the orthographic projection of A or the boundary of the orthographic projection of A is overlapped with the boundary of the orthographic projection of B.

In an exemplary implementation mode, a preparation process of the display substrate may include the following operations.

Figure 7A:
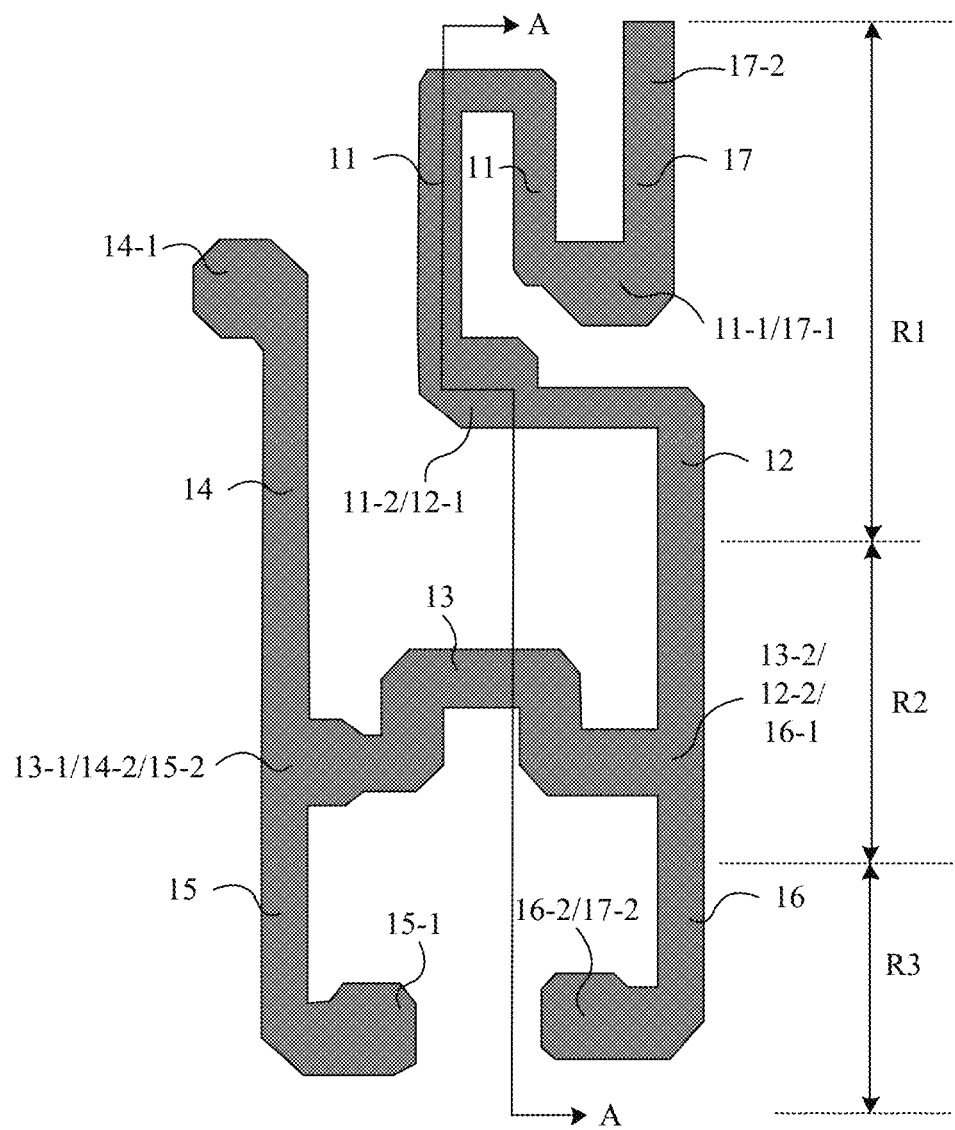
FIG. 7a is a schematic diagram after a pattern of a semiconductor layer of a display substrate is formed according to the present disclosure.
Figure 7B:
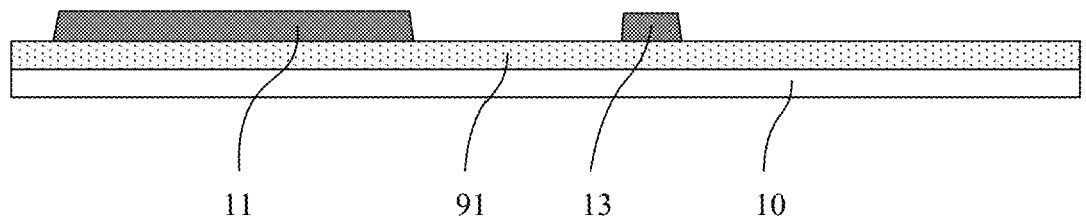

(11) A pattern of a semiconductor layer is formed. In an exemplary embodiment, the operation that the pattern of the semiconductor layer is formed may include: a first insulating thin film and a semiconductor thin film are sequentially deposited on a base substrate, the semiconductor thin film is patterned through a patterning process to form a first insulating layer that covers the base substrate and form a semiconductor layer arranged on the first insulating layer, as shown in FIG. 7a and FIG. 7b, and FIG. 7b is a sectional view along direction A-A in FIG. 7a.

In an exemplary embodiment, the semiconductor layer of each sub-pixel may include a first active layer 11 of the first transistor T1 to a seventh active layer 17 of the seventh transistor T7, and the first active layer 11 to the seventh active layer 17 are of an integral structure connected to one another.

In an exemplary embodiment, a first region R1 may include at least part of the first active layer 11 of the first transistor T1, a second active layer 12 of the second transistor T2, a fourth active layer 14 of the fourth transistor T4, and the seventh active layer 17 of the seventh transistor T7. The second region R2 may include at least part of a third active layer 13 of the third transistor T3. The third region R3 may include at least part of a fifth active layer 15 of the fifth transistor T5 and a sixth active layer 16 of the sixth transistor T6. The first active layer 11 and the seventh active layer 17 are arranged on a side, away from the second region R2, in the first region R1. The second active layer 12 and the fourth active layer 14 are arranged on a side, adjacent to the second region R2, in the first region R1.

In an exemplary embodiment, the first active layer 11 may be in a shape of an "n". The second active layer 12 may be in a shape of a "7". The third active layer 13 may be in the shape of a "π". The fourth active layer 14 may be in a shape of a "1". The fifth active layer 15, the sixth active layer 16, and the seventh active layer 17 each may be in the shape of an "L".

In an exemplary embodiment, the active layer of each transistor may include a first region, a second region, and a channel region between the first region and the second region. In an exemplary embodiment, a first region 11-1 of the first active layer 11 is also used as a first region 17-1 of the seventh active layer 17. A second region 11-2 of the first active layer 11 is also used as a first region 12-1 of the second active layer 12. A first region 13-1 of the third active layer 13 is also used as a second region 14-2 of the fourth active layer 14 and a second region 15-2 of the fifth active layer 15. A second region 13-2 of the third active layer 13 is also used as a second region 12-2 of the second active layer 12 and a first region 16-1 of the sixth active layer 16. A second region 16-2 of the sixth active layer 16 is also used as a second region 17-2 of the seventh active layer 17. In the exemplary embodiment, a first region 14-1 of the fourth active layer 14 and a first region 15-1 of the fifth active layer 15 are separately arranged.

In an exemplary embodiment, the third active layer 13 of the third transistor includes a first region 13-1, a second region 13-2, and a channel region. The channel region of the third active layer 13 is arranged between the first region 13-1 and the second region 13-2, and two ends of the channel region are respectively connected to the first region 13-1 and the second region 13-2. The first region 13-1 of the third active layer 13 is also used as a second region 14-2 of the fourth active layer 14 and a second region 15-2 of the fifth active layer 15, that is, the first region 13-1 of the third active layer 13, the second region 14-2 of the fourth active layer 14, and the second region 15-2 of the fifth active layer 15 are connected to one another. The second region 13-2 of the third active layer 13 are also used as a second region 12-2 of the second active layer 12 and a first region 16-1 of the sixth active layer 16, that is, the second region 13-2 of the third active layer 13, the second region 12-2 of the second active layer 12, and the first region 16-1 of the sixth active layer 16 are connected to one another.

As shown in FIG. 7b, after this process, the display substrate includes a first insulating layer 91 arranged on the base substrate 10 and the semiconductor layer arranged on the first insulating layer 91. The semiconductor layer may include the first active layer 11 and the third active layer 13.

Figure 8A:
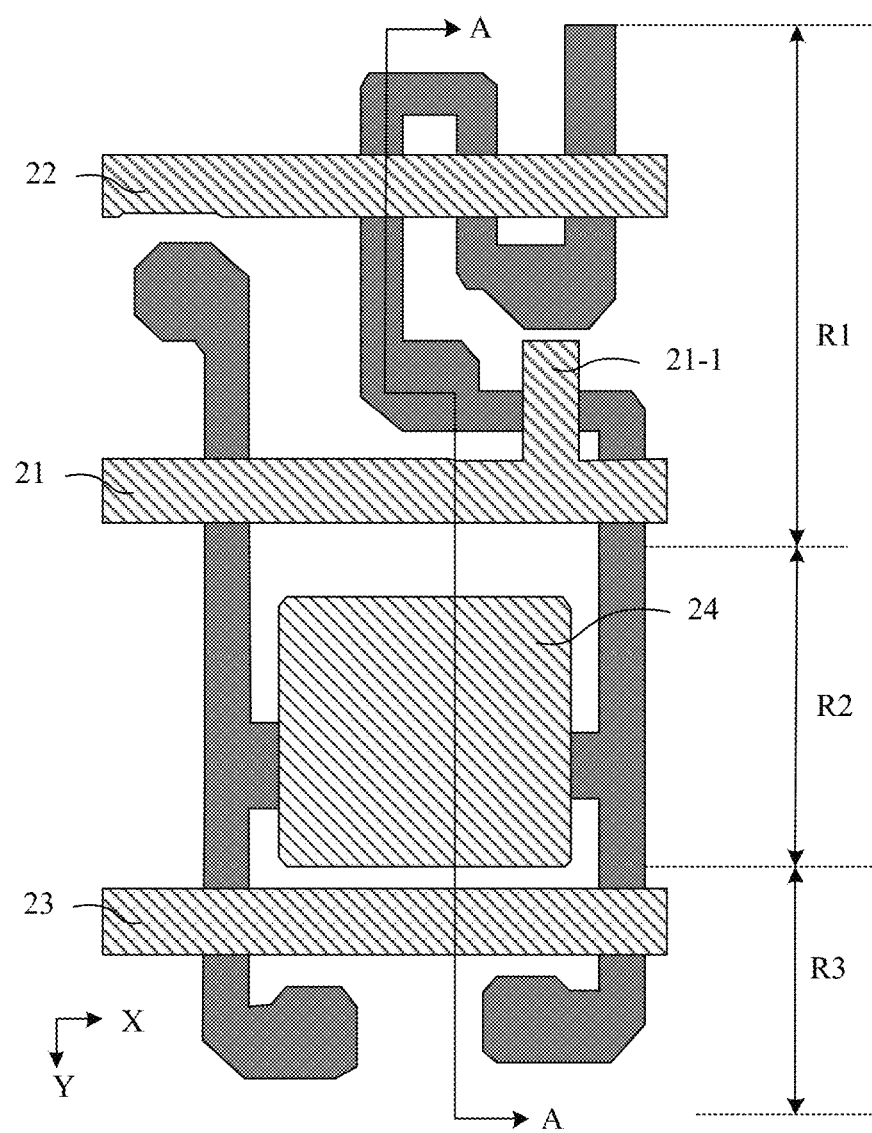
FIG. 8a is a schematic diagram after a pattern of a first conductive layer of a display substrate is formed according to the present disclosure.
Figure 8B:
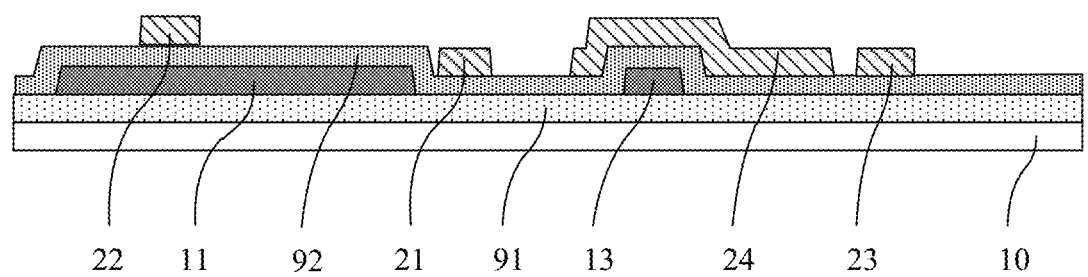
Figure 8C:
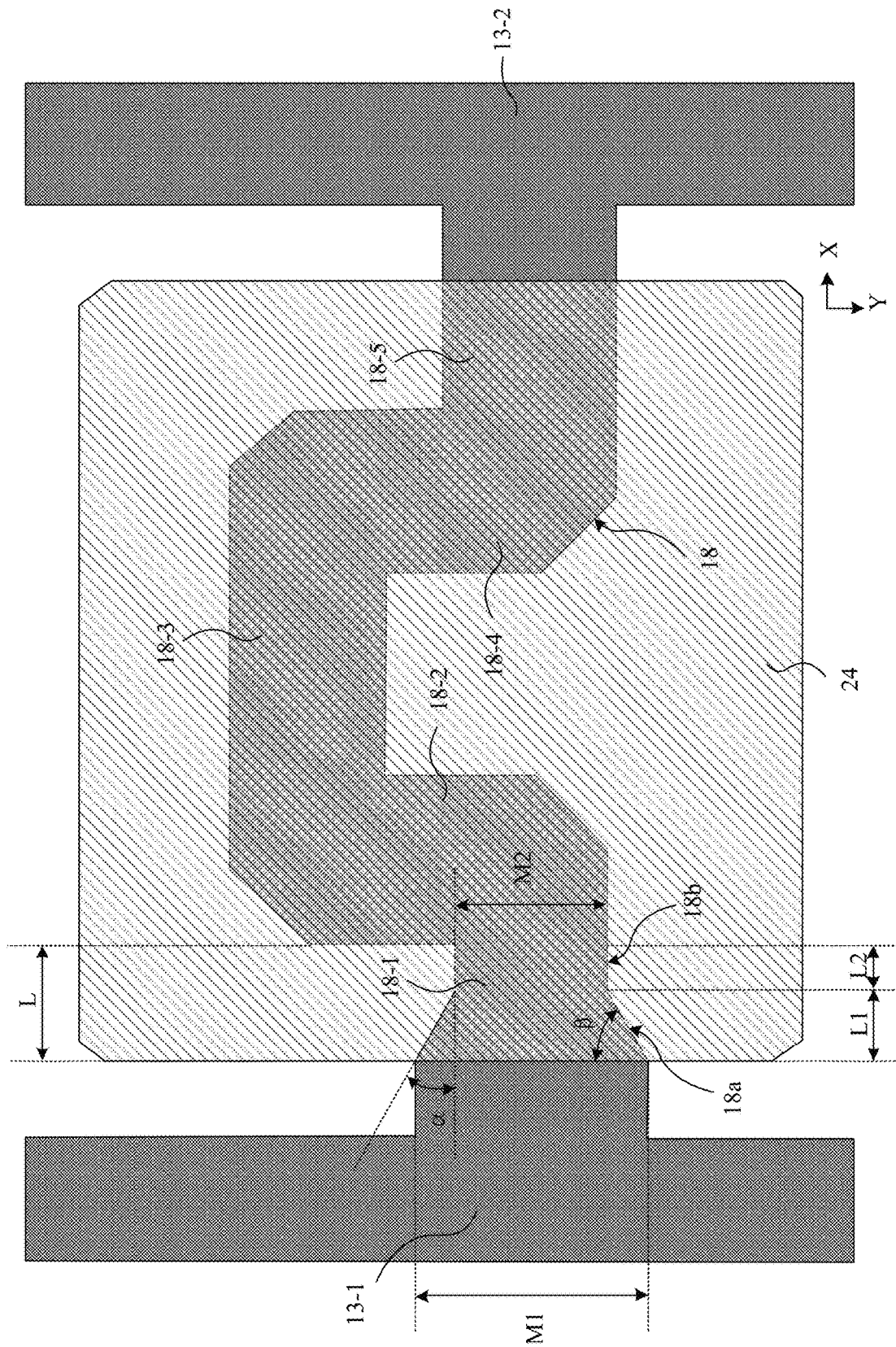

(12) A pattern of a first conductive layer is formed. In an exemplary embodiment, the operation that the pattern of the first conductive layer is formed may include: a second insulating thin film and a first metal thin film are sequentially deposited on the base substrate on which the above-mentioned pattern is formed, and the first metal thin film is patterned through a patterning process to form a second insulating layer that covers the pattern of the semiconductor layer and form a pattern of a first conductive layer arranged on the second insulating layer. The pattern of the first conductive layer at least includes a first scanning signal line 21, a second scanning signal line 22, a light emitting control line 23, and a first plate 24 of a storage capacitor, as shown in FIG. 8a, FIG. 8b, and FIG. 8c, FIG. 8b is a sectional view along direction A-A in FIG. 8a, and FIG. 8c is an enlarged view of a channel region of a drive transistor in FIG. 8a. In an exemplary embodiment, the first conductive layer may be called a first metal gate layer (GATE 1).

In an exemplary embodiment, the first scanning signal line 21, the second scanning signal line 22, and the light emitting control line 23 extend in the first direction X. The first scanning signal line 21 and the second scanning signal line 22 are arranged in the first region R1. The second scanning signal line 22 is located on a side of the first scanning signal line 21 away from the second region R2. The light emitting control line 23 is arranged in the third region R3. The first plate 24 of the storage capacitor is arranged in the second region R2 and located between the first scanning signal line 21 and the light emitting control line 23.

In an exemplary embodiment, the first plate 24 may be in a shape of a rectangle, and corners of the rectangle may be chamfered. There is an overlap region between an orthographic projection of the first plate 24 on the base substrate and an orthographic projection of the third active layer of the third transistor T3 on the base substrate. In an exemplary embodiment, the first plate 24 is also used as the gate electrode of the third transistor T3.

In an exemplary embodiment, an overlap region between the first scanning signal line 21 and the fourth active layer of the fourth transistor T4 is used as the gate electrode of the fourth transistor T4. The first scanning signal line 21 is provided with a gate block 21-1 protruding towards the second scanning signal line 22. There is an overlap region between an orthographic projection of the gate block 21-1 on the base substrate and an orthographic projection of the second active layer of the second transistor T2 on the base substrate. The overlap region between the first scanning signal line 21 and the gate block 21-1 and the second active layer of the second transistor T2 is used as a gate electrode of a double-gate structure of the second transistor T2. An overlap region between the second scanning signal line 22 and the first active layer of the first transistor T1 is used as a gate electrode of a double-gate structure of the first transistor T1. An overlap region between the second scanning signal line 22 and the seventh active layer of the seventh transistor T7 is used as the gate electrode of the seventh transistor T7. An overlap region between the light emitting control line 23 and the fifth active layer of the fifth transistor T5 is used as the gate electrode of the fifth transistor T5. An overlap region between the light emitting control line 23 and the sixth active layer of the sixth transistor T6 is used as the gate electrode of the sixth transistor T6.

In an exemplary embodiment, after the pattern of the first conductive layer is formed, the first conductive layer may be used as a shield for performing conducting treatment on the semiconductor layer. The channel regions of the first transistor T1 to the seventh transistor T7 are formed in the region of the semiconductor layer shielded by the first conductive layer. The region of the semiconductor layer which is not shielded by the first conductive layer is conducted, that is, the first region and the second region of each of the first active layer to the seventh active layer are both conducted.

As shown in FIG. 8b, after this process, the display substrate includes the first insulating layer 91 arranged on the base substrate 10, the semiconductor layer arranged on the first insulating layer 91, the second insulating layer 92 that covers the semiconductor layer, and the first conductive layer arranged on the second insulating layer 92. The semiconductor layer may include the first active layer 11 and the third active layer 13, and the first conductive layer may include the first scanning signal line 21, the second scanning signal line 22, the light emitting control line 23 and the first plate 24 of the storage capacitor.

As shown in FIG. 8c, there is an overlap region between the orthographic projection of the first plate 24 on the base substrate and the orthographic projection of the third active layer on the base substrate. The first plate 24 is also used as the gate electrode of the third transistor T3. The overlap region between the third active layer of the third transistor T3 and the first plate 24 is used as a channel region 18 of the third transistor T3. One end of the channel region 18 is connected to the first region 13-1 of the third active layer, and the other end of the channel region 18 is connected to the second region 13-2 of the third active layer. A channel refers to a semiconductor layer between a first region and a second region in an active layer of a transistor. A width-to-length ratio of a channel is a ratio of a channel width to a channel length, which is an important parameter in the transistor. When the channel length is the same, the greater the channel width is, the faster speed is and the higher power consumption is. When the channel width is the same, the smaller the channel length is, the faster the speed is and the higher the power consumption is.

In an exemplary embodiment, the channel region 18 includes a first channel segment (the drain terminal segment) 18-1, a third channel segment 18-3, and a fifth channel segment (the source terminal segment) 18-5 that extend in the first direction X, and a second channel segment 18-2 and a fourth channel segment 18-4 that extend in the second direction Y. The first channel segment 18-1 is called the drain terminal segment, the fifth channel segment 18-5 is called the source terminal segment, and the second channel segment 18-2, the third channel segment 18-3, and the fourth channel segment 18-4 are collectively called an intermediate segment located between the drain terminal segment and the source terminal segment. A first end of the first channel segment 18-1 is connected to the first region 13-1, and a second end of the first channel segment 18-1 extends in the first direction X, to be connected to a first end of the second channel segment 18-2. The first end of the second channel segment 18-2 is connected to the second end of the first channel segment 18-1, and a second end of the second channel segment 18-2 extends in a direction opposite to the second direction Y, to be connected to a first end of the third channel segment 18-3. The first end of the third channel segment 18-3 is connected to the second end of the second channel segment 18-2, and a second end of the third channel segment 18-3 extends in the first direction X, to be connected to a first end of the fourth channel segment 18-4. The first end of the fourth channel segment 18-4 is connected to the second end of the third channel segment 18-3, and a second end of the fourth channel segment 18-4 extends in the second direction Y, to be connected to a first end of the fifth channel segment 18-5. The first end of the fifth channel segment 18-5 is connected to the second end of the fourth channel segment 18-4, and a second end of the fifth channel segment 18-5 extends in the first direction X, to be connected to the second region 13-2, so as to form the "n"-shaped channel region 18.

In an exemplary embodiment, the first end of the first channel segment 18-1 connected to the first region 13-1 (a doped region) of the third active layer has a first width M1, and the second end of the first channel segment 18-1 connected to the second channel segment 18-2 (the intermediate segment) of the third active layer has a second width M2, wherein both the first width and the second width refer to dimensions of the first channel segment 18-1 in the second direction Y. In an exemplary embodiment, the fifth channel segment 18-5 may be in the shape of a rectangle.

In an exemplary embodiment, the first width M1 may be greater than the second width M2.

In an exemplary embodiment, a ratio of the first width M1 to the second width M2 may be about 1.5 to 5.

In an exemplary embodiment, the first width M1 may be about 1.5 μm to 25 μm, and the second width M2 may be about 1 μm to 5 μm.

In an exemplary embodiment, the first channel segment 18-1 has a length L, and the length L may be about 2 μm to 10 μm, wherein the length refers to a dimension of the first channel segment 18-1 in the first direction X.

In an exemplary embodiment, the orthographic projection of the first plate 24 (the gate electrode of the third transistor T3) on the base substrate and the orthographic projection of the third active layer on the base substrate have an overlap line therebetween extending in the second direction Y. The overlap line close to the first region 13-1 of the third active layer is the first end of the first channel segment 18-1. The first channel segment 18-1 extending in the first direction X and the second channel segment 18-2 extending in the second direction Y have a boundary line extending in the second direction Y. The boundary line may be used as the second end of the first channel segment 18-1.

As shown in FIG. 8c, in an exemplary embodiment, the first channel segment 18-1 may include a first subsegment 18a and a second subsegment 18b sequentially arranged in the first direction X. The first subsegment 18a extends in the first direction X, and a first end of the first subsegment 18a is connected to the first region 13-1. A second end of the first subsegment 18a extends in the first direction X, to be connected to a first end of the second subsegment 18b. The first end of the second subsegment 18b is connected to the second end of the first subsegment 18a, and a second end of the second subsegment 18b extends in the first direction X, to be connected to the first end of the second channel segment 18-2.

In an exemplary embodiment, the first subsegment 18a and the second subsegment 18b may be divided in various ways. For example, the first subsegment 18a and the second subsegment 18b have different shapes, one is a rectangle and the other is a trapezoid. The first subsegment 18a and the second subsegment 18b may be divided according to a dividing line between the rectangle and the trapezoid. For another example, the first subsegment 18a and the second subsegment 18*b* are both trapezoid. One trapezoid has a larger base angle and the other has a smaller base angle. The first subsegment 18*a* and the second subsegment 18*b* may be divided according to a dividing line between the trapezoid with the larger base angle and the trapezoid with the smaller base angle. No limits are made thereto in the present disclosure.

In an exemplary embodiment, the first end of the first subsegment 18*a* away from the second subsegment 18*b* has a first width M1, and the second end of the second subsegment 18*b* away from the first subsegment 18*a* has a second width M2.

In an exemplary embodiment, the first subsegment 18*a* has a first length L1, the second subsegment 18*b* has a second length L2, and the first channel segment 18-1 has a length L=L1+L2.

In an exemplary embodiment, the length L may be about 2 μm to 10 μm, the first length L1 may be about 1 μm to 5 μm, and the second length L2 may be about 1 μm to 5 μm. For example, the length L may be about 3 μm, the first length L1 may be about 1.5 μm, and the second length L2 may be about 1.5 μm.

FIGS. 8*d* to 8*i* are schematic diagrams of several first channel segments according to exemplary embodiments of the present disclosure.

Figure 8D:
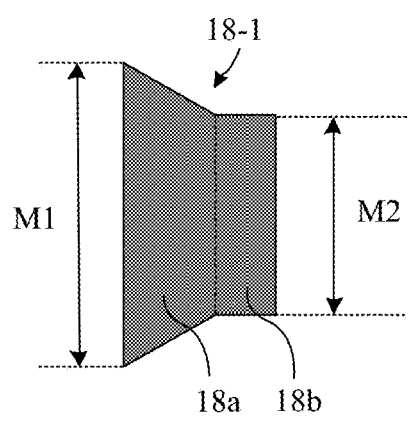
FIG. 8d to FIG. 8i are schematic diagrams of several first channel segments according to exemplary embodiments of the present disclosure.

In an exemplary embodiment, the first subsegment 18*a* may be in the shape of a trapezoid, and the second subsegment 18*b* may be in the shape of a rectangle. The trapezoid includes a lower base and an upper base of the trapezoid. The rectangle includes a lower edge and an upper edge of the rectangle. The first end of the first subsegment 18*a* is used as the lower base of the trapezoid and has a first width M1, the second end of the first subsegment 18*a* is used as the upper base of the trapezoid. The first end of the second subsegment 18*b* is used as the lower edge of the rectangle, and the second end of the segment 18*b* is used as the upper edge of the rectangle and has a second width M2, wherein the upper base of the trapezoid is connected to the lower edge of the rectangle, as shown in FIG. 8*d*.

Figure 8E:
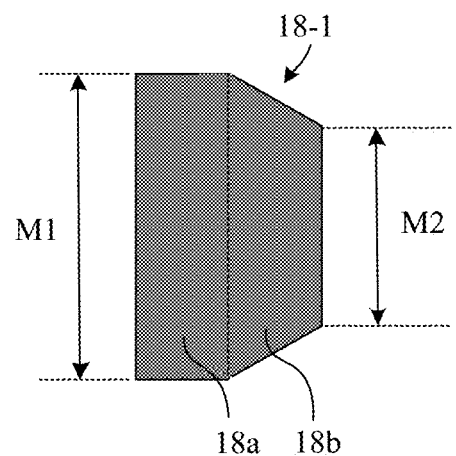

In a possible implementation mode, the first sub-segment 18*a* may be in the shape of a rectangle, and the second subsegment 18*b* may be in the shape of a trapezoid. The rectangle includes a lower edge and an upper edge of the rectangle, and the trapezoid includes a lower base and an upper base of the trapezoid. The first end of the first subsegment 18*a* is used as the lower edge of the rectangle and has a first width M1, and the second end of the first subsegment 18*a* is used as the upper edge of the rectangle. The first end of the second subsegment 18*b* is used as the lower base of the trapezoid, and the second end of the second subsegment 18*b* is used as the upper base of the trapezoid and has a width M2, wherein the upper edge of the rectangle is connected to the lower base of the trapezoid, as shown in FIG. 8*e*.

Figure 8F:
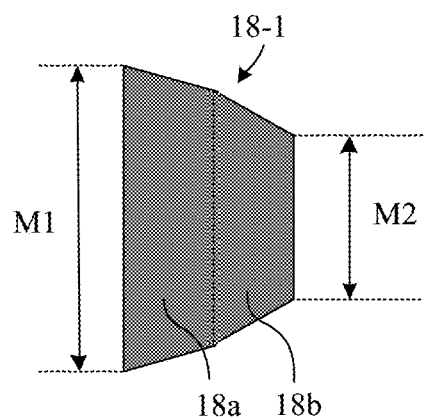

In another possible implementation mode, the first subsegment 18*a* may be in a shape of a first trapezoid, and the second subsegment 18*b* may be in a shape of a second trapezoid. The first trapezoid includes a lower base and an upper base of the first trapezoid. The second trapezoid includes a lower base and an upper base of the second trapezoid. The first end of the first subsegment 18*a* is used as the lower base of the first trapezoid and has a first width M1, and the second end of the first subsegment 18*a* is used as the upper base of the first trapezoid. The first end of the second subsegment 18*b* is used as the lower base of the second trapezoid. and the second end of the second subsegment 18*b* is used as the upper base of the second trapezoid and has a second width M2. The upper base of the first trapezoid is connected to the lower base of the second trapezoid, as shown in FIG. 8*f*.

Figure 8G:
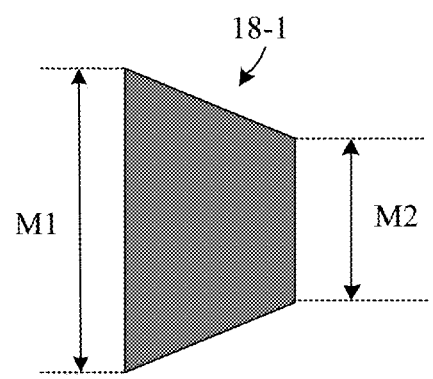

In another possible implementation mode, the first channel segment 18-1 is in the shape of a trapezoid as a whole, and the first end of the first channel segment 18-1 is used as a lower base of the trapezoid and has a first width M1, and the second end of the channel segment 18-1 is used as an upper base of the trapezoid and has a second width M2, as shown in FIG. 8*g*.

Figure 8H:
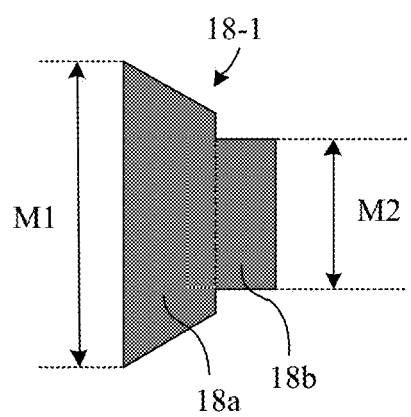

In another possible implementation mode, the first subsegment 18*a* may be in the shape of a trapezoid, and the second subsegment 18*b* may be in the shape of a rectangle. The trapezoid includes a lower base and an upper base of the trapezoid, and the rectangle includes a lower edge and an upper edge of the rectangle. The first end of the first subsegment 18*a* is used as the lower base of the trapezoid and has a first width M1, and the second end of the first subsegment 18*a* is used as the upper base of the trapezoid. The first end of the second subsegment 18*b* is used as the lower edge of the rectangle, and the second end of the segment 18*b* is used as the upper edge of the rectangle and has a second width M2. The upper base of the trapezoid is connected to the lower edge of the rectangle, and a width of the upper base substrate of the trapezoid in the second direction is greater than a width of the lower edge of the rectangle in the second direction, as shown in FIG. 8*h*.

Figure 8I:
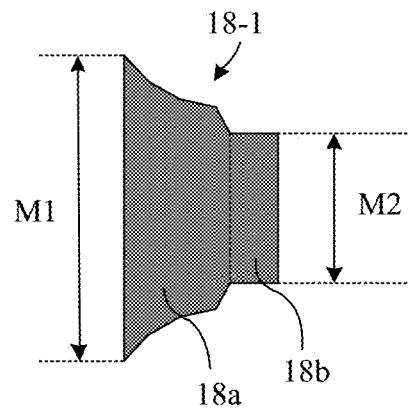

In another possible implementation mode, the first subsegment 18*a* may be in a shape of a horn, and the second subsegment 18*b* may be in the shape of a rectangle. The horn includes a lower base and an upper base of the horn, and the rectangle includes a lower edge and an upper edge of the rectangle. The first end of the first subsegment 18*a* is used as the lower base of the horn and has a first width M1, the second end of the first subsegment 18*a* is used as the upper base of the horn. The first end of the second subsegment 18*b* is used as the lower edge of the rectangle, and the second end of the second subsegment 18*b* is used as the upper edge of the rectangle and has the second width M2. The upper base of the horn is connected to the lower edge of the rectangle, and a width of the upper base of the horn in the second direction is equal to a width of the lower edge of the rectangle in the second direction, as shown in FIG. 8*i*.

In a possible implementation mode, the first channel segment 18-1 may include multiple subsegments sequentially arranged in the first direction X, which is not limited in the present disclosure.

In an exemplary embodiment, an included angle α between at least one side of the aforementioned trapezoid and the first direction X may be greater than 0°, and less than or equal to 90°. In a possible exemplary embodiment, an included angle α between at least one side of the trapezoid and the first direction X may be about 20° to 60°, for example, the included angle α may be about 30° to 40°. In an exemplary embodiment, a base angle β of the trapezoid may be about 30° to 70°, for example, the base angle β may be about 50° to 60°.

In an exemplary embodiment, the trapezoid may be an isosceles trapezoid, or may be a non-isosceles trapezoid, such as a right-angled trapezoid. In an exemplary embodiment, the side of the trapezoid may be a straight line or an arc, which is not limited in the present disclosure.

The "trapezoid" and "rectangular" and the like mentioned in the present disclosure are not required to be a trapezoid and a rectangle in a strict sense, which may have arc edges, curved edges, chamfered corners, or rounded corners. No limits are made thereto in the present disclosure.

With the development of display technologies, displays with high scanning frequency and high resolution (Pixels Per Inch, PPI for short) have become trending products, and have displaying with finer definition and higher display quality. For a pixel driving circuit using LTPS transistors, in order to meet the needs of high-frequency display, an increase of a charging rate of a drive transistor is required. In order to meet the high-resolution display, dimensions of the drive transistor and the storage capacitor are required to be reduced, and thus, the high scanning frequency and high-resolution display requires a short-channel drive transistor (the third transistor T3). The short-channel drive transistor can not only increase the charging rate of the pixel driving circuit, but also reduce a saturation voltage drop, thereby reducing power consumption. However, studies have shown that the short-channel drive transistor may cause a problem of upwarp of output characteristics of the drive transistor. For a long-channel thin film transistor working in a saturation region, an effective channel length may be changed by a drain-bias voltage, but a source barrier potential remains constant, and potential in the channel may be approximately in one-dimension distribution depending on a transverse electric field $\varepsilon_x$ (controlled by a gate electrode voltage). For a short-channel thin film transistor, when a sum of lengths of depletion regions of the source electrode and the drain electrode can be matched with the channel length, the distribution of potential in the channel becomes a two-dimensional distribution depending on the transverse electric field $\varepsilon_x$, resulting in short channel effects such as unsaturated channel current Id. If the channel length continues to be reduced until the sum of the lengths of the depletion regions of the source electrode and the drain electrode is almost equal to the channel length, a more severe Drain Induced Barrier Lowering (DIBL for short) effect will occur. At this point, the drain-bias voltage will lower the source barrier potential, and carrier concentration of the source electrode channel will not be fixed, additional carrier injection will cause a significant increase in current, so that no matter in a subthreshold region or the saturation region, the thin film transistor cannot work normally.

In the exemplary embodiment of the present disclosure, an end of the channel of the third transistor T3 close to the drain electrode (the first region of the third active layer) is configured to be in a fan shape, that is, the first channel segment 18-1 in the channel region 18 or the first sub-segment 18a in the first channel segment 18-1 is configured to be in a trapezoidal shape. By expanding area of the end of the channel close to the drain electrode, under the same drain-bias voltage, the drain electric field can be dispersed, so that the transverse electric field $\varepsilon_x$ is reduced, and the depletion region of the drain electrode becomes shorter in the channel direction, thereby solving the problem of unsaturated output of the thin film transistor caused by shortening of the channel, and flatting the output characteristics of the thin film transistor. According to the exemplary embodiment of the present disclosure, the short-channel transistor with the flatted output characteristics can save space and facilitate high-resolution display, and moreover, the channel is shortened and the threshold voltage Vth of the drive transistor is reduced, facilitating reduction of power consumption.

Figure 9A:
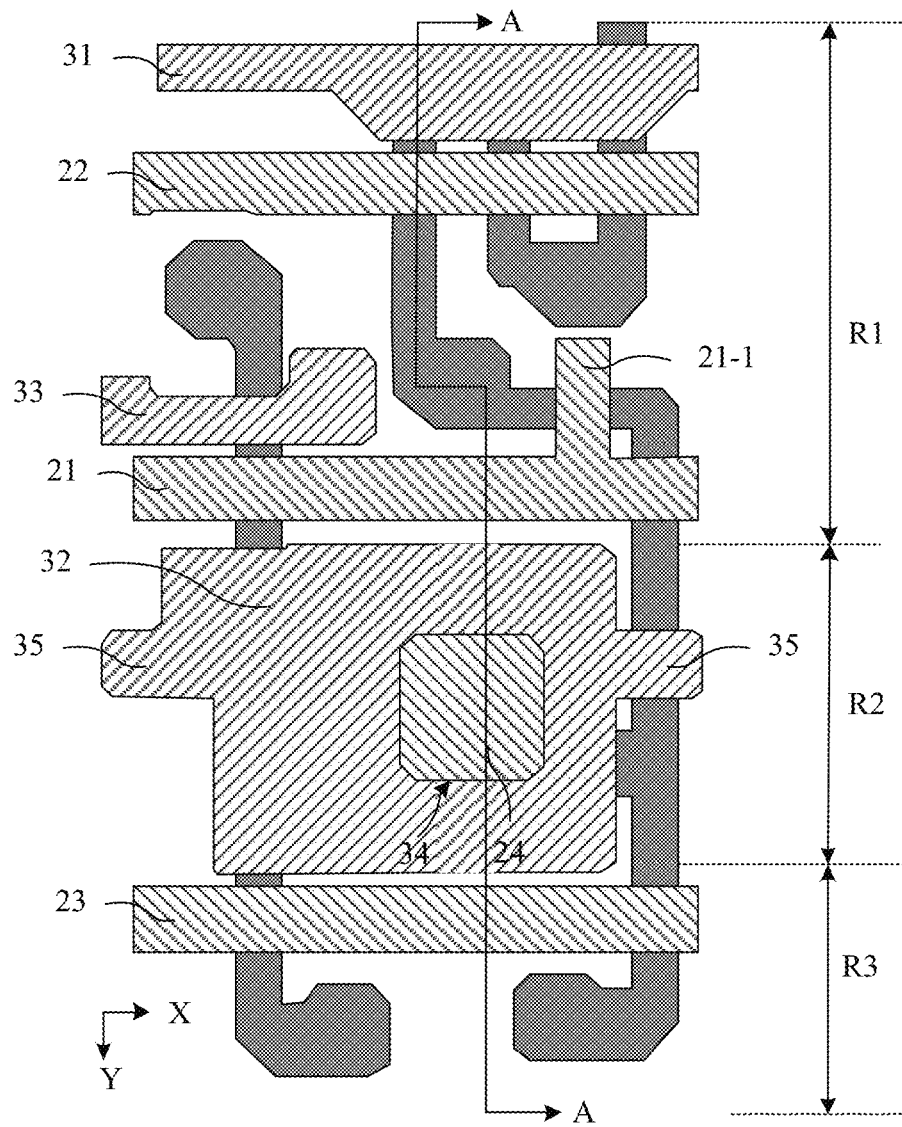
FIG. 9a is a schematic diagram after a pattern of a second conductive layer of a display substrate is formed according to the present disclosure.
Figure 9B:
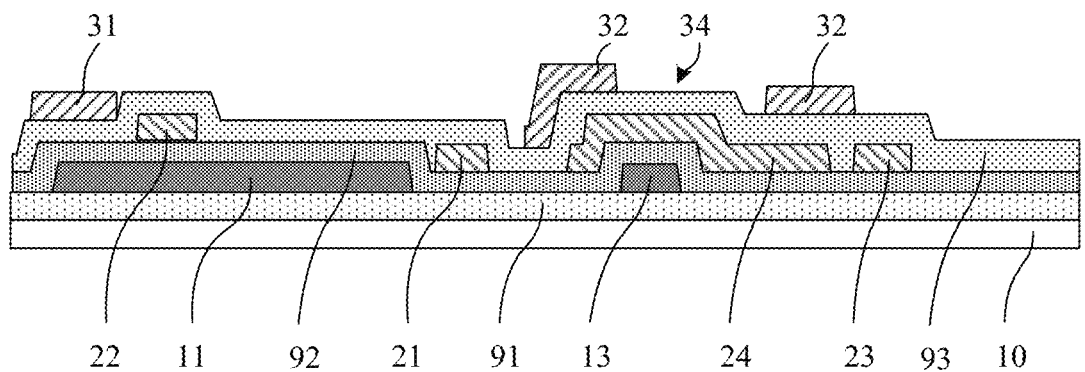

(13) A pattern of a second conductive layer is formed. In an exemplary embodiment, the operation that the pattern of the second conductive layer is formed may include: a third insulating thin film and a second metal thin film are sequentially deposited on the base substrate on which the above-mentioned patterns are formed, and the second metal thin film is patterned through a patterning process to form a third insulating layer 93 that covers the first conductive layer and form a pattern of a second conductive layer arranged on the third insulating layer 93. The pattern of the second conductive layer at least includes: an initial signal line 31, a second plate 32 of the storage capacitor, a shield electrode 33, and a plate connection line 35, as shown in FIG. 9a and FIG. 9b, and FIG. 9b is a sectional view along direction A-A in FIG. 9a. In an exemplary embodiment, the second conductive layer may be called a second metal gate layer (GATE 2).

As shown in FIG. 9a, in the exemplary embodiment, the initial signal line 31 extending in the first direction X is arranged in the first region R1, and located on a side, of the second scanning signal line 22 away from the second region R2. The second plate 32 of the storage capacitor is arranged in the second region R2 and is located between the first scanning signal line 21 and the light emitting control line 23. The shield electrode 33 is arranged in the first region R1. The shield electrode 33 is configured to shield impact of jumping change of data voltage on a critical node, thereby preventing the jumping change of data voltage from affecting a potential of the critical node of the pixel driving circuit, and improving the display effect.

In an exemplary embodiment, the initial signal line 31 may be of unequal width, and the width of the initial signal line 31 is a dimension of the initial signal line 31 in the second direction Y. The initial signal line 31 includes a region overlapped with the semiconductor layer and a region not overlapped with the semiconductor layer. A width of the initial signal line 31 in the region not overlapped with the semiconductor layer may be smaller than a width of the initial signal line 31 in the region overlapped with the semiconductor layer.

In an exemplary embodiment, an outline of the second plate 32 may be in the shape of a rectangle, and corners of the rectangle may be chamfered. There is an overlap region between an orthographic projection of the second plate 32 on the base substrate and the orthographic projection of the first plate 24 on the base substrate. The second plate 32 is provided with an opening 34, and the opening 34 may be located in the middle of the second region R2. The opening 34 may be rectangular so that the second plate 32 forms a loop structure. The opening 34 exposes the third insulating layer 93 that covers the first plate 24, and the orthographic projection of the first plate 24 on the base substrate includes an orthographic projection of the opening 34 on the base substrate. In an exemplary embodiment, the opening 34 is configured to accommodate a first via to be formed subsequently. The first via is located in the opening 34 and exposes the first plate 24, so that a second electrode of the first transistor T1 to be formed subsequently is connected to the first plate 24.

In an exemplary embodiment, the plate connection line 35 is arranged between the second plates 32 of adjacent sub-pixels in the first direction X, wherein a first end of the plate connection line 35 is connected to the second plate 32 of the present sub-pixel, and a second end of the plate connection line 35 extends in the first direction X or a direction opposite to the first direction X, and is connected to the second plates 32 of the adjacent sub-pixels, that is, the plate connection line 35 is arranged such that the second plates of the adjacent sub-pixels in the first direction X are connected to each other. In an exemplary embodiment, the second plates in a sub-pixel row form a mutual-connected integrated structure through the plate connection line 35. The second plates of the integrated structure may be multiplexed as a power signal line to ensure that the multiple second plates in the sub-pixel row have the same potential, which is conductive to improving uniformity of a panel, avoids display defects of the display substrate, and ensures the display effect of the display substrate.

In an exemplary embodiment, an orthographic projection of an edge of the second plate 32 adjacent to the first region R1 on the base substrate is overlapped with an orthographic projection of a boundary line between the first region R1 and the second region R2 on the base substrate. An orthographic projection of an edge of the second plate 32 adjacent to the third region R3 on the base substrate is overlapped with an orthographic projection of a boundary line between the second region R2 and the third region R3, that is, a length of the second plate 32 is equal to a length of the second region R2, wherein the length of the second plate 32 refers to a dimension of the second plate 32 in the second direction Y.

As shown in FIG. 9b, in a plane perpendicular to the base substrate, the first insulating layer 91 is arranged on the base substrate 10. The semiconductor layer is arranged on the first insulating layer 91. The second insulating layer 92 covers the semiconductor layer. The first conductive layer is arranged on the second insulating layer 92. The third insulating layer 93 covers the first conductive layer. The second conductive layer is arranged on the third insulating layer 93, and the second conductive layer at least includes the initial signal line 31 and the second plate 32 of the storage capacitor. The second plate 32 of the storage capacitor is provided with the opening 34, wherein the opening 34 exposes the third insulating layer 93 that covers the first plate 24. There is an overlap region between the orthographic projection of the second plate 32 on the base substrate and the orthographic projection of the first plate 24 on the base substrate.

(14) A pattern of a fourth insulating layer is formed. In an exemplary embodiment, the operation that the pattern of the fourth insulating layer is formed may include: a fourth insulating thin film is arranged on the base substrate on which the above-mentioned patterns are formed, the fourth insulating thin film is patterned through a patterning process to form a fourth insulating layer that covers the second conductive layer. The fourth insulating layer is provided with multiple vias, wherein the multiple vias at least include: a first via V1, a second via V2, a third via V3, a fourth via V4, a fifth via V5, a sixth via V6, a seventh via V7, an eighth via V8, and a ninth via V9, as shown in FIG. 10a and FIG. 10b, and FIG. 10b is a sectional view along direction A-A in FIG. 10a.

Figure 10A:
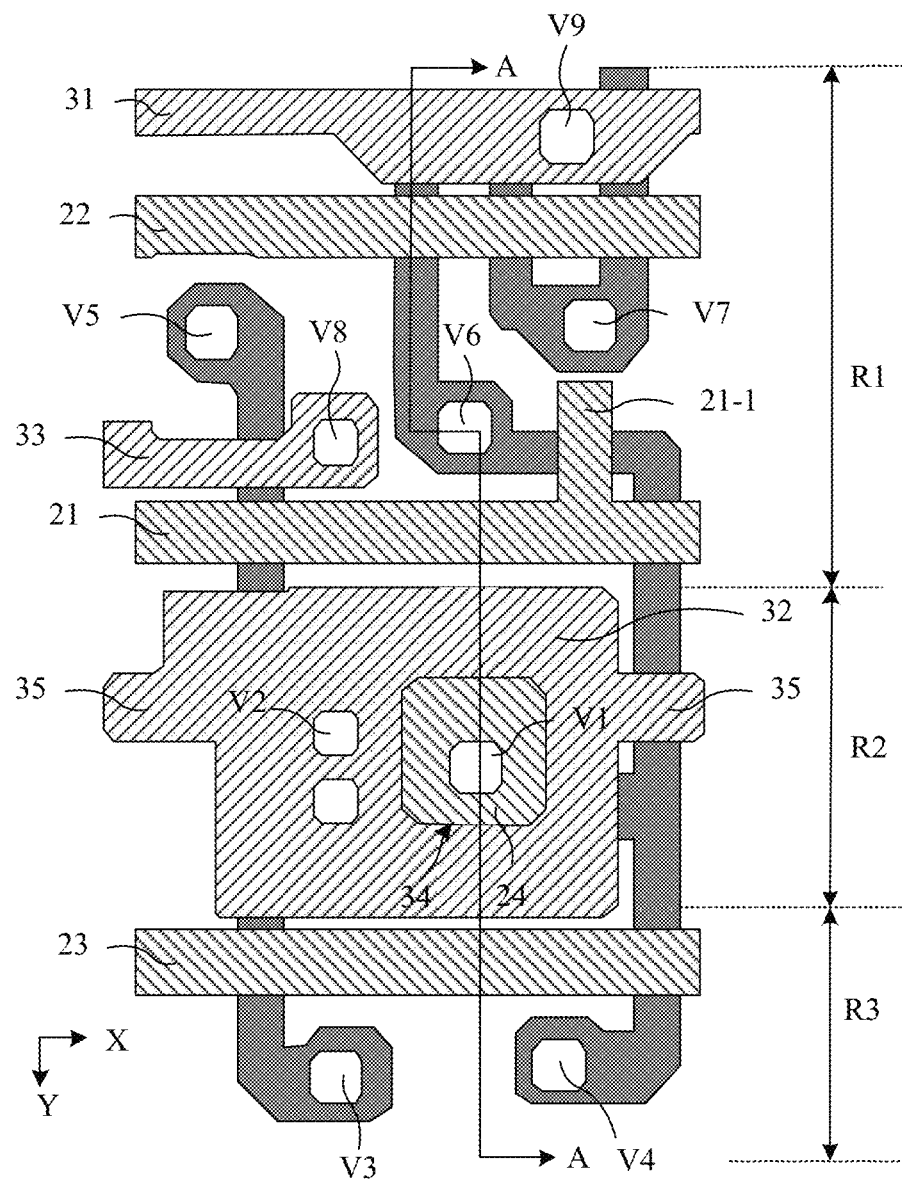
FIG. 10a is a schematic diagram after a pattern of a fourth insulating layer of a display substrate is formed according to the present disclosure.
Figure 10B:
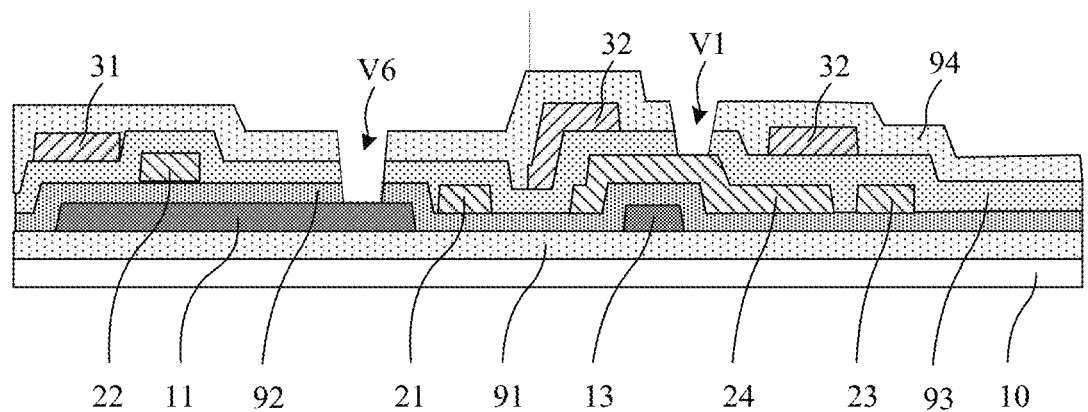

As shown in FIG. 10a, in an exemplary embodiment, the first via V1 is located in the opening 34 of the second plate 32, and an orthographic projection of the first via V1 on the base substrate is located within a range of the orthographic projection of the opening 34 on the base substrate. The fourth insulating layer and the third insulating layer in the first via V1 are etched off to expose a surface of the first plate 24. The first via V1 is configured such that the second electrode of the first transistor T1 to be formed subsequently is connected to the first plate 24 through the via.

In an exemplary embodiment, the second via V2 is located in a region where the second plate 32 is located, and an orthographic projection of the second via V2 on the base substrate is within a range of the orthographic projection of the second plate 32 on the base substrate. The fourth insulating layer in the second via V2 is etched off to expose a surface of the second plate 32. The second via V2 is configured such that a first power supply line to be formed subsequently is connected to the second plate 32 through the via. In an exemplary embodiment, there may be multiple second vias V2 serving as power supply vias, and the multiple second vias V2 may be sequentially arranged in the second direction Y, thereby improving connection reliability of the first power supply line with the second plate 32.

In an exemplary embodiment, the third via V3 is located in the third region R3, and the fourth insulating layer, the third insulating layer, and the second insulating layer in the third via V3 are etched to expose a surface of the first region of the fifth active layer. The third via V3 is configured such that the first power supply line to be formed subsequently is connected to the fifth active layer through the via.

In an exemplary embodiment, the fourth via V4 is located in the third region R3, and the fourth insulating layer, the third insulating layer, and the second insulating layer in the fourth via V4 are etched off to expose a surface of a second region of the sixth active layer (i.e., the second region of the seventh active layer). The fourth via V4 is configured such that a second electrode of the sixth transistor T6 to be formed subsequently is connected to the sixth active layer through the via, and a second electrode of the seventh transistor T7 to be formed subsequently is connected to the seventh active layer through the via.

In an exemplary embodiment, the fifth via V5 is located in the first region R1, and the fourth insulating layer, the third insulating layer, and the second insulating layer in the fifth via V5 are etched off to expose a surface of a first region of the fourth active layer. The fifth via V5 is configured such that a data signal line to be formed subsequently is connected to the fourth active layer through the via, here the fifth via V5 is called a data writing hole.

In an exemplary embodiment, the sixth via V6 is located in the first region R1, and the fourth insulating layer, the third insulating layer, and the second insulating layer in the sixth via V6 are etched off to expose a surface of a second region of the first active layer (i.e., first region of the second active layer). The sixth via V6 is configured such that a second electrode of the first transistor T1 to be formed subsequently is connected to the first active layer through the via, and a first electrode of the second transistor T2 to be formed subsequently is connected to the second active layer through the via.

In an exemplary embodiment, the seventh via V7 is located in the first region R1, and the fourth insulating layer, the third insulating layer, and the second insulating layer in the seventh via V7 are etched off to expose a surface of a first region of the seventh active layer (i.e., the first region of the first active layer). The seventh via V7 is configured such that a first electrode of the seventh transistor T7 to be formed subsequently is connected to the seventh active layer through the via, and a first electrode of the first transistor T1 to be formed subsequently is connected to the first active layer through the via.

In an exemplary embodiment, the eighth via V8 is located in the first region R1, and the fourth insulating layer in the eighth via V8 is etched off to expose a surface of the shield electrode 33. The eighth via V8 is configured such that the first power supply line to be formed subsequently is connected to the shield electrode 33 through the via.

In an exemplary embodiment, the ninth via V9 is located in the first region R1, and the fourth insulating layer in the ninth via V9 is etched off to expose a surface of the initial signal line 31. The ninth via V9 is configured such that the first electrode of the seventh transistor T7 (i.e., the first electrode of the first transistor T1) to be formed subsequently is connected to the initial signal line 31 through the via.

As shown in FIG. 10b, in a plane perpendicular to the base substrate, the first insulating layer 91 is arranged on the base substrate 10. The semiconductor layer is arranged on the first insulating layer 91. The second insulating layer 92 covers the semiconductor layer. The first conductive layer is disposed on the second insulating layer 92. The third insulating layer 93 covers the first conductive layer. The second conductive layer is arranged on the third insulating layer 93. The fourth insulating layer 94 covers the second conductive layer, and the fourth insulating layer 94 is provided with multiple vias. The multiple vias at least include a first via V1 and a sixth via V6. The fourth insulating layer 94 and the third insulating layer 93 in the first via V1 are etched off to expose a surface of the second plate 32. The fourth insulating layer 94, the third insulating layer 93, and the second insulating layer 92 in the sixth via V6 are etched off to expose a surface of the first active layer 11.

Figure 11A:
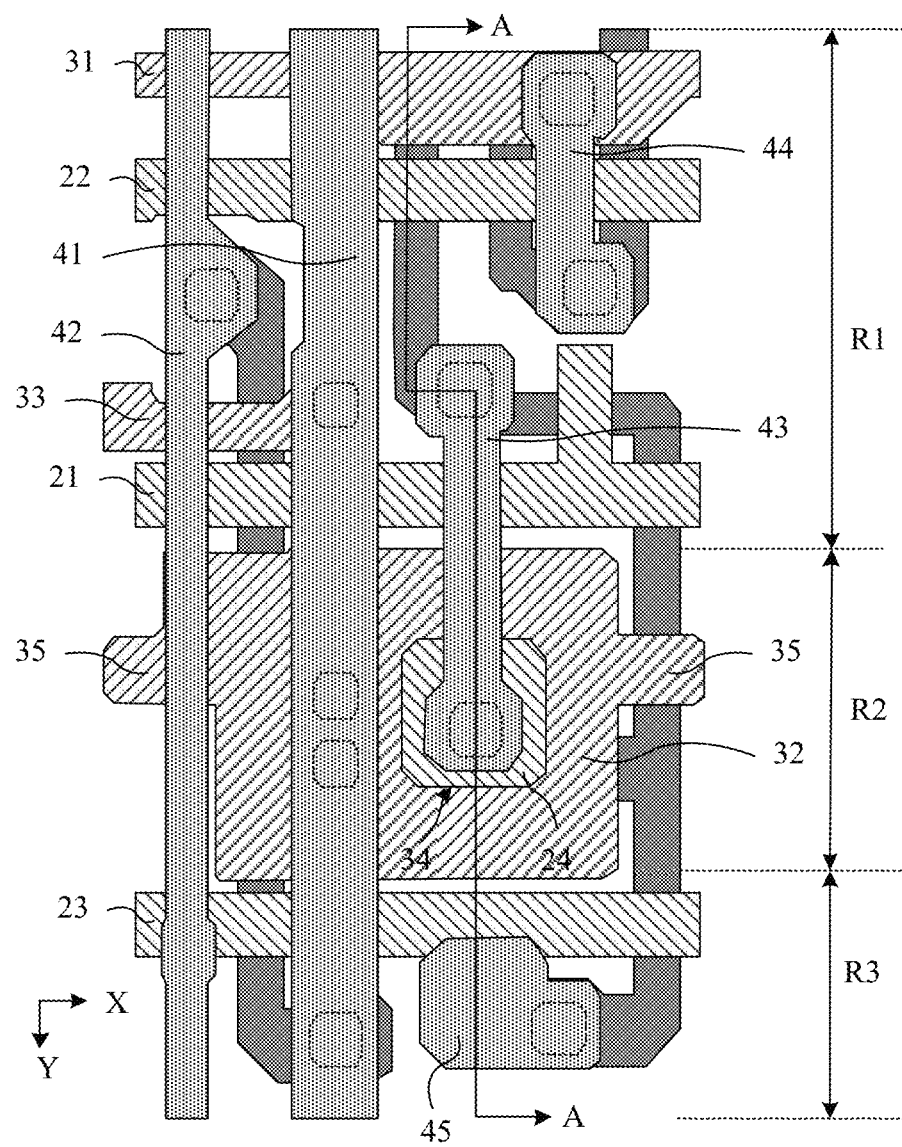
FIG. 11a is a schematic diagram after a pattern of a third conductive layer of a display substrate is formed according to the present disclosure.
Figure 11B:
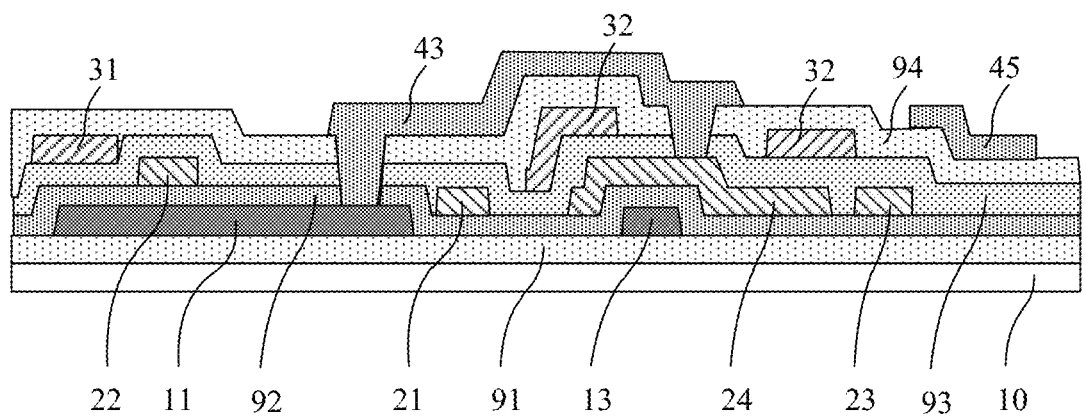

(15) A pattern of a third conductive layer is formed. In an exemplary embodiment, the operation that the pattern of the third conductive layer is formed may include: a third insulating thin film is deposited on the base substrate on which the above-mentioned patterns are formed, and the third metal thin film is patterned through a patterning process to form a third conductive layer arranged on the fourth insulating layer. The third conductive layer pattern at least includes: an initial signal line 41, a data signal line 42, a first connection electrode 43, a second connection electrode 44, and a third connection electrode 45, as shown in FIG. 11a and FIG. 11b, and FIG. 11b is a sectional view along direction A-A in FIG. 11a. In an exemplary embodiment, the third conductive layer may be called a first metal source-drain layer (SD1).

As shown in FIG. 11a, in an exemplary embodiment, the first power supply line 41 extends in the second direction Y. On the one hand, the first power supply line 41 is connected to the second plate 32 through the second via V2, and on the other hand, the first power supply line 41 is connected to the shield electrode 33 through the eighth via V8, and furthermore, is connected to the fifth active layer through the third via V3, so that the shield electrode 33 and the second plate 32 have a same potential as the first power supply line 41. Since there is an overlap region between an orthographic projection of the shield electrode 33 on the base substrate and an orthographic projection of the data signal line to be formed subsequently on the base substrate, and the shield electrode 33 is connected to the first power supply line 41, so that the impact of the jumping change of data voltage on a critical node is effectively shielded, thus preventing the jumping change of data voltage from affecting the potential of the critical node of the pixel driving circuit, and improving the display effect.

In an exemplary embodiment, the data signal line 42 extends in the second direction Y, and the data signal line 42 is connected to the first region of the fourth active layer through the fifth via V5, so that a data signal transmitted by the data signal line 42 is written into the fourth transistor T4.

In an exemplary embodiment, the first connection electrode 43 extends in the second direction Y. A first end of the first connection electrode is connected to the second region of the first active layer (i.e., the first region of the second active layer) through the sixth via V6, and a second end of the first connection electrode is connected to the first plate 24 through the first via V1, so that the first plate 24, the second electrode of the first transistor T1 and the first electrode of the second transistor T2 have the same potential. In an exemplary embodiment, the first connection electrode 43 may be used as the second electrode of the first transistor T1 and the first electrode of the second transistor T2.

In an exemplary embodiment, the second connection electrode 44 extends in the second direction Y, and has a first end connected to the initial signal line 31 through the ninth via V9, and a second end is connected to the first region of the seventh active layer (i.e., the first region of the first active layer) through the seventh via V7, so that the first electrode of the seventh transistor T7 and the first electrode of the first transistor T1 have a same potential as the initial signal line 31. In an exemplary embodiment, the second connection electrode 44 may be used as the first electrode of the seventh transistor T7 and the first electrode of the first transistor T1.

In an exemplary embodiment, the third connection electrode 45 is connected to the second region of the sixth active layer (i.e., the second region of the seventh active layer) through the fourth via V4, so that the second electrode of the sixth transistor T6 and the second electrode of the seventh transistor T7 have a same potential. In an exemplary embodiment, the third connection electrode 45 may be used as the second electrode of the sixth transistor T6 and the second electrode of the seventh transistor T7. In an exemplary embodiment, the third connection electrode 45 is configured to be connected to an anode to be formed subsequently.

In an exemplary embodiment, the first power supply line 41 and the data signal line 42 may be straight lines of equal widths, or straight lines of unequal widths.

As shown in FIG. 11b, in a plane perpendicular to the base substrate, the first insulating layer 91 is arranged on the base substrate 10. The semiconductor layer is arranged on the first insulating layer 91. The second insulating layer 92 covers the semiconductor layer. The first conductive layer is arranged on the second insulating layer 92. The third insulating layer 93 covers the first conductive layer. The second conductive layer is arranged on the third insulating layer 93. The fourth insulating layer 94 covers the second conductive layer. The third conductive layer is arranged on the fourth insulating layer 94, and the third conductive layer at least includes the first connection electrode 43 and the third connection electrode 45. The first connection electrode 43 is connected to the first plate 24 and the first active layer 11 of a first transistor T1 through the first via V1 and the sixth via V6, respectively.

(16) A pattern of a planarization layer is formed. In an exemplary embodiment, the operation that the pattern of the planarization layer is formed may include: the base substrate on which the foregoing patterns are formed is coated with a planarization thin film, and the planarization thin film is patterned through a patterning process to form a planarization layer covering the third conductive layer. The planarization layer is provided with a tenth via V10, as shown in FIG. 12a and FIG. 12b, and FIG. 12b is a sectional view along direction A-A in FIG. 12a.

Figure 12A:
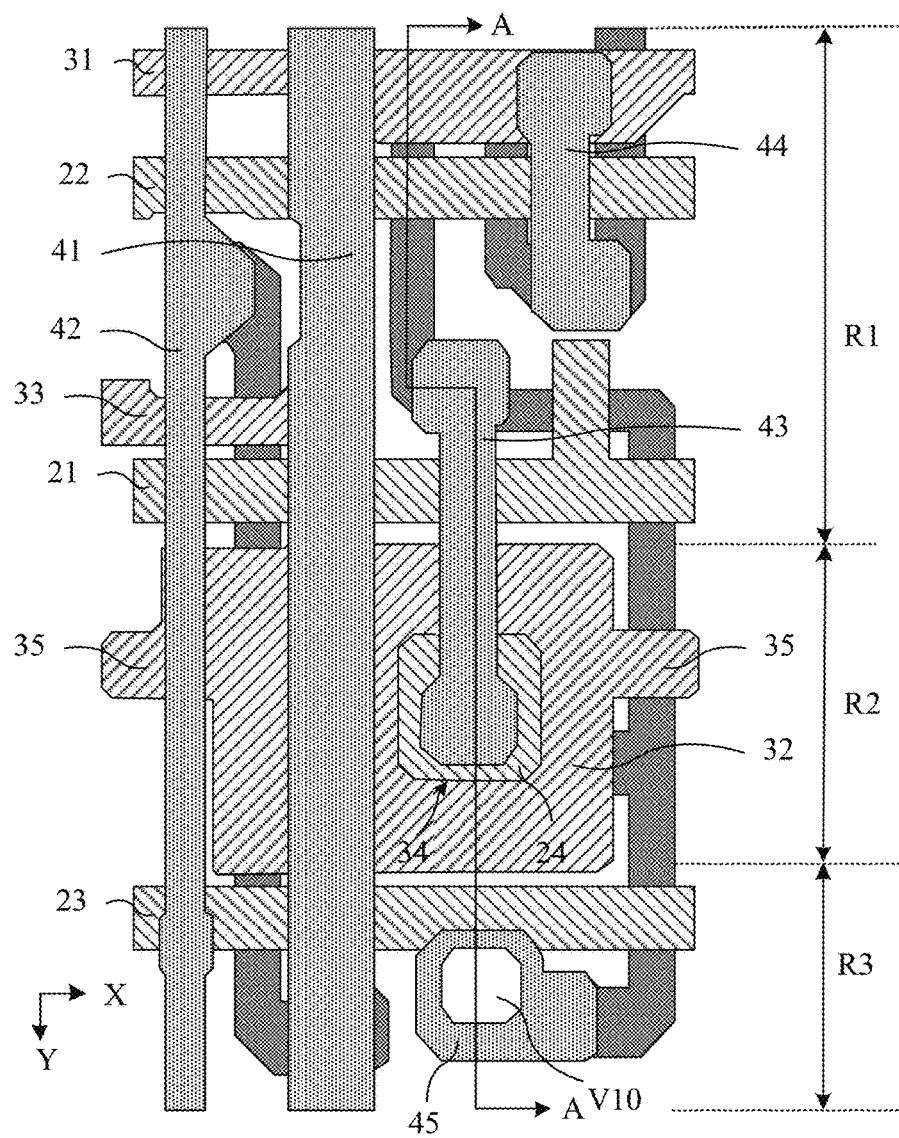
FIG. 12a is a schematic diagram after a pattern of a planarization layer of a display substrate is formed according to the present disclosure.

As shown in FIG. 12a, the tenth via V10 is located in a region where the third connection electrode 45 is located, the planarization layer in the tenth via V10 is removed to expose a surface of the third connection electrode 45, and the tenth via V10 is configured such that the anode to be formed subsequently is connected to the third connection electrode 45 through the via.

Figure 12B:
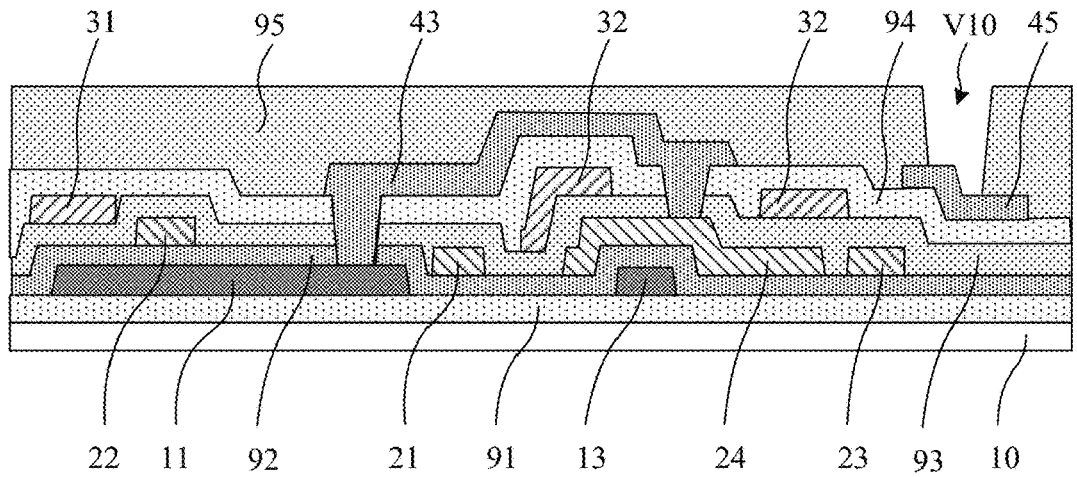

As shown in FIG. 12b, in a plane perpendicular to the base substrate, the first insulating layer 91 is arranged on the base substrate 10. The semiconductor layer is arranged on the first insulating layer 91. The second insulating layer 92 covers the semiconductor layer. The first conductive layer is arranged on the second insulating layer 92. The third insulating layer 93 covers the first conductive layer. The second conductive layer is arranged on the third insulating layer 93. The fourth insulating layer 94 covers the second conductive layer. The third conductive layer is arranged on the fourth insulating layer 94. The planarization layer 95 covers the third conductive layer, and the planarization layer is provided with the tenth via V10. The planarization layer 95 in the tenth via V10 is removed to expose a surface of the third connection electrode 45.

(17) A pattern of an anode is formed. In an exemplary embodiment, the operation that the pattern of the anode is formed may include: a transparent conductive thin film is deposited on the base substrate on which the foregoing patterns are formed, and the transparent conductive thin film is patterned through a patterning process to form an anode 71 arranged on the planarization layer, as shown in FIG. 13a and FIG. 13b, and FIG. 13b is a sectional view along direction A-A in FIG. 13a.

Figure 13A:
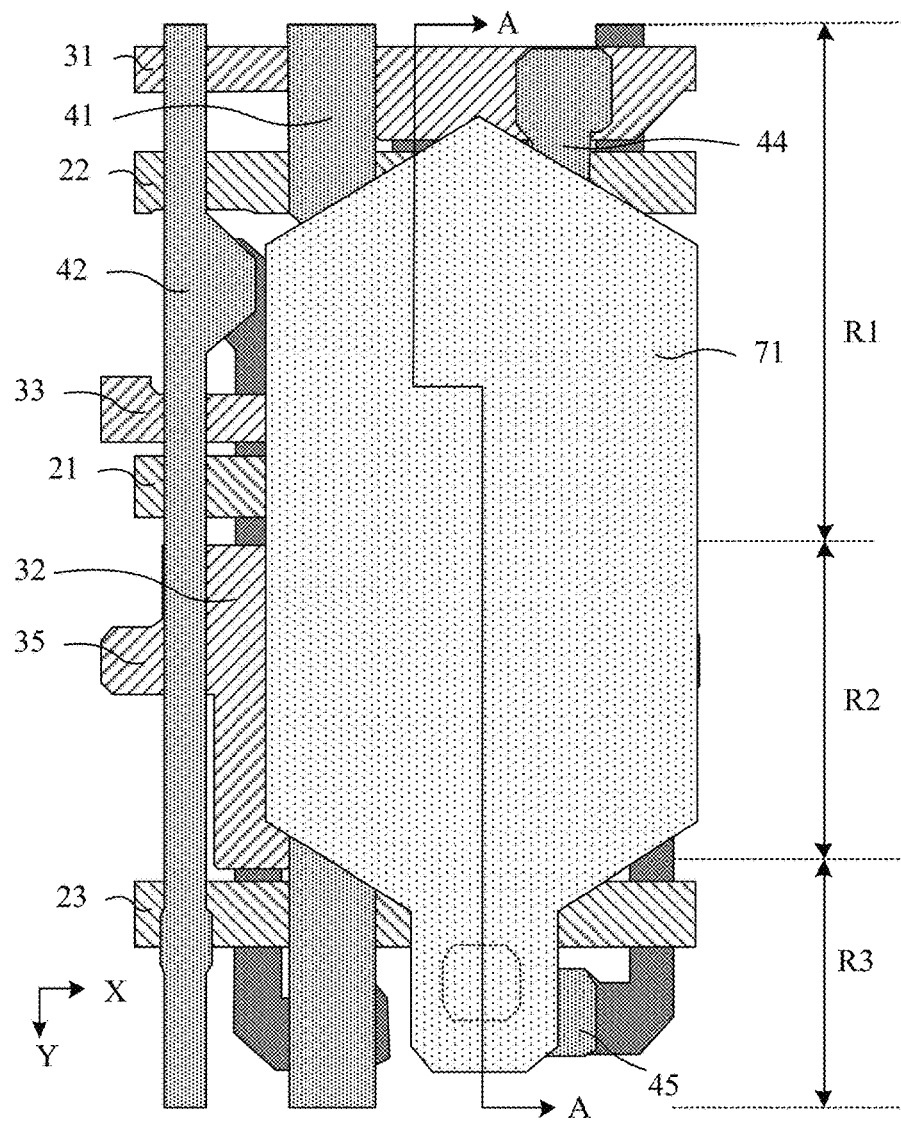
FIG. 13a is a schematic diagram after a pattern of an anode of a display substrate is formed according to the present disclosure.

As shown in FIG. 13a, the anode 71 may be hexagonal, and the anode 71 is connected to the third connection electrode 45 through the tenth via V10. Since the third connection electrode 45 is used as the second electrode of the sixth transistor T6 and the second electrode of the seventh transistor T7, the anode 71 is connected to the sixth transistor T6 and the seventh transistor T7, so that the pixel driving circuit can drive the light emitting device to emit light.

Figure 13B:
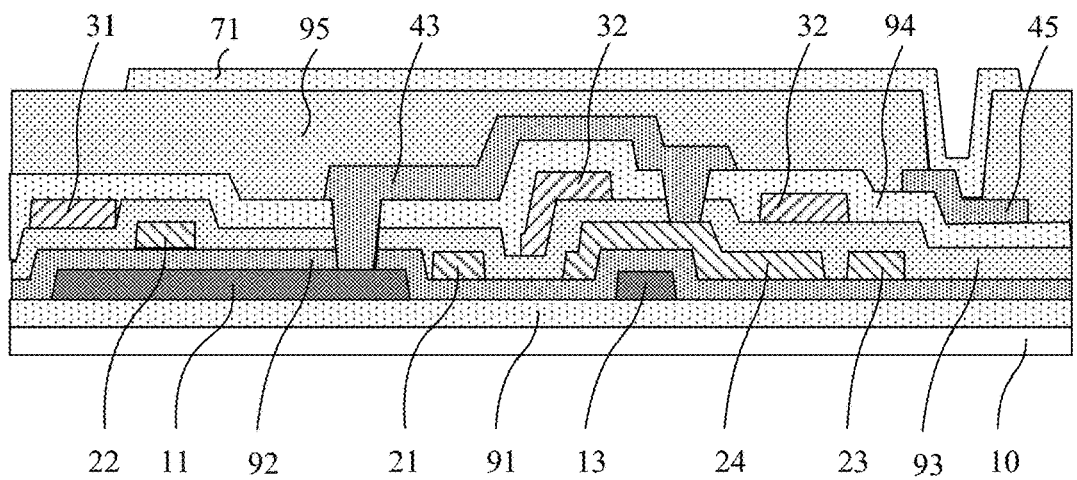

As shown in FIG. 13b, in a plane perpendicular to the base substrate, the first insulating layer 91 is arranged on the base substrate 10. The semiconductor layer is arranged on the first insulating layer 91. The second insulating layer 92 covers the semiconductor layer. The first conductive layer is arranged on the second insulating layer 92. The third insulating layer 93 covers the first conductive layer. The second conductive layer is arranged on the third insulating layer 93. The fourth insulating layer 94 covers the second conductive layer. The third conductive layer is arranged on the fourth insulating layer 94. The planarization layer 95 covers the third conductive layer. The anode 71 is arranged on the planarization layer 95, and the anode 71 is connected to the third connection electrode 45 through the tenth via.

In an exemplary embodiment, a subsequent preparation process may include: a pixel definition thin film is coated, and the pixel definition thin film is patterned through a patterning process to form a pixel definition layer. The pixel definition layer of each sub-pixel is provided with a pixel opening, wherein the anode is exposed by the opening. An organic light-emitting layer is formed by an evaporation or inkjet printing process, and a cathode is formed on the organic light-emitting layer. An encapsulation layer is formed. The encapsulation layer may include a first encapsulation layer, a second encapsulation layer, and a third encapsulation layer that are stacked. The first encapsulation layer and the third encapsulation layer may be made of an inorganic material. The second encapsulation layer may be made of an organic material. The second encapsulation layer is arranged between the first encapsulation layer and the third encapsulation layer so that it can be ensured that external water vapor cannot enter the light emitting structure layer.

In an exemplary implementation mode, the base substrate may be a flexible base substrate, or a rigid base substrate. The rigid base substrate may be, but not limited to, one or more of glass and quartz. The flexible base substrate may be, but not limited to, one or more of polyethylene terephthalate, ethylene terephthalate, polyether ether ketone, polystyrene, polycarbonate, polyarylate, polyarylate, polyimide, polyvinyl chloride, polyethylene, and textile fibers. In an exemplary implementation mode, the flexible base substrate may include a first flexible material layer, a first inorganic material layer, a semiconductor layer, a second flexible material layer, and a second inorganic material layer that are stacked. Materials of the first, second, and third flexible material layers may be polyimide (PI), polyethylene terephthalate (PET), a polymer soft film material subjected to surface treatment, or other materials. The first inorganic material layer and the second inorganic material layer may be made of materials such as silicon nitride (SiNx) or silicon oxide (SiOx), and are used to improve the water and oxygen resistance of the base substrate. Material of the semiconductor layer may be amorphous silicon (a-si).

In an exemplary embodiment, the first conductive layer, the second conductive layer, and the third conductive layer may be made of a metal material, for example, any one or more of Argentum (Ag), Copper (Cu), Aluminum (A1), and Molybdenum (Mo), or an alloy material of the abovementioned metals, for example, an Aluminum-Neodymium alloy (AlNd) or a Molybdenum-Niobium alloy (MoNb), and may be in a single-layer structure, or in a multilayer composite structure such as Mo/Cu/Mo. The first insulating layer, the second insulating layer, the third insulating layer, and the fourth insulating layer may be made of any one or more of silicon oxide (SiOx), silicon nitride (SiNx), and silicon oxynitride (SiON), and may be single-layer, multilayers, or composite layer. The first insulating layer is called a buffer layer and used to improve the water and oxygen resistance of the base substrate. The second insulating layer and the third insulating layer are called Gate Insulator (GI) layers. The fourth insulating layer is called an Interlayer Dielectric (ILD) layer. The planarization layer may be made of an organic material, and the transparent conductive thin film may be made of indium tin oxide (ITO) or indium zinc oxide (IZO). The active layer may be made of polysilicon (p-Si), that is, the present disclosure is applicable to LTPS thin film transistors.

Figure 14:
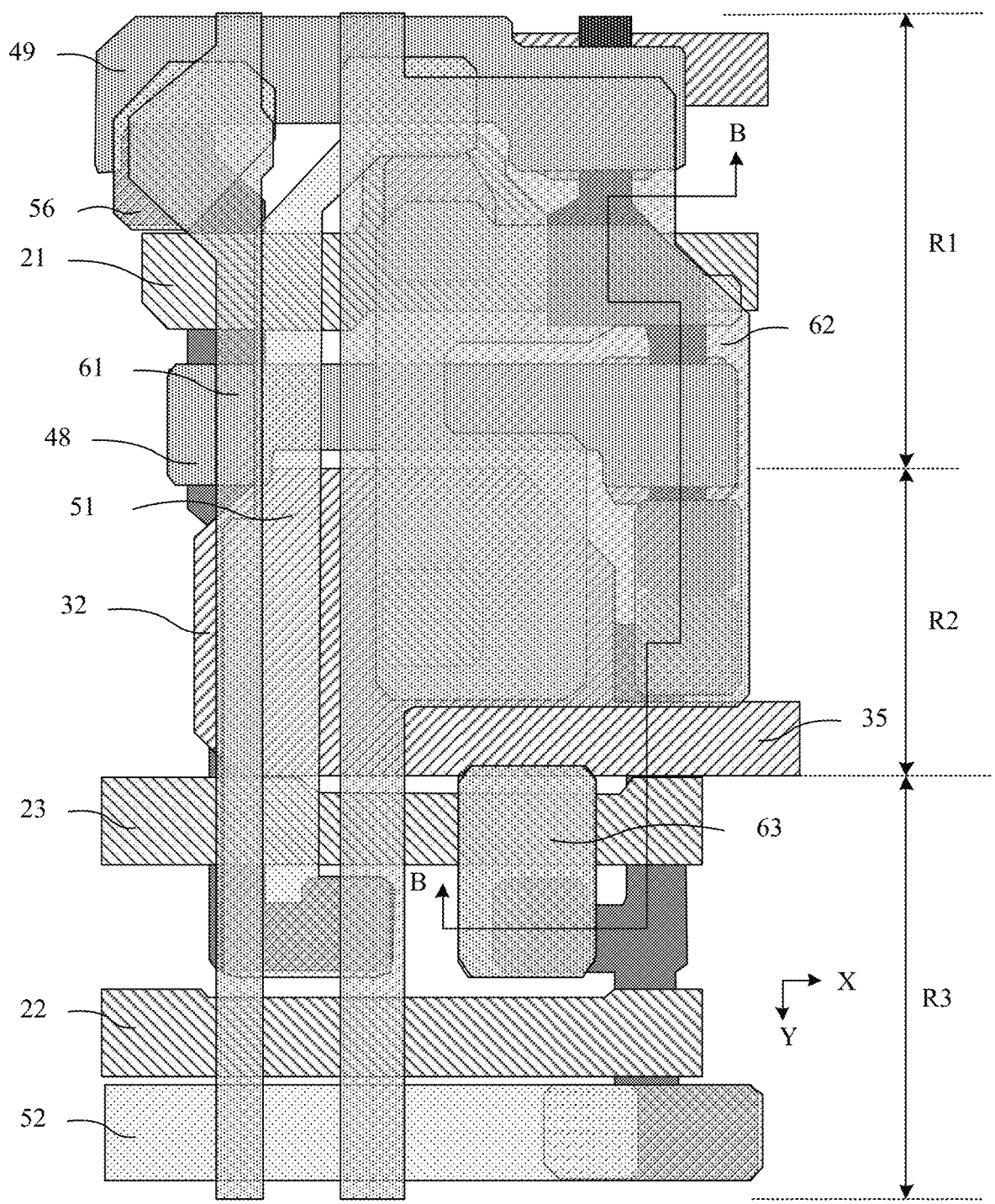
FIG. 14 is a schematic structural diagram of another display substrate according to an exemplary embodiment of the present disclosure.

FIG. 14 is a schematic structural diagram of another display substrate according to an exemplary embodiment of the present disclosure, illustrating a planar structure of one sub-pixel. As shown in FIG. 14, in a plane parallel to the display substrate, a first scanning signal line 21, a second scanning signal line 22, a light emitting control line 23, an initial signal line 52, a data signal line 61, a first power supply line 62, and a pixel driving circuit are arranged in the sub-pixel of the display substrate. The pixel driving circuit may include multiple transistors and a storage capacitor. The storage capacitor includes a first plate and a second plate. The multiple transistors may include a first transistor, a second transistor, a third transistor, a fourth transistor, a fifth transistor, a sixth transistor, and a seventh transistor, wherein the third transistor is a drive transistor.

In a plane perpendicular to the display substrate, the display substrate may include a first semiconductor layer, a first conductive layer, a second conductive layer, a second semiconductor layer, a third conductive layer, a fourth conductive layer, and a fifth conductive layer that are sequentially arranged on a base substrate. In the exemplary embodiment, the first semiconductor layer may include active layers of multiple polysilicon transistors. The first conductive layer may include the first scanning signal line 21, the second scanning signal line 22, the light emitting control line 23, the first plate of a storage capacitor, and gate electrodes of the multiple polysilicon transistors. The second conductive layer may include the second plate 32 of the storage capacitor, a plate connection line 35, a node electrode, a first shield layer, and a second shield layer. The second semiconductor layer may include active layers of multiple oxide transistors. The third conductive layer may include a first auxiliary signal line 48, a second auxiliary signal line 49, and gate electrodes of the multiple oxide transistors. The fourth conductive layer may include a power supply connection line 51, an initial signal line 52, a fifth connection electrode, a sixth connection electrode, a seventh connection electrode and an eighth connection electrode. The fifth conductive layer may include the data signal line 61, the first power supply line 62 and an anode connection electrode 63.

In an exemplary implementation mode, the display substrate may include a first insulating layer, a second insulating layer, a third insulating layer, a fourth insulating layer, a fifth insulating layer, a sixth insulating layer, a seventh insulating layer, a first planarization layer, and a second planarization layer. The first insulating layer is arranged between the base substrate and the first semiconductor layer. The second insulating layer is arranged between the first semiconductor layer and the first conductive layer. The third insulating layer is arranged between the first conductive layer and the second conductive layer. The fourth insulating layer is arranged between the second conductive layer and the second semiconductor layer. The fifth insulating layer is arranged between the second semiconductor layer and the third conductive layer. The sixth insulating layer is arranged between the third conductive layer and the fourth conductive layer. The seventh insulating layer and the first planarization layer are arranged between the fourth conductive layer and the fifth conductive layer. The second planarization layer is arranged between the fifth conductive layer and the anode.

In an exemplary implementation mode, the first scanning signal line 21 extending in the first direction X is located in the first region R1, the first plate and the second plate are located in the second region R2, and the second scanning signal line 22, the light emitting control line 23, and the initial signal line 52 that extend in the first direction X are located in the third region R3.

In an exemplary implementation mode, a gate electrode of the first transistor is connected to the second auxiliary signal line, a first electrode of the first transistor is connected to the initial signal line 52, and a second electrode of the first transistor is connected to a first electrode of the second transistor, a gate electrode of the third transistor, and the first plate, respectively. A gate electrode of the second transistor is connected to the first auxiliary signal line, and a second electrode of the second transistor is connected to a second electrode of the third transistor and a first electrode of the sixth transistor respectively. A first electrode of the third transistor is connected to a second electrode of the fourth transistor and a second electrode of the fifth transistor respectively. A gate electrode of the fourth transistor is connected to the first scanning signal line 21, a first electrode of the fourth transistor is connected to the data signal line 61 through the eighth connection electrode 56, and the second electrode of the fourth transistor is connected to the first electrode of the third transistor. A gate electrode of the fifth transistor is connected to the light emitting control line 23, and a first electrode of the fifth transistor is connected to the first power supply line 62 and the second plate 32. A gate electrode of the sixth transistor is connected to the light emitting control line 23, and a second electrode of the sixth transistor is connected to an anode of a light emitting device through the seventh connection electrode and the anode connection electrode 63. A gate electrode of the seventh transistor is connected to the second scanning signal line 22, a first electrode of the seventh transistor is connected to the initial signal line 52, and the second electrode of the seventh transistor is connected to the second electrode of the sixth transistor.

In an exemplary implementation mode, the first plate is also used as the gate electrode of the third transistor. There is an overlap region between an orthographic projection of the first plate on the base substrate and an orthographic projection of the third active layer on the base substrate. The third active layer in the overlap region is used as a channel region of the third transistor. In an exemplary implementation mode, the structure of the channel region is similar to that in the foregoing embodiments, and a drain terminal segment of the channel region is fan-shaped, which will not be repeated here.

In an exemplary implementation mode, a preparation process of the display substrate according to the exemplary embodiment may include the following operations.

(21) A pattern of a first semiconductor layer is formed. In an exemplary embodiment, the operation that the pattern of the first semiconductor layer is formed may include: a first insulating thin film and a first semiconductor thin film are sequentially deposited on a base substrate, and the first semiconductor layer thin film is patterned through a patterning process to form a first insulating layer that covers the base substrate and form the first semiconductor layer arranged on the first insulating layer, as shown in FIG. 15*a* and FIG. 15*b*, and FIG. 15*b* is a sectional view along direction B-B in FIG. 15*a*.

Figure 15A:
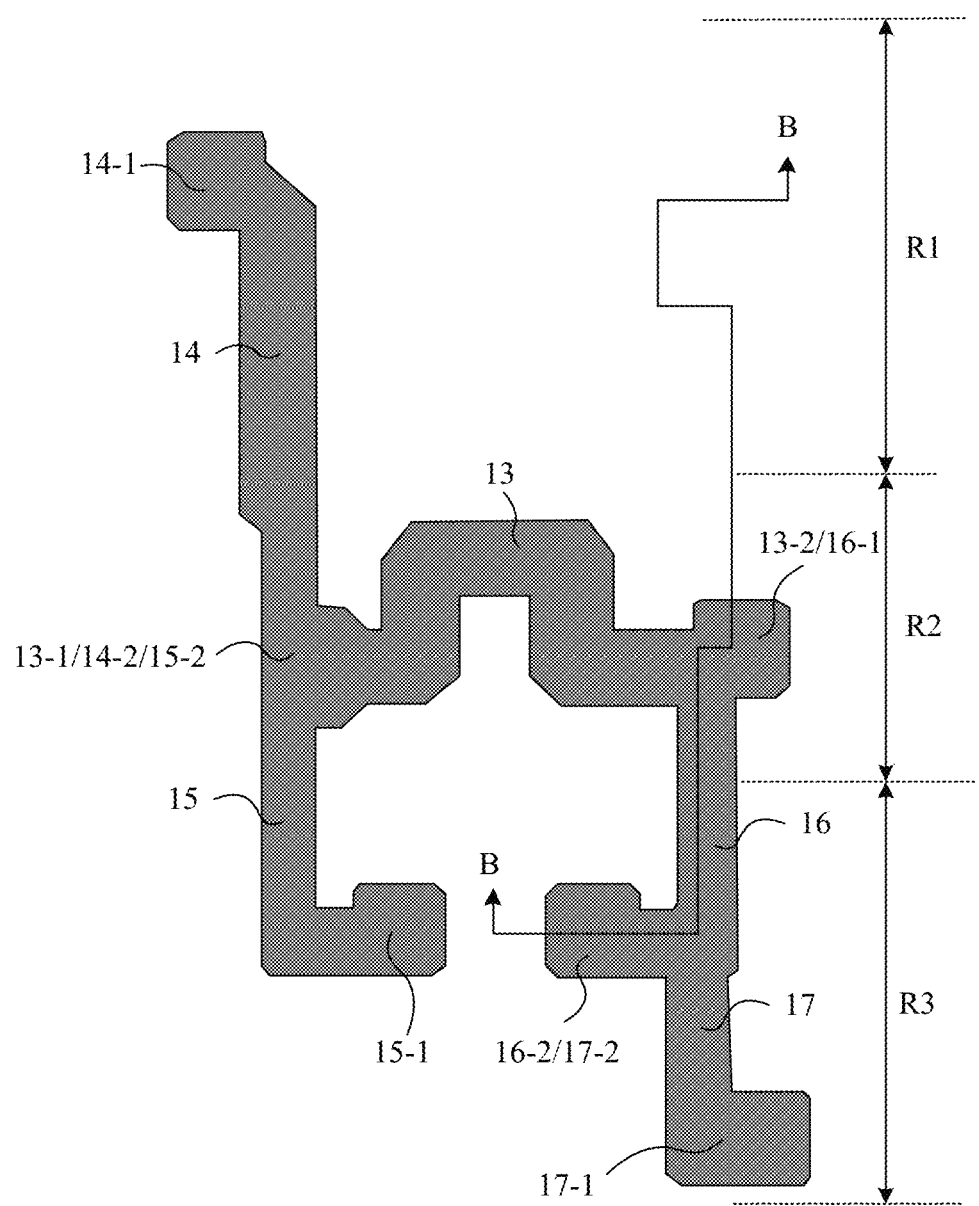
FIG. 15a is a schematic diagram after a pattern of a first semiconductor layer of another display substrate is formed according to the present disclosure.
Figure 15B:
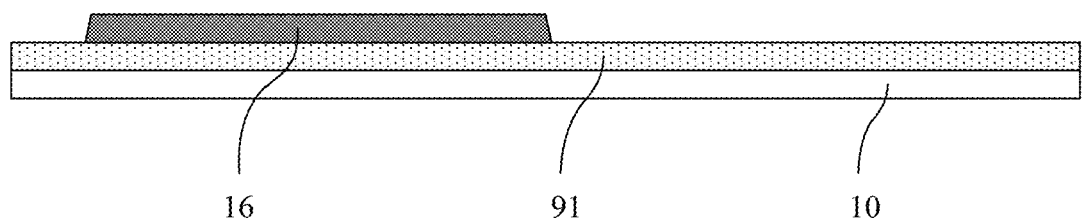

As shown in FIG. 15*a*, the first semiconductor layer of each sub-pixel may include a third active layer 13 of the third transistor T3 to a seventh active layer 17 of the seventh transistor T7, and the third active layer 13 to the seventh active layer 17 are of a mutual-connected integral structure.

In an exemplary embodiment, a fourth active layer 14 of the fourth transistor T4 is arranged in the first region R1, the third active layer 13 of the third transistor T3 is arranged in the second region R2, and the fifth active layer 15 of the fifth transistor T5, the sixth active layer 16 of the sixth transistor T6, and the seventh active layer 17 of the seventh transistor T7 are arranged in the third region R3. The seventh active layer 17 is arranged on a side, away from the second region R2, in the third region R3. The fifth active layer 15 and the sixth active layer 16 are arranged on a side, adjacent to the second region R2, in the third region R3.

In the exemplary embodiment, the third active layer 13 may be in the shape of an "n", the fourth active layer 14 may be in the shape of a "1", and the fifth active layer 15, the sixth active layer 16, and the seventh active layer 17 each may be in the shape of an "L".

In an exemplary embodiment, the active layer of each transistor may include a first region, a second region, and a channel region between the first region and the second region. In an exemplary embodiment, a first region 13-1 of the third active layer 13 is also used as a second region 14-2 of the fourth active layer 14 and a second region 15-2 of the fifth active layer 15, that is, the first region 13-1 of the third active layer 13, the second region 14-2 of the fourth active layer 14, and the second region 15-2 of the fifth active layer 15 are connected to one another. A second region 13-2 of the third active layer 13 is also used as a first region 16-1 of the sixth active layer 16, that is, the second region 13-2 of the third active layer 13, and the first region 16-1 of the sixth active layer 16 are connected to each other. A second region 16-2 of the sixth active layer 16 is also used as a second region 17-2 of the seventh active layer 17, that is, the second region 16-2 of the sixth active layer 16 and the second region 17-2 of the seventh active layer 17 are connected to each other. A first region 14-1 of the fourth active layer 14, a first region 15-1 of the fifth active layer 15, and a first region 17-1 of the seventh active layer 17 are separately arranged.

In an exemplary embodiment, the first semiconductor layer may be made of poly-silicon (p-Si), that is, the third, fourth, fifth, sixth, and seventh transistors are LTPS thin film transistors.

As shown in FIG. 15b, after this process, the display substrate includes a first insulating layer 91 arranged on the base substrate 10 and a first semiconductor layer arranged on the first insulating layer 91. The first semiconductor layer may include the sixth active layer 16.

Figure 16A:
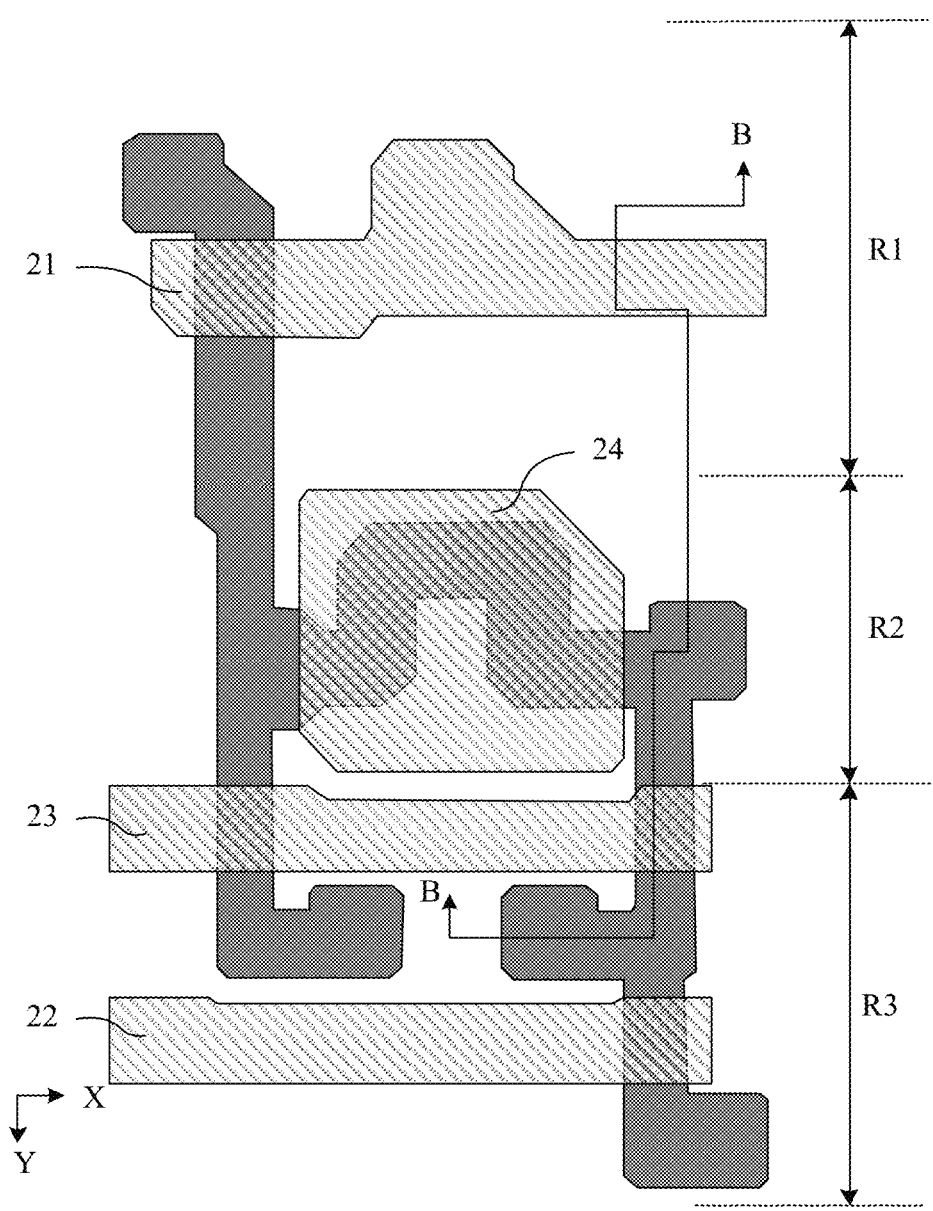
FIG. 16a is a schematic diagram after a pattern of a first conductive layer of another display substrate is formed according to the present disclosure.
Figure 16B:
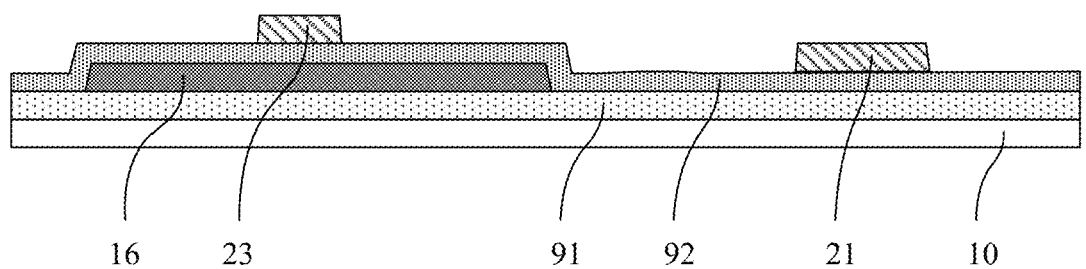

(22) A pattern of a first conductive layer is formed. In an exemplary embodiment, the operation that the pattern of the first conductive layer is formed may include: a second insulating thin film and a first metal thin film are sequentially deposited on the base substrate on which the above-mentioned pattern is formed, and the first metal thin film is patterned through a patterning process to form a second insulating layer that covers the pattern of the semiconductor layer and form a pattern of a first conductive layer arranged on the second insulating layer; wherein the first conductive layer pattern at least includes the first scanning signal line 21, the second scanning signal line 22, the light emitting control line 23, and the first plate 24 of the storage capacitor, as shown in FIG. 16a and FIG. 16b, and FIG. 16b is a sectional view along direction B-B in FIG. 16a. In an exemplary embodiment, the first conductive layer may be called a first metal gate layer (GATE1).

In an exemplary embodiment, the first scanning signal line 21, the second scanning signal line 22, and the light emitting control line 23 extend in the first direction X. The first scanning signal line 21 is arranged in the first region R1, the second scanning signal line 22 and the light emitting control line 23 are arranged in the third region R3, and the second scanning signal line 22 is located on a side of the light emitting control line 23 away from the second region R2, and the first plate 24 of the storage capacitor is arranged in the second region R2.

In an exemplary embodiment, the first plate 24 may be in the shape of a rectangle, and corners of the rectangle may be chamfered. There is an overlap region between an orthographic projection of the first plate 24 on the base substrate and an orthographic projection of the third active layer of the third transistor T3 on the base substrate. The first plate 24 is also used as the gate electrode of the third transistor T3. An overlap region between the third active layer of the third transistor T3 and the first plate 24 is used as a channel region of the third transistor T3. One end of the channel region is connected to the first region of the third active layer, and the other end of the channel region is connected to the second region of the third active layer. An overlap region between the first scanning signal line 21 and the fourth active layer of the fourth transistor T4 is used as the gate electrode of the fourth transistor T4. An overlap region between the first plate 24 and the third active layer of the third transistor T3 is used as the gate electrode of the third transistor T3. An overlap region between the light emitting control line 23 and the fifth active layer of the fifth transistor T5 is used as the gate electrode of the fifth transistor T5. An overlap region between the light emitting control line 23 and the sixth active layer of the sixth transistor T6 is used as the gate electrode of the sixth transistor T6. An overlap region between the second scanning line 22 and the seventh active layer of the seventh transistor T7 is used as the gate electrode of the seventh transistor T7.

In an exemplary embodiment, after the pattern of first conductive layer is formed, the first conductive layer may be used as a barrier for performing conducting treatment on the semiconductor layer. The channel regions of the third transistor T3 to the seventh transistor T7 are formed in a region of the semiconductor layer shielded by the first conductive layer. A region of the semiconductor layer which is not shielded by the first conductive layer is conducted, that is, the first region and the second region of each of the third active layer to the seventh active layer are both conducted.

In an exemplary embodiment, the structural of the third transistor T3 is the same as that in the foregoing embodiments, the drain terminal segment of the drive transistor is configured to be in a fan shape, so that the problem of unsaturated output of the thin film transistor caused by shortening of the channel is solved, and output characteristics of the thin film transistor can be flattened, which will not be repeated omitted here. According to the exemplary embodiment of the present disclosure, the short-channel transistor with the flatted output characteristics can save space and facilitate high-resolution display, and moreover, the channel is shortened and the threshold voltage Vth of the drive transistor is reduced, thereby facilitating reduction of power consumption.

As shown in FIG. 16b, after this process, the display substrate includes the first insulating layer 91 arranged on the base substrate 10, the first semiconductor layer arranged on the first insulating layer 91, a second insulating layer 92 that covers the first semiconductor layer, and the first conductive layer arranged on the second insulating layer 92. The first conductive layer may include the first scanning signal line 21 and the light emitting control line 23.

Figure 17A:
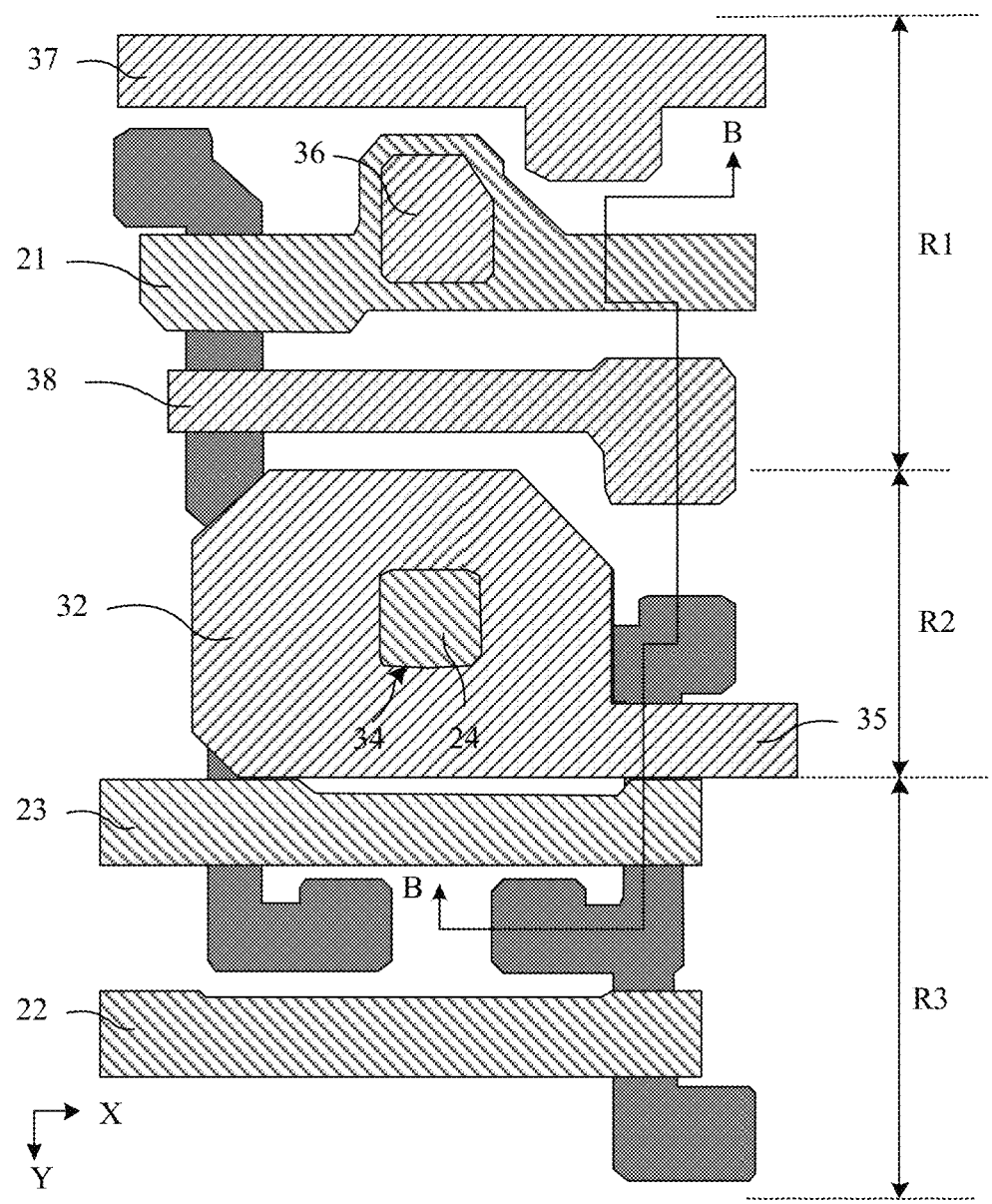
FIG. 17a is a schematic diagram after a pattern of a second conductive layer of another display substrate is formed according to the present disclosure.
Figure 17B:
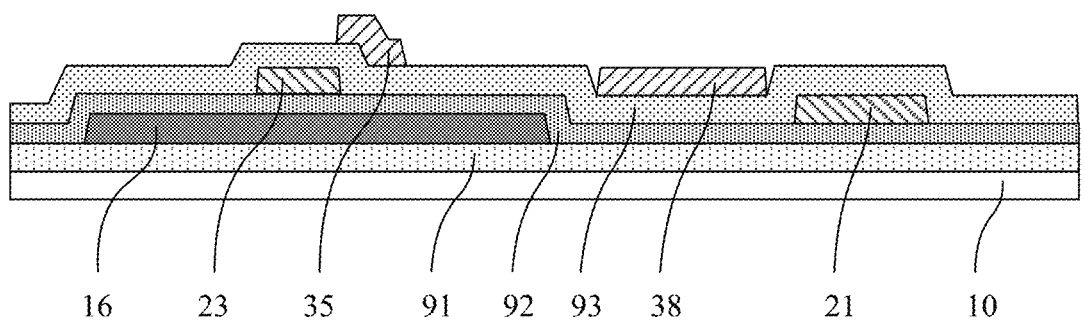

(23) A pattern of a second conductive layer is formed. In an exemplary embodiment, the operation that the pattern of the second conductive layer is formed may include: a third insulating thin film and a second metal thin film are sequentially deposited on the base substrate on which the above-mentioned patterns are formed, and the second metal thin film is patterned through a patterning process to form a third insulating layer 93 that covers the first conductive layer and form a pattern of a second conductive layer arranged on the third insulating layer 93. The pattern of the second conductive layer pattern at least includes: a second plate 32 of the storage capacitor, a plate connection line 35, a node electrode 36, a first shield layer 37, and a second shield layer 38, as shown in FIG. 17a and FIG. 17b, and FIG. 17b is a sectional view along direction B-B in FIG. 17a. In an exemplary embodiment, the second conductive layer may be called a second metal gate layer (GATE 2).

As shown in FIG. 17a, in an exemplary embodiment, the second plate 32 of the storage capacitor is arranged in the second region R2 and located between the second shield layer 38 and the light emitting control line 23. An outline of the second plate 32 may be in the shape of a rectangle, and corners of the rectangle may be chamfered. There is an overlap region between an orthographic projection of the second plate 32 on the base substrate and the orthographic projection of the first plate 24 on the base substrate. The second plate 32 is provided with an opening 34, and the opening 34 may be located in the middle of the second region R2. The opening 34 may be rectangular so that the second plate 32 forms a loop structure. The opening 34 exposes the third insulating layer 93 that covers the first plate 24, and the orthographic projection of the first plate 24 on the base substrate includes an orthographic projection of the opening 34 on the base substrate. In an exemplary embodiment, the opening 34 is configured to accommodate the first via to be formed subsequently. The first via is located in the opening 34 and exposes the first plate 24, so that a second electrode of the first transistor T1 to be formed subsequently is connected to the first plate 24.

In an exemplary embodiment, the plate connection line 35 is arranged between second plates 32 of adjacent sub-pixels in the first direction X. A first end of the plate connection line 35 is connected to the second plates 32 of the sub-pixel, and a second end of the plate connection line 35 extends in the first direction X and is connected to the second plates 32 of the adjacent sub-pixel in the first direction X, that is, the plate connection line 35 is configured to make the second plates of the adjacent sub-pixels in the first direction X connected to one another. In an exemplary embodiment, the second plates in the adjacent sub-pixels are formed into a mutual-connected integrated structure through the plate connection line 35, and the second plate of the integrated structure can be multiplexed as a power signal line to ensure that the second plates in the adjacent sub-pixels have a same potential, which is conductive to improving uniformity of a panel, avoids display defects of the display substrate, and ensures the display effect of the display substrate.

In an exemplary embodiment, an orthographic projection of an edge of the second plate 32 on the base substrate adjacent to the first region R1 is overlapped with an orthographic projection of a boundary line between the first region R1 and the second region R2 on the base substrate. An orthographic projection of an edge of the second plate 32 on the base substrate adjacent to the third region R3 is overlapped with an orthographic projection of a boundary line between the second region R2 and the third region R3 on the base substrate, that is, a length of the second plate 32 is equal to a length of the second region R2.

In an exemplary embodiment, the node electrode 36 is disposed in the first region R1, and an orthographic projection of the node electrode 36 on the base substrate is within a range of an orthographic projection of the first scanning signal line 21 on the base substrate.

In an exemplary embodiment, the first shield layer 37 and the second shield layer 38 extend in the first direction X and are arranged in the first region R1. The first shield layer 37 is located on a side, of the first scanning signal line 21 away from the second region R2, and the second shield layer 38 is located on a side of the first scanning signal line 21 adjacent to the second region R2. In an exemplary embodiment, the first shield layer 37 is configured as a shield layer of the first transistor to shield the channel of the first transistor, and the second shield layer 38 is configured as a shield layer of the second transistor to shield the second transistor, thereby ensuring electrical performances of a first oxide transistor and a second oxide transistor.

As shown in FIG. 17*b*, in a plane perpendicular to the base substrate, the first insulating layer 91 is arranged on the base substrate 10, the semiconductor layer is arranged on the first insulating layer 91, the second insulating layer 92 covers the semiconductor layer, the first conductive layer is arranged on the second insulating layer 92, the third insulating layer 93 covers the first conductive layer, the second conductive layer is arranged on the third insulating layer 93, and the second conductive layer at least includes the plate connection line 35 and the second shield layer 38.

(24) A pattern of a second semiconductor layer is formed. In an exemplary embodiment, the operation that the pattern of the second semiconductor layer is formed may include: a fourth insulating thin film and a second semiconductor thin film are sequentially deposited on the base substrate on which the foregoing patterns are formed, the second semiconductor thin film is patterned through a patterning process to form a fourth insulating layer that covers the base substrate and form a second semiconductor layer arranged on the fourth insulating layer, as shown in FIG. 18*a* and FIG. 18*b*, and FIG. 18*b* is a sectional view along direction B-B in FIG. 18*a*.

Figure 18A:
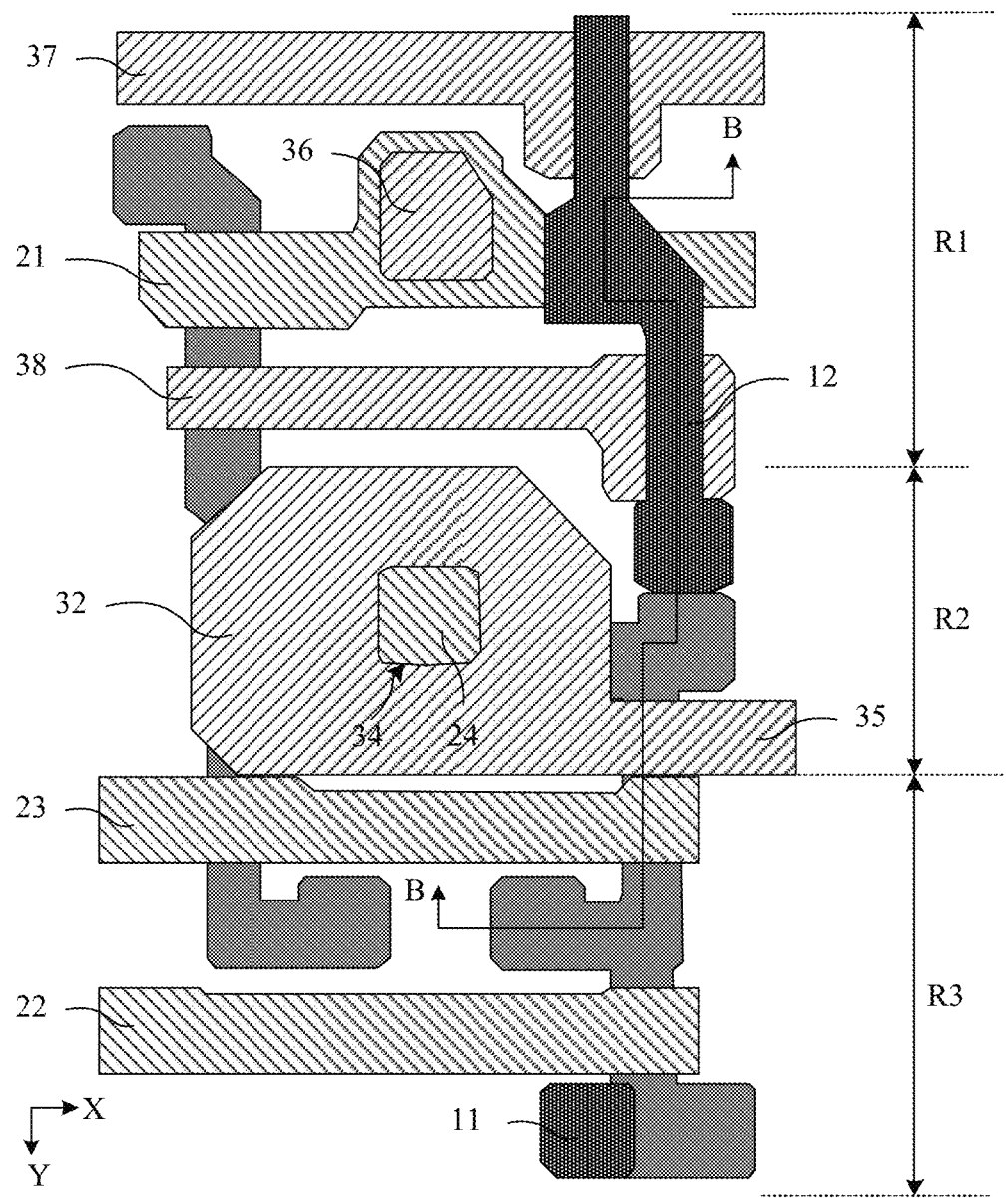
FIG. 18a is a schematic diagram after a pattern of a second semiconductor layer of another display substrate is formed according to the present disclosure.
Figure 18B:
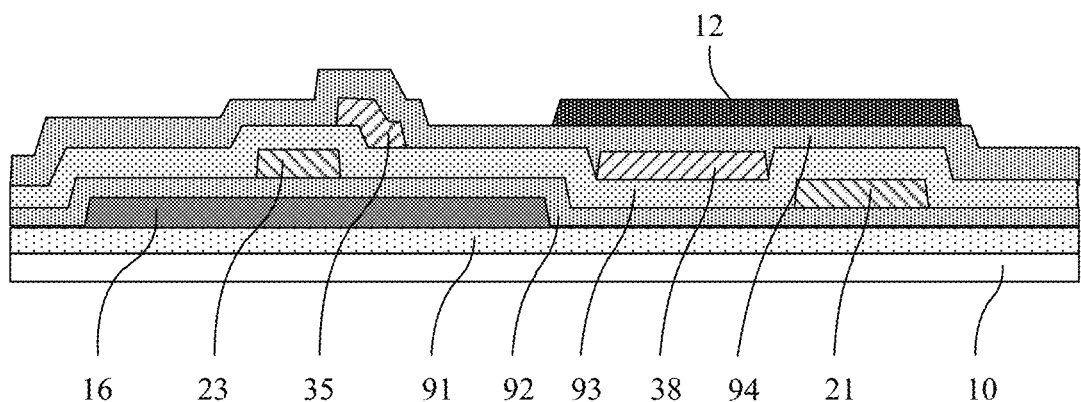

As shown in FIG. 18*a*, the second semiconductor layer of each sub-pixel may include a first active layer 11 of the first transistor T1 and a second active layer 12 of the second transistor T2, and the first active layer 11 and the second active layer 12 may be of a mutual-connected integral structure.

In an exemplary embodiment, the first active layer 11 and the second active layer 12 may be in a shape of "1". The first region of the first active layer 11 is adjacent to the first region of the seventh active layer, and the second region of the first active layer 11 is also used as the first region of the second active layer 12. The second region of the second active layer is adjacent to the second region of the third active layer.

In an exemplary embodiment, the second semiconductor layer may be made of oxides, that is, the first transistor and the second transistor are oxide thin film transistors.

As shown in FIG. 18*b*, in a plane perpendicular to the base substrate, the first insulating layer 91 is arranged on the base substrate 10. The first semiconductor layer is arranged on the first insulating layer 91. The second insulating layer 92 covers the first semiconductor layer. The first conductive layer is arranged on the second insulating layer 92. The third insulating layer 93 covers the first conductive layer. The second conductive layer is arranged on the third insulating layer 93. The fourth insulating layer 94 covers the second conductive layer. The second semiconductor layer is arranged on the fourth insulating layer 94. The second semiconductor layer at least includes the second active layer 12.

Figure 19A:
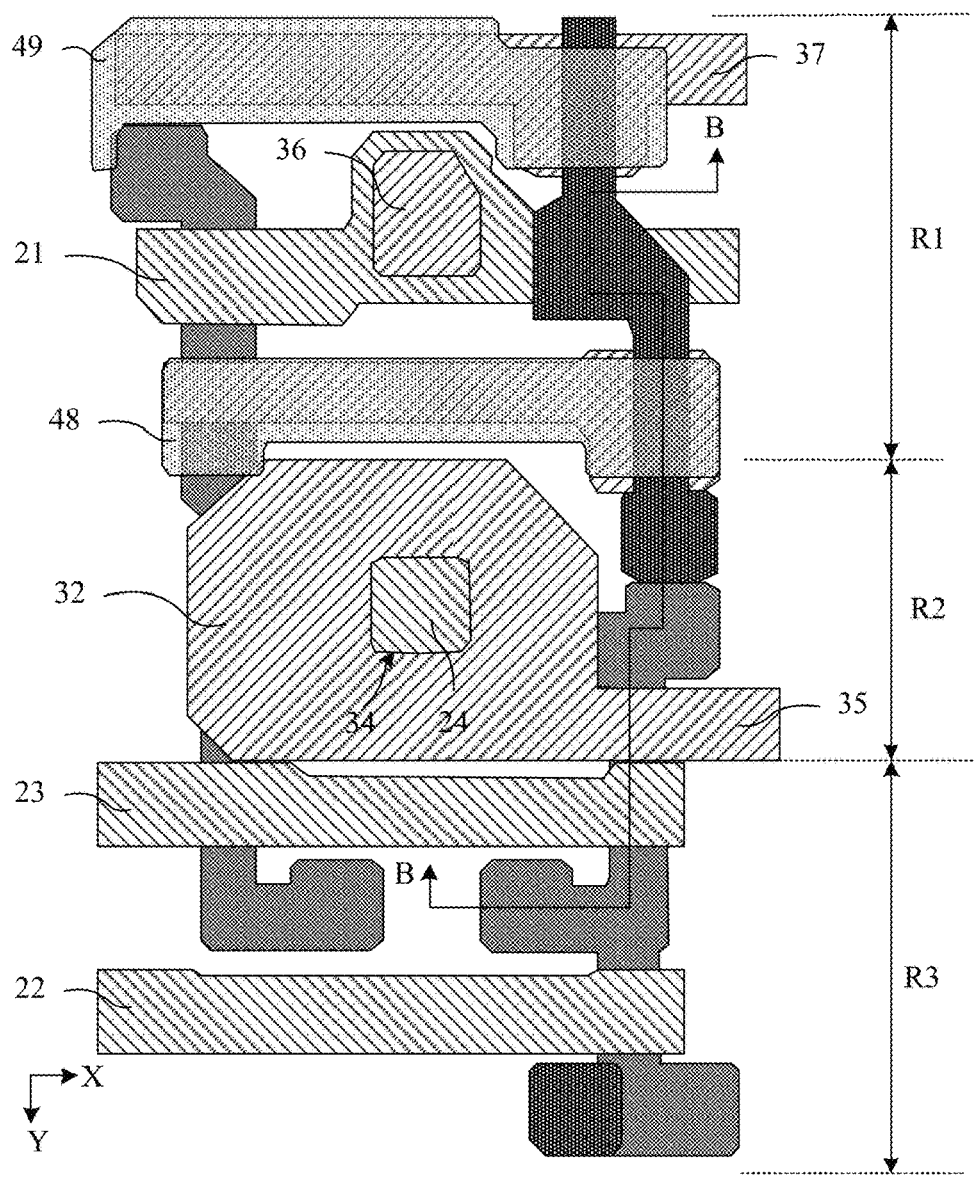
FIG. 19a is a schematic diagram after a pattern of a third conductive layer of another display substrate is formed according to the present disclosure.
Figure 19B:
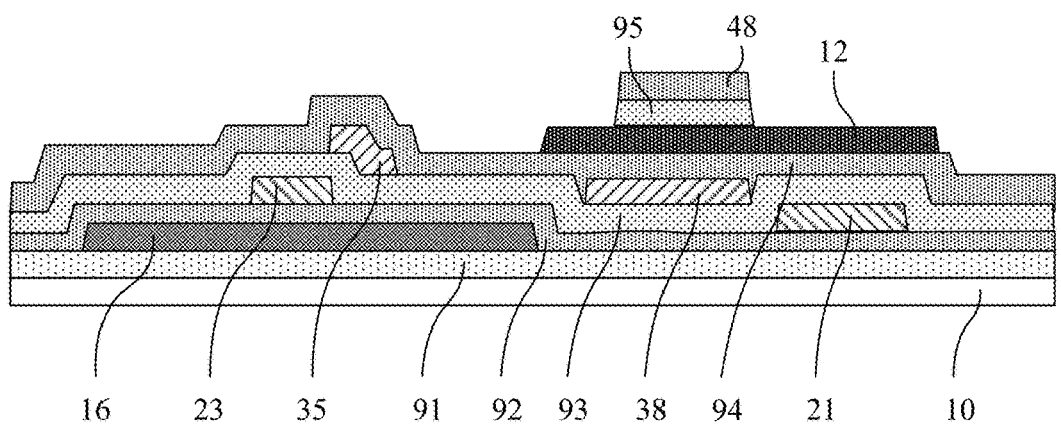

(25) A pattern of a third conductive layer is formed. In an exemplary embodiment, the operation that the pattern of the third conductive layer is formed may include: a fifth insulating thin film and a third metal thin film are sequentially arranged on the base substrate on which the above-mentioned patterns are formed, and the third metal thin film and the fifth insulating thin film are patterned through a patterning process to form a fifth insulating layer arranged on the second semiconductor layer and form a pattern of a third conductive layer arranged on the fifth insulating layer. The pattern of the third conductive layer at least includes: an initial signal line 48 and a second auxiliary signal line 49, as shown in FIG. 19*a* and FIG. 19*b*, and FIG. 19*b* is a sectional view along direction B-B in FIG. 19*a*. In an exemplary embodiment, the third conductive layer may be called a third metal gate layer (GATE3).

As shown in FIG. 19*a*, in an exemplary embodiment, the first auxiliary signal line 48 and the second auxiliary signal line 49 extend in the first direction X and are arranged in the first region R1. The first auxiliary signal line 48 is close to the first scanning signal line 21, and has a same signal as the first scanning signal line 21. The second auxiliary signal line 49 is close to the second scanning signal line 22 on the side of the second direction Y, and has a same signal as the second scanning signal line 22. In an exemplary embodiment, the first auxiliary signal line 48 and the first scanning signal line 21 may be connected to a same signal source, and the second auxiliary signal line 49 and the second scanning signal line 22 may be connected to the same signal source.

In an exemplary embodiment, an overlap region between the first auxiliary signal line 48 and the second active layer is used as a second gate electrode of the second transistor, and an overlap region between the second auxiliary signal line 49 and the first active layer is used as a first gate electrode of the first transistor.

In an exemplary embodiment, there is an overlap region between an orthographic projection of the first auxiliary signal line 48 on the base substrate and an orthographic projection of the second shield layer 38 on the base substrate, and there is an overlap region between an orthographic projection of the second auxiliary signal line 49 on the base substrate and an orthographic projection of the first shield layer 37 on the base substrate, so that the first shield layer 37 may be used as a shield layer for the first transistor, and the second shield layer 38 may be used as a shield layer for the second transistor.

As shown in FIG. 19b, in a plane perpendicular to the base substrate, the first insulating layer 91 is arranged on the base substrate 10. The semiconductor layer is arranged on the first insulating layer 91. The second insulating layer 92 covers the first semiconductor layer. The first conductive layer is arranged on the second insulating layer 92. The third insulating layer 93 covers the first conductive layer. The second conductive layer is arranged on the third insulating layer 93. The fourth insulating layer 94 covers the second conductive layer. The second semiconductor layer is arranged on the fourth insulating layer 94. The fifth insulating layer 95 is arranged on the second active layer 12 in the second semiconductor layer. The first auxiliary signal line 48 is arranged on the fifth insulating layer 95. In an exemplary embodiment, the orthographic projections of the first auxiliary signal line 48 and the second auxiliary signal line 49 on the base substrate are substantially the same as an orthographic projection of the fifth insulating layer 95 on the base substrate, or the orthographic projection of the fifth insulating layer 95 on the base substrate may be wider than the orthographic projections of the first auxiliary signal line 48 and the second auxiliary signal line 49 on the base substrate to prevent the first auxiliary signal line 48 and the second auxiliary signal line 49 from contacting the second active layer 12 during a preparation process. In an exemplary embodiment, the fifth insulating thin film may not be patterned, and only the third metal thin film may be patterned to form the fifth insulating layer 95 that covers the second active layer 12, wherein the fifth insulating layer 95 covers the entire base substrate.

(25) A pattern of poly-silicon vias is formed. In an exemplary embodiment, the operation that the pattern of poly-silicon vias is formed may include: a sixth insulating thin film is deposited on the base substrate on which the foregoing patterns are formed, and the sixth insulating thin film is patterned by a patterning process to form a sixth insulating layer that covers the third conductive layer. The sixth insulating layer is provided with multiple vias. The multiple vias at least include: a first via V1, a second via V2, a third via V3, a fourth via V4, a fifth via V5, a sixth via V6, a seventh via V7, and a thirteenth via V13, as shown in FIG. 20a and FIG. 20b, and FIG. 20b is a sectional view along direction B-B in FIG. 20a.

Figure 20A:
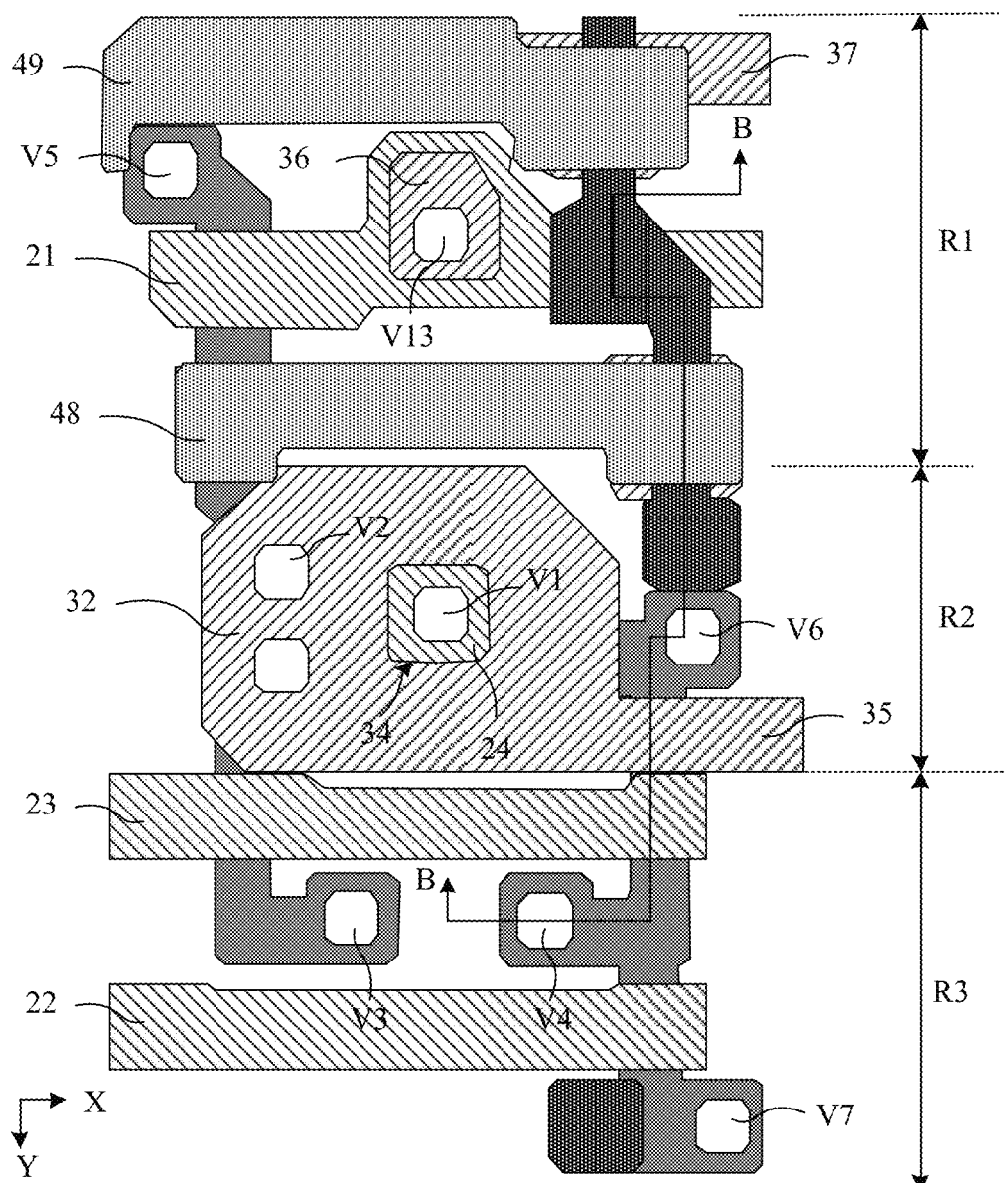
FIG. 20a is a schematic diagram after a pattern of poly-silicon vias of another display substrate is formed according to the present disclosure.
Figure 20B:
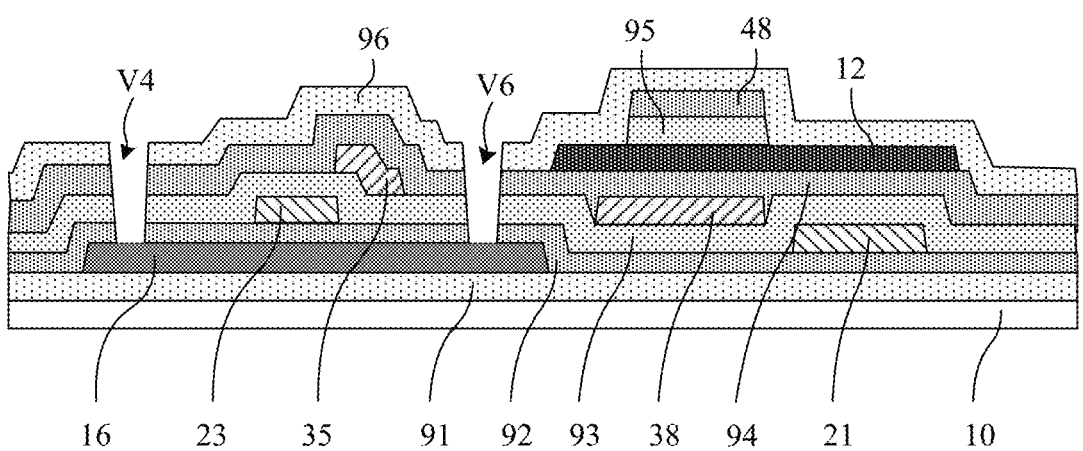

As shown in FIG. 20a, in an exemplary embodiment, the first via V1 is located in the opening 34 of the second plate 32. An orthographic projection of the first via V1 on the base substrate is located within a range of the orthographic projection of the opening 34 on the base. The sixth insulating layer, the fourth insulating layer, and the third insulating layer in the first via V1 are etched off to expose a surface of the first plate 24. The first via V1 is configured such that the second electrode of the first transistor T1 to be formed subsequently is connected to the first plate 24 through the via.

In an exemplary embodiment, the second via V2 is located in a region where the second plate 32 is located. An orthographic projection of the second via V2 on the base substrate is within a range of the orthographic projection of the second plate 32 on the base substrate. The sixth insulating layer and the fourth insulating layer in the second via V2 are etched off to expose a surface of the second plate 32. The second via V2 is configured such that the first power supply line to be formed subsequently is connected to the second plate 32 through the via. In an exemplary embodiment, there may be multiple second vias V2 serving as power supply vias, and the multiple second vias V2 may be sequentially arranged in the second direction Y, thereby improving connection reliability of the first power supply line with the second plate 32.

In an exemplary embodiment, the third via V3 is located in the third region R3, and the sixth insulating layer, the fourth insulating layer, the third insulating layer, and the second insulating layer in the third via V3 are etched off to expose a surface of the first region of the fifth active layer. The third via V3 is configured such that the first power supply line to be formed subsequently is connected to the fifth active layer through the via.

In an exemplary embodiment, the fourth via V4 is located in the third region R3, and the sixth insulating layer, the fourth insulating layer, the third insulating layer, and the second insulating layer in the fourth via V4 are etched off to expose a surface of the second region of the sixth active layer (the second region of the seventh active layer). The fourth via V4 is configured such that a second electrode of a sixth transistor T6 to be formed subsequently is connected to the sixth active layer through the via, and a second electrode of a seventh transistor T7 to be formed subsequently is connected to the seventh active layer through the via.

In an exemplary embodiment, the fifth via V5 is located in the first region R1, and the sixth insulating layer, the fourth insulating layer, the third insulating layer, and the second insulating layer in the fifth via V5 are etched off to expose a surface of the first region of the fourth active layer. The fifth via V5 is configured such that a data signal line to be formed subsequently is connected to the fourth active layer through the via.

In an exemplary embodiment, the sixth via V6 is located in the second region R2, and the sixth insulating layer, the fourth insulating layer, the third insulating layer, and the second insulating layer in the sixth via V6 are etched off to expose a surface of the first region of the sixth active layer (i.e., the second region of the third active layer). The sixth via V6 is arranged such that the first electrode of the sixth transistor T6 formed subsequently (i.e., the second electrode of the first transistor T1 and a first electrode of the second transistor T2) is connected to the sixth active layer through the via.

In an exemplary embodiment, the seventh via V7 is located in the third region R3, and the sixth insulating layer, the fourth insulating layer, the third insulating layer, and the second insulating layer in the seventh via V7 are etched off to expose a surface of the first region of the seventh active layer. The seventh via V7 is configured such that a first electrode of the seventh transistor T7 to be formed subsequently is connected to the seventh active layer through the via.

In an exemplary embodiment, the thirteenth via V13 is located in the first region R1, and the sixth insulating layer and the fourth insulating layer in the thirteenth via V13 are etched off to expose a surface of the node electrode 36. The thirteenth via V13 is configured such that the second electrode of the first transistor T1 and the first electrode of the second transistor T2 that are to be formed subsequently are connected to the node electrode 36 through the via.

As shown in FIG. 20b, in a plane perpendicular to the base substrate, the first insulating layer 91 is arranged on the base substrate 10. The semiconductor layer is arranged on the first insulating layer 91. The second insulating layer 92 covers the first semiconductor layer. The first conductive layer is arranged on the second insulating layer 92. The third insulating layer 93 covers the first conductive layer. The second conductive layer is arranged on the third insulating layer 93. The fourth insulating layer 94 covers the second conductive layer. The second semiconductor layer is arranged on the fourth insulating layer 94. The fifth insulating layer 95 is arranged on the second semiconductor layer. The third conductive layer is arranged on the fifth insulating layer 95. The sixth insulating layer 96 covers the third conductive layer. The sixth insulating layer 96 is provided with multiple vias, wherein the multiple vias at least include the fourth via V4 and the sixth via V6. The sixth insulating layer 94, the fourth insulating layer 94, the third insulating layer 93, and the second insulating layer 92 in the fourth via V4 and the sixth via V6 are etched off to respectively expose surfaces of two ends of the sixth active layer.

Figure 21A:
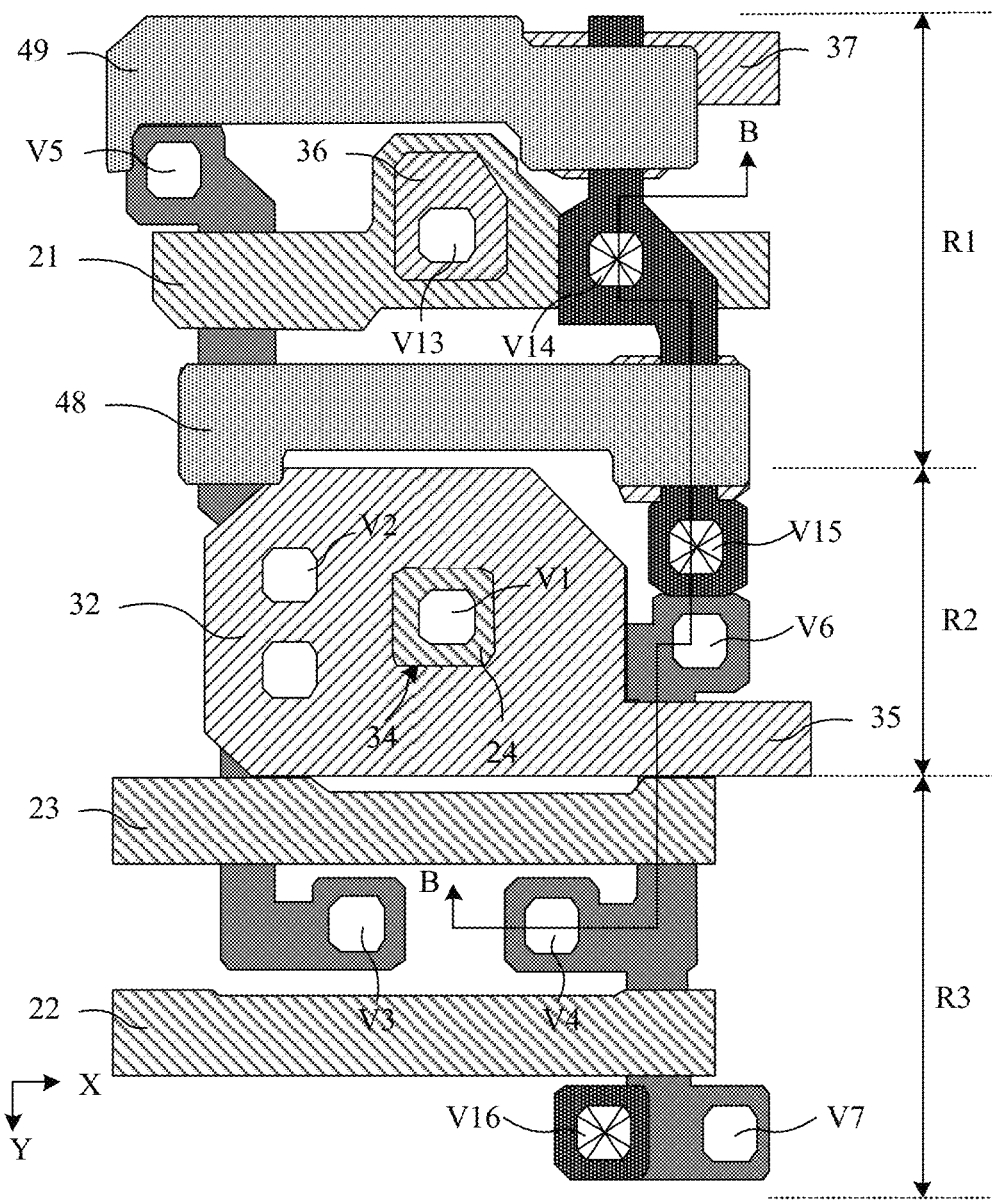
FIG. 21a is a schematic diagram after a pattern of oxide vias of another display substrate is formed according to the present disclosure.

(26) A pattern of oxide vias is formed. In an exemplary embodiment, the operation that the pattern of the oxide vias is formed may include: multiple vias are formed by a patterning process on the base substrate on which the foregoing patterns are formed. The multiple vias at least include: a fourteenth via V14, a fifteenth via V15, and a sixteenth via V16, as shown in FIG. 21a and FIG. 21b, and FIG. 21b is a sectional view along direction B-B in FIG. 21a.

In an exemplary embodiment, the fourteenth via V14 is located in the first region R1, and the sixth insulating layer in the fourteenth via V14 is etched off to expose a surface of the first region of the second active layer (i.e., the second region of the first active layer). The fifteenth via V15 is located in the second region R2, and the sixth insulating layer in the fifteenth via V15 is etched off to expose a surface of the second region of the second active layer. The sixteenth via V16 is located in the third region R3, and the sixth insulating layer in the sixteenth via V16 is etched off to expose a surface of the first region of the first active layer.

Figure 21B:
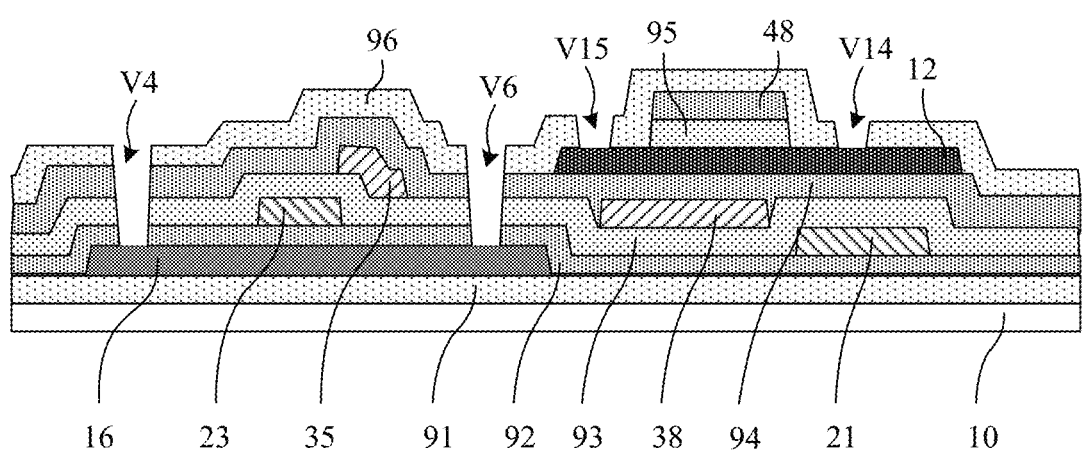

As shown in FIG. 21b, in a plane perpendicular to the base substrate, the first insulating layer 91 is arranged on the base substrate 10. The semiconductor layer is arranged on the first insulating layer 91. The second insulating layer 92 covers the first semiconductor layer. The first conductive layer is arranged on the second insulating layer 92. The third insulating layer 93 covers the first conductive layer. The second conductive layer is arranged on the third insulating layer 93. The fourth insulating layer 94 covers the second conductive layer. The second semiconductor layer is arranged on the fourth insulating layer 94. The fifth insulating layer 95 is arranged on the second semiconductor layer. The third conductive layer is arranged on the fifth insulating layer 95. The sixth insulating layer 96 covers the third conductive layer. The sixth insulating layer 96 is provided with multiple vias, wherein the multiple vias at least include the fourth via V4, the sixth via V6, the fourteenth via V14 and the fifteenth via V15. The sixth insulating layer 94, the fourth insulating layer 94, the third insulating layer 93, and the second insulating layer 92 in the fourth via V4 and the sixth via V6 are etched off to respectively expose surfaces of two ends of the sixth active layer. The sixth insulating layer 94 in the fourteenth via V14 and the fifteenth via V15 is etched off to respectively expose surfaces of two ends of the second active layer.

Figure 22A:
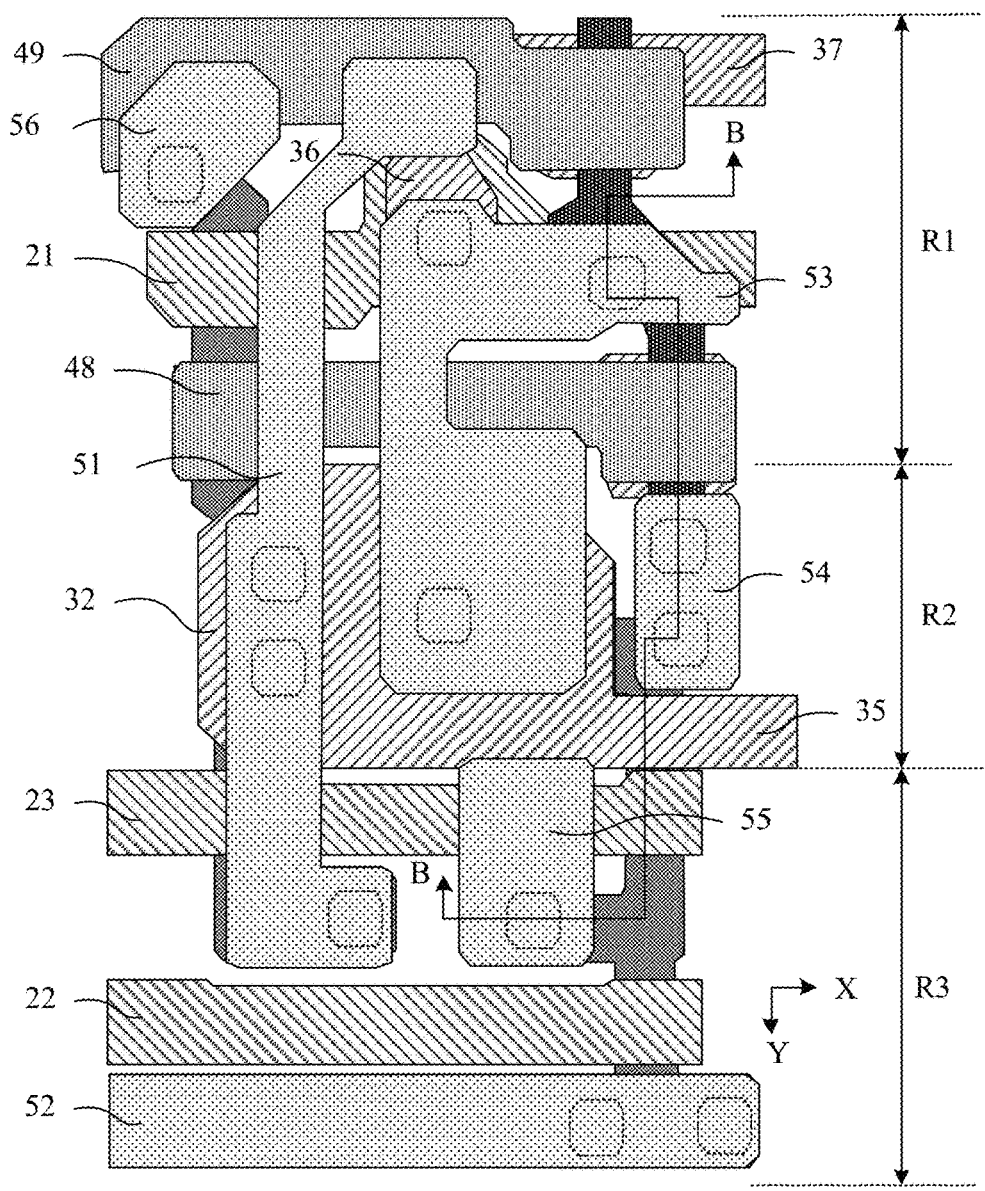
FIG. 22a is a schematic diagram after a pattern of a fourth conductive layer of another display substrate is formed according to the present disclosure.
Figure 22B:
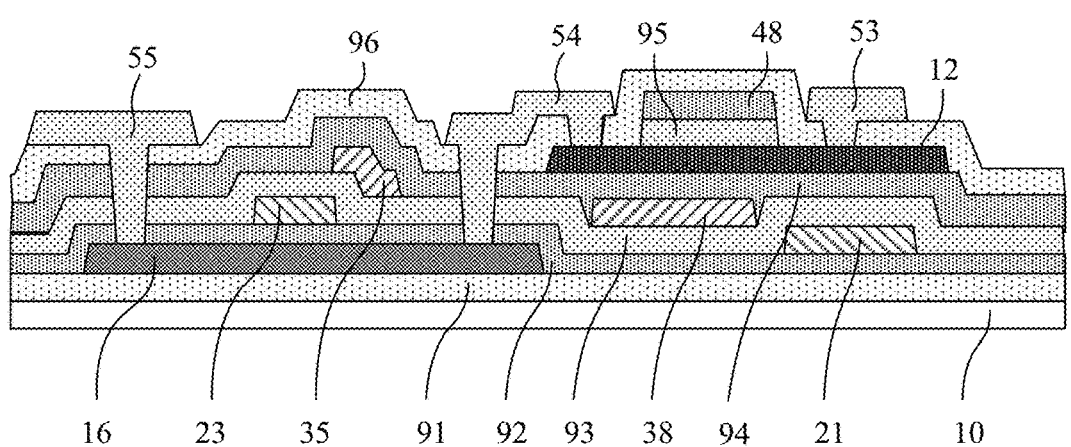

(27) A pattern of a fourth conductive layer is formed. In an exemplary embodiment, the operation that the pattern of the fourth conductive layer is formed may include: a fourth insulating thin film is deposited on the base substrate on which the above-mentioned patterns are formed, and the fourth metal thin film is patterned through a patterning process to form a fourth conductive layer arranged on the sixth insulating layer. The fourth conductive layer at least includes: a power supply connection line 51, an initial signal line 52, a fifth connection electrode 53, a sixth connection electrode 54, a seventh connection electrode 55, and an eighth connection electrode 56, as shown in FIG. 22a and FIG. 22b, and FIG. 22b is a sectional view along direction B-B in FIG. 22a. In an exemplary embodiment, the fourth conductive layer may be called a first metal source-drain layer (SD1).

As shown in FIG. 22a, in an exemplary embodiment, the broken-line-shaped power supply connection line 51 generally extends in the second direction Y, and the power supply connection line 51 is connected to the second plate 32 through the second via V2 on the one hand, and on the other hand, it is connected to the fifth active layer through the third via V3. The power supply connection line 51 is configured to be connected to the first power supply line to be formed subsequently.

In an exemplary embodiment, the initial signal line 52 extends in the first direction X and is arranged in the third region R3. On the one hand, the initial signal line 52 is connected to the first region of the seventh active layer through the seventh via V7. On the other hand, the initial signal line 52 is connected to the first region of the first active layer through the sixteenth via V16, so that the first electrode of the seventh transistor T7 and the first electrode of the first transistor T1 have a same potential as the initial signal line 52.

In an exemplary embodiment, the fifth connection electrode 53 may have a shape of a "C", and has a first end connected to the first plate 24 through the first via V1, and a second end connected to the first region of the second active layer (i.e., the second region of the first active layer) through the fourteenth via V14. A region between the first end and the second end of the fifth connection electrode is connected to the node electrode 36 through the thirteenth via V13, so that the first plate 24, the second electrode of the first transistor T1, the first electrode of the second transistor T2, and the node electrode 36 have a same potential. In an exemplary embodiment, the fifth connection electrode 53 may be used as the second electrode of the first transistor T1 and the first electrode of the second transistor T2.

In an exemplary embodiment, the sixth connection electrode 54 may be in the shape of a rectangle. On the one hand, the sixth connection electrode 54 is connected to the first region of the sixth active layer (i.e., the second region of the third active layer) through the sixth via V6. On the other hand, the sixth connection electrode 54 is connected to the second region of the second active layer through the fifteenth via V15, so that the second electrode of the second transistor T2, the second electrode of the third transistor T3 and the first electrode of the sixth transistor have a same potential. In an exemplary embodiment, the sixth connection electrode 54 may be used as the second electrode of the third transistor T3 and the second electrode of the second transistor T2.

In an exemplary embodiment, the seventh connection electrode 55 may be in the shape of a rectangle, and the seventh connection electrode 55 is connected to the second region of the sixth active layer (i.e., the second region of the seventh active layer) through the fourth via V4, so that the second electrode of the sixth transistor T6 and the second electrode of the seventh transistor T7 have a same potential. In an exemplary embodiment, the seventh connection electrode 55 may be used as the second electrode of the sixth transistor T6 and the second electrode of the seventh transistor T7. In an exemplary embodiment, the seventh connection electrode 55 is configured to be connected to an anode connection electrode to be formed subsequently.

In an exemplary embodiment, the eighth connection electrode 56 is connected to the first region of the fourth active layer through the fifth via V5. In an exemplary embodiment, the eighth connection electrode 56 is configured to be connected to the data signal line to be subsequently formed, so that a data signal transmitted by the data signal line is written into the fourth transistor T4.

As shown in FIG. 22b, in a plane perpendicular to the base substrate, the first insulating layer 91 is arranged on the base substrate 10. The semiconductor layer is arranged on the first insulating layer 91. The second insulating layer 92 covers the first semiconductor layer. The first conductive layer is arranged on the second insulating layer 92. The third insulating layer 93 covers the first conductive layer. The second conductive layer is arranged on the third insulating layer 93. The fourth insulating layer 94 covers the second conductive layer. The second semiconductor layer is arranged on the fourth insulating layer 94. The fifth insulating layer 95 is arranged on the second semiconductor layer. The third conductive layer is arranged on the fifth insulating layer 95. The sixth insulating layer 96 covers the third conductive layer, and the sixth insulating layer 96 is provided with multiple vias. The fourth conductive layer is arranged on the sixth insulating layer 96, and the fourth conductive layer includes at least the fifth connection electrode 53, the sixth connection electrode 54 and the seventh connection electrode 55. The seventh connection electrode 55 is connected to one end of the sixth active layer through the fourth via V4. On the one hand, the sixth connection electrode 54 is connected to the other end of the sixth active layer through the sixth via V6, and on the one hand, the sixth connection electrode 54 is connected to one end of the second active layer through the fifth via V15. The fifth connection electrode 53 is connected to the other end of the second active layer through the fourteenth via V14.

(28) Patterns of a seventh insulating layer and a first planarization layer are formed. In an exemplary embodiment, the operation that the patterns of the seventh insulating layer and the first planarization layer are formed may include: a seventh insulating thin film is deposited first on the base substrate on which the foregoing patterns are formed, and then a first planarization thin film is coated, the seventh insulating thin film and the first planarization thin film are patterned through a patterning process to form a seventh insulating layer covering the fourth conductive layer and a first planarization layer covering the seventh insulating layer. The seventh insulating layer and the first planarization layer are provided with multiple vias, wherein the multiple vias at least include a twentieth via V20, a twenty-first via V21 and a twenty-second via V22, as shown in FIG. 23a and FIG. 23b, and FIG. 23b is a sectional view along direction B-B in FIG. 23a.

Figure 23A:
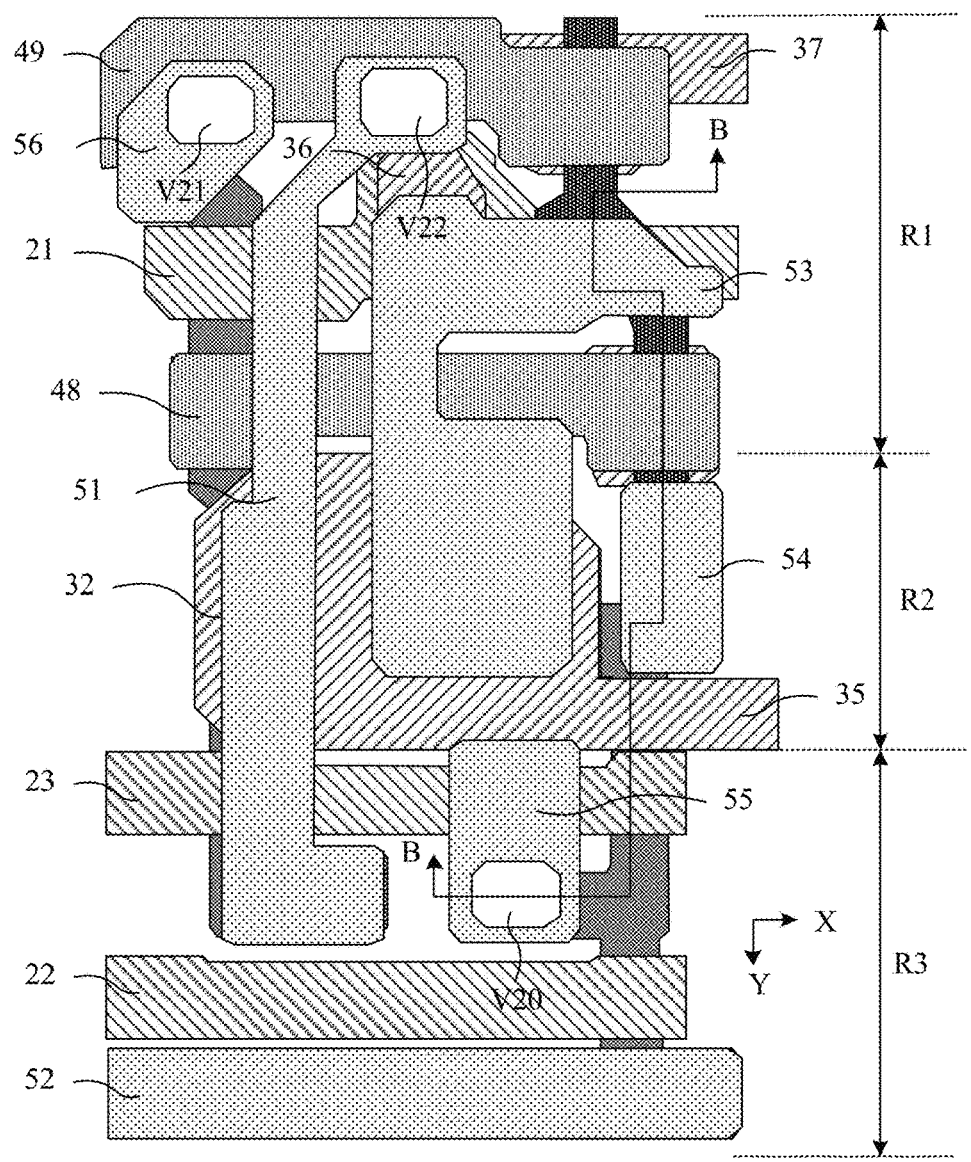
FIG. 23a is a schematic diagram after a pattern of a first planarization layer of another display substrate is formed according to the present disclosure.

As shown in FIG. 23a, the twentieth via V20 is located in a region where the seventh connection electrode 55 is located. The first planarization layer and the seventh insulating layer in the twentieth via V20 are removed to expose a surface of the seventh connection electrode 55. The twentieth via V20 is configured such that the anode connection electrode to be formed subsequently is connected to the seventh connection electrode 55 through the via. The twenty-first via V21 is located in a region where the eighth connection electrode 56 is located. The first planarization layer and the seventh insulating layer in the twenty-first via V21 are removed to expose a surface of the eighth connection electrode 56. The twenty-first via V21 is configured such that the data signal line to be formed subsequently is connected to the eighth connection electrode 56 through the via. The twenty-second via V22 is located in a region where the power supply connection line 51 is located. The first planarization layer and the seventh insulating layer in the twenty-second via V22 are removed to expose a surface of the power supply connection line 51. The twenty-second via V22 is configured such that the first power supply line to be formed subsequently is connected to the power supply connection line 51 through the via.

Figure 23B:
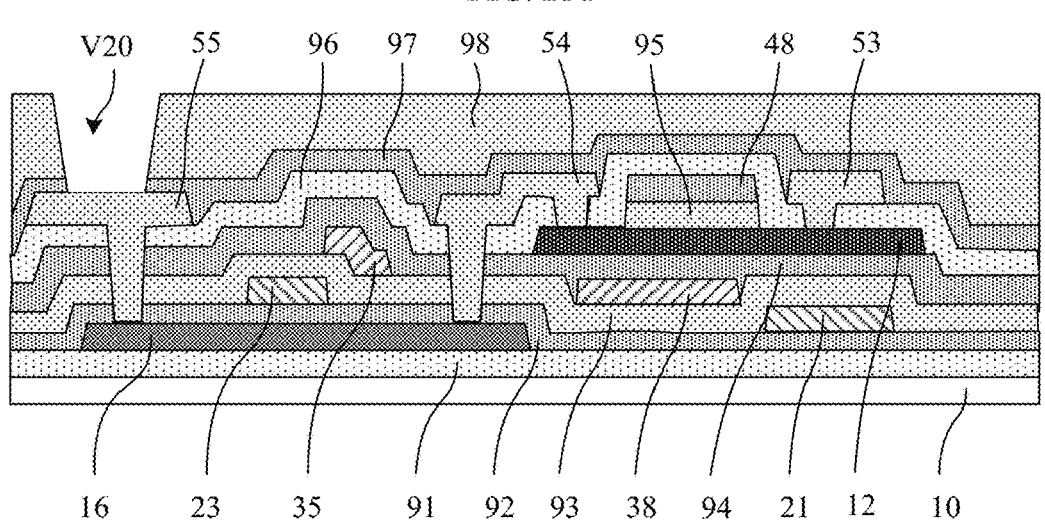

As shown in FIG. 23b, in a plane perpendicular to the base substrate, the first insulating layer 91 is arranged on the base substrate 10. The semiconductor layer is arranged on the first insulating layer 91. The second insulating layer 92 covers the first semiconductor layer. The first semiconductor layer is arranged on the second insulating layer 92. The third insulating layer 93 covers the first conductive layer. The second conductive layer is arranged on the third insulating layer 93. the fourth insulating layer 94 covers the second conductive layer. The second semiconductor layer is arranged on the fourth insulating layer 94. The fifth insulating layer 95 is arranged on the second semiconductor layer. The third conductive layer is arranged on the fifth insulating layer 95. The sixth insulating layer 96 covers the third conductive layer. The fourth conductive layer is arranged on the sixth insulating layer 96. The seventh insulating layer 97 and the first planarization layer 98 cover the fourth conductive layer, and the seventh insulating layer 97 and the first planarization layer 98 are provided with multiple vias. The multiple vias at least include the twentieth via V20. The first planarization layer 98 and the seventh insulating layer 97 in the twentieth via V20 are removed to expose a surface of the seventh connection electrode 55.

Figure 24A:
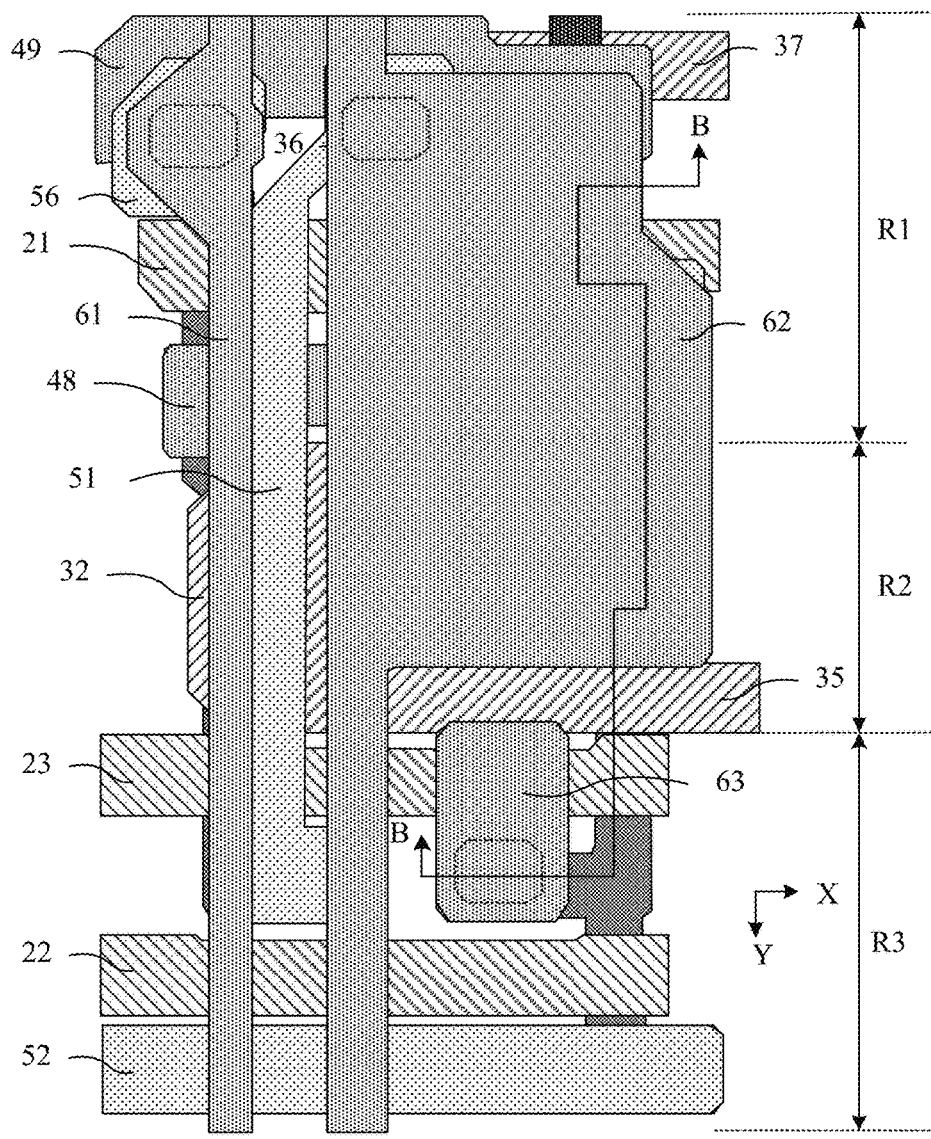
FIG. 24a is a schematic diagram after a pattern of a fifth conductive layer of another display substrate is formed according to the present disclosure.
Figure 24B:
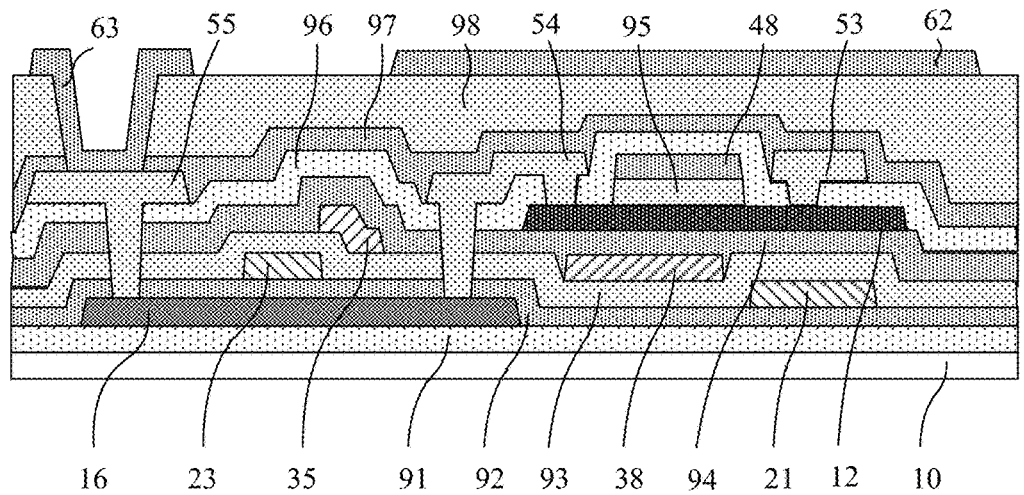

(29) A pattern of a fifth conductive layer is formed. In an exemplary embodiment, the operation that the fifth conductive layer is formed may include: a fifth metal thin film is deposited on the base substrate on which the above-mentioned patterns are formed, and the fifth metal thin film is patterned through a patterning process to form a fifth insulating layer arranged on the first planarization layer. The fifth conductive layer at least includes: a data signal line 61, a first power supply line 62 and an anode connection electrode 63, as shown in FIG. 24a and FIG. 24b, and FIG. 24b is a sectional view along direction B-B in FIG. 24a. In an exemplary embodiment, the fifth conductive layer may be called a second metal source-drain layer (SD2).

As shown in FIG. 24a, the data signal line 61 extends in the second direction Y, and the data signal line 61 is connected to the eighth connection electrode 56 through the twenty-first via V21. Since the eighth connection electrode 56 is connected to the first region of the fourth active layer through the fifth via, the data signal line 61 is connected to the first electrode of the fourth transistor T4, so that a data signal transmitted by the data signal line is written into the fourth transistor T4. The first power supply line 62 generally extends in the second direction Y, and is connected to the power supply connection line 51 through the twenty-second via V22 so that the power supply connection line 51 has a same potential as the first power supply line 62. In the first region R1 and the second region R2, the first power supply line 62 may be rectangular, so that the first power supply line 62 can effectively shield a critical node of the pixel driving circuit, avoiding the impact on the potential of the critical node of the pixel driving circuit, and improving the display effect. The anode connection electrode 63 may be rectangular, the anode connection electrode 63 is connected to the seventh connection electrode 55 through the twentieth via V20, and the anode connection electrode 63 is configured to be connected to an anode to be formed subsequently.

As shown in FIG. 24b, in a plane perpendicular to the base substrate, the first insulating layer 91 is arranged on the base substrate 10. The semiconductor layer is arranged on the first insulating layer 91. The second insulating layer 92 covers the first semiconductor layer. The first conductive layer is arranged on the second insulating layer 92. The third insulating layer 93 covers the first conductive layer. The second conductive layer is arranged on the third insulating layer 93. The fourth insulating layer 94 covers the second conductive layer. The second semiconductor layer is arranged on the fourth insulating layer 94. The fifth insulating layer 95 is arranged on the second semiconductor layer. The third conductive layer is arranged on the fifth insulating layer 95. The sixth insulating layer 96 covers the third conductive layer. The fourth conductive layer is arranged on the sixth insulating layer 96, and the seventh insulating layer 97 and the first planarization layer 98 cover the fourth conductive layer. The fifth conductive layer is arranged on the first planarization layer 98, and the fifth conductive layer at least includes the anode connection electrode 63. The anode connection electrode 63 is connected to the seventh connection electrode 55 through the twentieth via V20.

Figure 25:
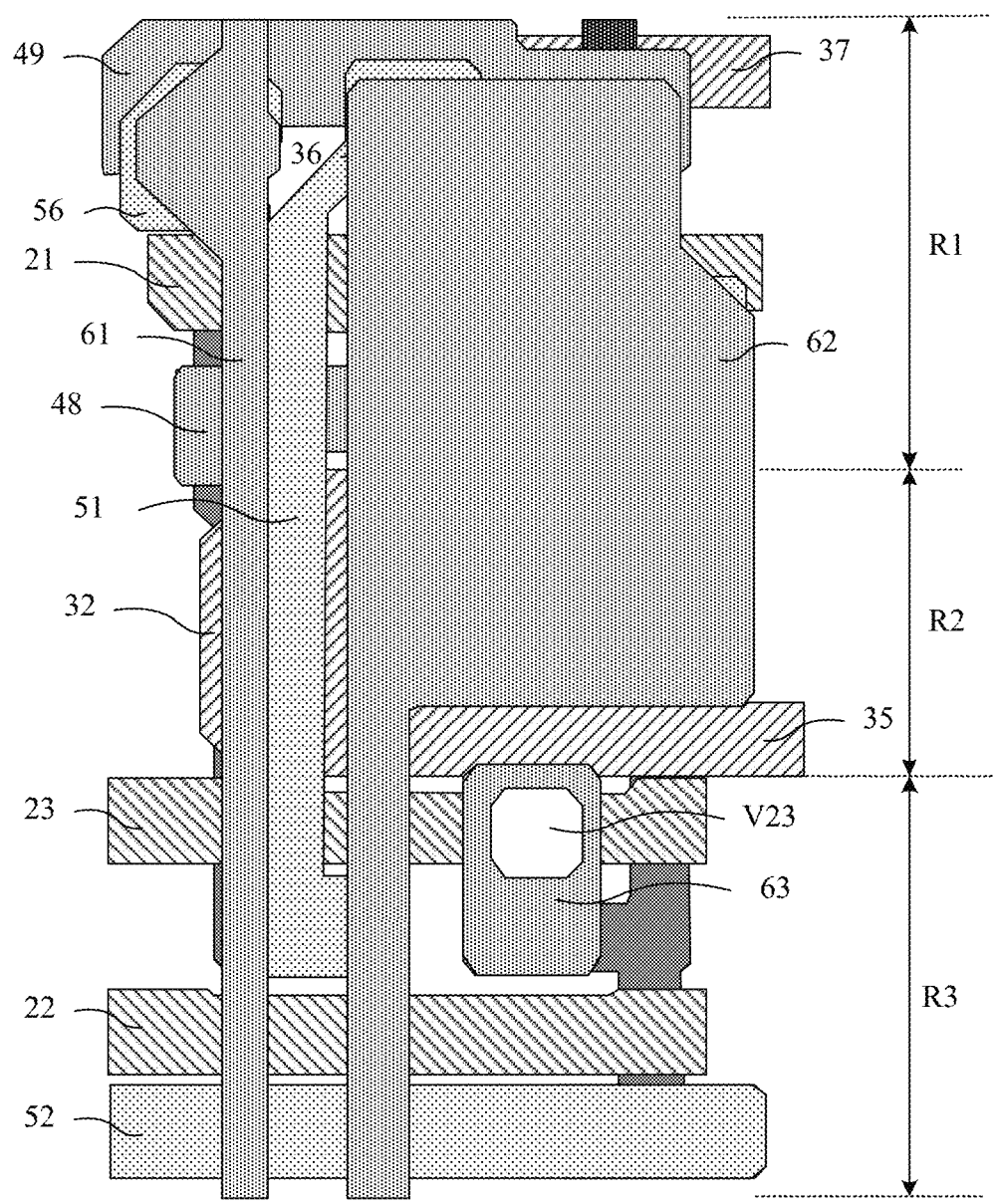
FIG. 25 is a schematic diagram after a pattern of a second planarization layer of another display substrate is formed according to the present disclosure.

(30) A pattern of a second planarization layer is formed. In an exemplary embodiment, the operation that the pattern of the second planarization layer is formed may include: the base substrate on which the foregoing patterns are formed is coated with a second planarization thin film, and the second planarization thin film is patterned through a patterning process to form a second planarization layer that covers the fifth conductive layer. The second planarization layer is at least provided with a twenty-third via V23, as shown in FIG. 25.

In an exemplary embodiment, the twenty-third via V23 is located in a region where the anode connection electrode 63 is located. The second planarization layer in the twenty-third via V23 is removed to expose a surface of the anode connection electrode 63. The twenty-third via V23 is configured such that the anode to be formed subsequently is connected to the anode connection electrode 63 through the via.

Figure 26:
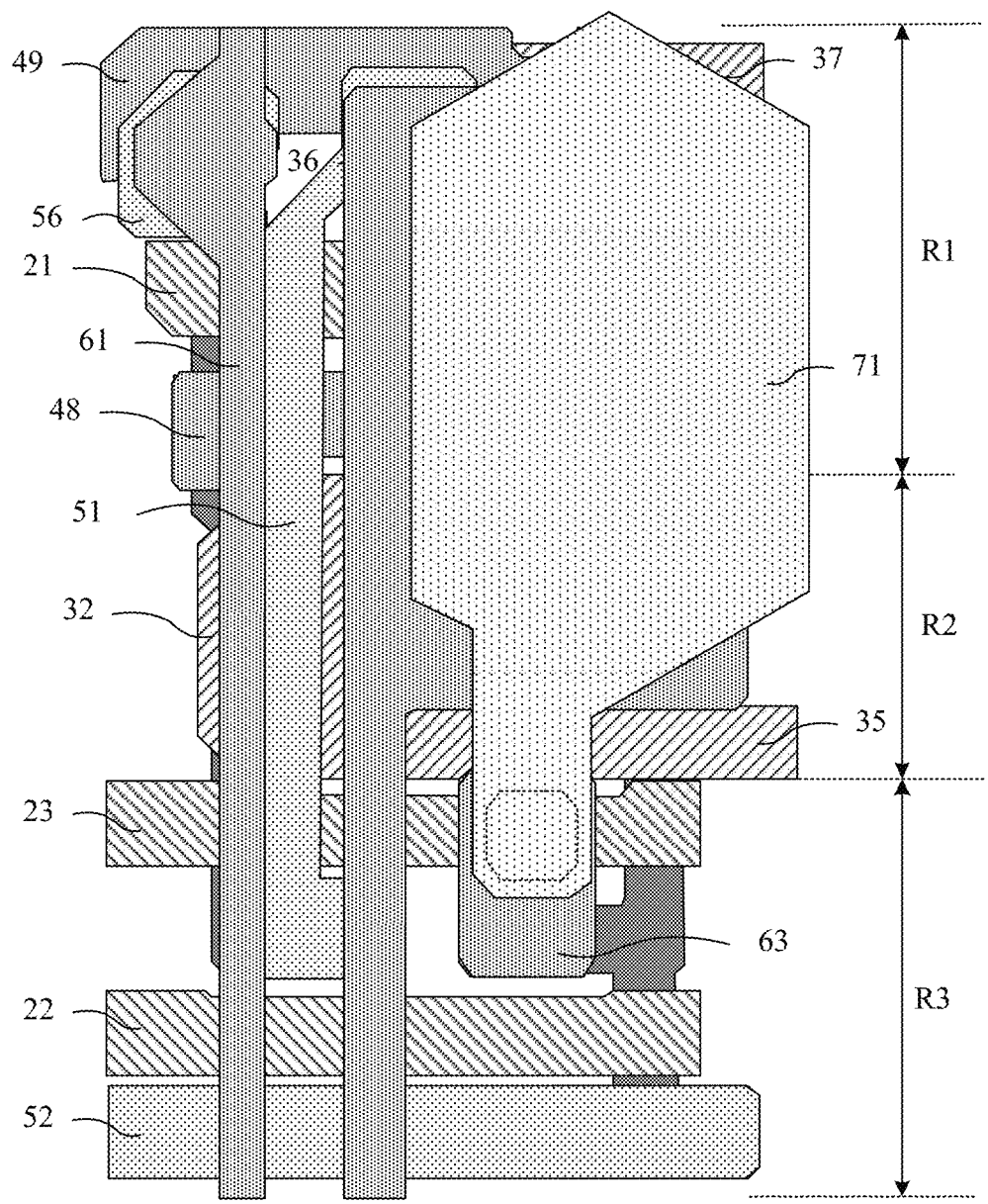
FIG. 26 is a schematic diagram after a pattern of an anode of another display substrate is formed according to the present disclosure.

(31) A pattern of the anode is formed. In an exemplary embodiment, the operation that the pattern of the anode is formed may include: a transparent conductive thin film is deposited on the base substrate on which the foregoing patterns are formed, and the transparent conductive thin film is patterned through a patterning process to form an anode 71 arranged on the second planarization layer, as shown in FIG. 26.

In an exemplary embodiment, the anode 71 is hexagonal, and the anode 71 is connected to the anode connection electrode 63 through the twenty-third via V23. The anode connection electrode 63 is connected to the seventh connection electrode 55 through the twentieth via, and the seventh connection electrode 55 is connected to the sixth active layer through the fourth via, so that the pixel driving circuit can drive the light emitting device to emit light.

In an exemplary embodiment, a subsequent preparation process may include: a pixel definition thin film is coated, and the pixel definition thin film is patterned through a patterning process to form a pixel definition layer. The pixel definition layer of each sub-pixel is provided with a pixel opening, and the anode is exposed by the opening. The organic light-emitting layer is formed by an evaporation or inkjet printing process, and the cathode is formed on the organic light-emitting layer. An encapsulation layer is formed. The encapsulation layer may include a first encapsulation layer, a second encapsulation layer, and a third encapsulation layer that are stacked. The first encapsulation layer and the third encapsulation layer may be made of an inorganic material. The second encapsulation layer may be made of an organic material. The second encapsulation layer is arranged between the first encapsulation layer and the third encapsulation layer so that it can be ensured that external water vapor cannot enter the light emitting structure layer.

The foregoing structure of the display substrate and its preparation process in the present disclosure are only exemplary description. In an exemplary implementation mode, variation of corresponding structures and addition or reduction of the patterning process may be performed as practically required. The display substrate in the present disclosure may be applied to other display apparatuses having pixel driving circuits, such as a quantum dot display. No limits are made thereto in the present disclosure.

It can be seen from the structure and preparation process of the display substrate described above, in the display substrate provided in the present disclosure, the drain terminal segment of the channel in the third transistor is in a fan shape, which expands the area of one end of the channel close to the drain electrode and may allow a drain field to be dispersed under a same drain-bias voltage, so that a transverse electric field is reduced, a depletion region of the drain electrode is shortened in the channel direction, thereby overcoming the problem of unsaturated output of the thin film transistor caused by shortening of the channel and flattening output characteristics of the thin film transistor. According to the exemplary embodiment of the present disclosure, the short-channel transistor with the flatted output characteristics can not only save space and facilitate high-resolution display, and moreover, the channel is shortened and a threshold voltage of the drive transistor is reduced, so that reduction of power consumption is facilitated. The preparation process in the present disclosure may be compatible well with an existing preparation process, which is simple in process implementation, easy to implement, high in production efficiency and yield, and low in production cost.

The present disclosure further provides a method for preparing a display substrate, for preparing the display substrate according to the foregoing embodiments.

In an exemplary embodiment, in a plane parallel to the display substrate, the display substrate includes multiple sub-pixels, at least one sub-pixel includes a pixel driving circuit, and the pixel driving circuit at least includes a drive transistor. The preparation method may include the following operations.

A semiconductor layer or a first semiconductor layer is formed on a base substrate; the semiconductor layer or the first semiconductor layer at least includes an active layer of the drive transistor, the active layer of the drive transistor includes a channel region, the channel region includes a drain terminal segment extending in a first direction, a source terminal segment extending in the first direction, and an intermediate segment located between the source terminal segment and the source terminal segment; a first end of the drain terminal segment away from the intermediate segment has a first width, and a second end of the drain terminal segment close to the intermediate segment has a second width; the first width is greater than the second width; the first width and the second width are dimensions of the drain terminal segment in a second direction, and the first direction is intersected with the second direction.

In an exemplary embodiment, the active layer of the drive transistor further includes a first region connected to the drain terminal segment and a second region connected to the source terminal segment, one end of the first region is connected to the first end of the drain terminal segment, and the other end of the first region is connected to a transistor that receives a data signal; in the plane parallel to the display substrate, a shape of the source terminal segment includes a rectangle.

In an exemplary embodiment, in a plane parallel to the display substrate, a shape of the drain terminal segment includes a trapezoid, the trapezoid includes a lower base and an upper base of the trapezoid, the first end of the drain terminal segment is the lower base of the trapezoid and has the first width, and the second end of the drain terminal segment is the upper base of the trapezoid and has the second width.

In an exemplary embodiment, in a plane parallel to the display substrate, the shape of the drain terminal segment includes a combination of a trapezoid and a rectangle, wherein the trapezoid includes a lower base and an upper base of the trapezoid, and the rectangle includes a lower edge and an upper edge of the trapezoid; the first end of the drain terminal segment is the lower base of the trapezoid and has a first width, the upper base of the trapezoid is connected to the lower edge of the rectangle and has a second width, and the second end of the drain terminal segment is the upper edge of the rectangle.

In an exemplary embodiment, in a plane parallel to the display substrate, a shape of the drain terminal segment includes a combination of a rectangle and a trapezoid, the rectangle includes a lower edge and an upper edge of the rectangle, and the trapezoid includes a lower base and an upper base of the trapezoid; the first end of the drain terminal segment is the lower edge of the rectangle, the upper edge of the rectangle is connected to the lower base of the trapezoid and has a first width, and the second end of the drain terminal segment is the upper base of the trapezoid and has a second width.

In an exemplary embodiment, in a plane parallel to display substrate, the shape of the drain terminal segment includes a combination of a first trapezoid and a second trapezoid, the first trapezoid includes a lower base and an upper base of the first trapezoid, and the second trapezoid includes a lower base and an upper base of the second trapezoid; the first end of the drain terminal segment is the lower base of the first trapezoid and has a first width, the upper base of the first trapezoid is connected to the lower base of the second trapezoid, and the second end of the drain terminal segment is the upper base of the second trapezoid and has a second width.

In an exemplary embodiment, a ratio of the first width to the second width is 1.5 to 5.

In an exemplary embodiment, an included angle between a side of the trapezoid and the first direction is 20° to 60°.

In an exemplary embodiment, in a plane perpendicular to the display substrate, the display substrate includes a semiconductor layer, a first conductive layer, a second conductive layer, and a third conductive layer that are sequentially arranged on a base substrate; the semiconductor layer includes active layers of multiple poly-silicon transistors, the first conductive layer includes gate electrodes of the multiple poly-silicon transistors and a first plate of a storage capacitor, the second conductive layer includes a second plate of the storage capacitor, and the third conductive layer includes a first power supply line, a data signal line, and first electrodes and second electrodes of the multiple poly-silicon transistors.

In an exemplary embodiment, in a plane perpendicular to the display substrate, the display substrate includes a first semiconductor layer, a first conductive layer, a second conductive layer, a second semiconductor layer, a third conductive layer, a fourth conductive layer, and a fifth conductive layer that are sequentially arranged on a base substrate; the first semiconductor layer includes active layers of multiple poly-silicon transistors, the first conductive layer includes gate electrodes of the multiple poly-silicon transistors and a first plate of a storage capacitor, the second conductive layer includes a second plate of the storage capacitor, the second semiconductor layer includes active layers of multiple oxide transistors, the third conductive layer includes gate electrodes of the multiple oxide transistors, the fourth conductive layer includes first electrodes and second electrodes of the multiple poly-silicon transistors, and first electrodes and second electrodes of the multiple oxide transistors, and the fifth conductive layer includes a first power supply line and a data signal line.

In an exemplary embodiment, the intermediate segment of the channel region includes a second channel segment, a third channel segment, and a fourth channel segment; the second end of the drain terminal segment is connected to a first end of the second channel segment; a second end of the second channel segment extends in a direction opposite to the second direction, to be connected to a first end of the third channel segment; a second end of the third channel segment extends in the first direction, to be connected to a first end of the fourth channel segment; a second end of the fourth channel segment extends in a second direction, to be connected to a first end of the source terminal segment; and a second end of the source terminal segment is connected to the second region of the active layer.

The present disclosure further provides a display apparatus, which includes the abovementioned display substrate. The display apparatus may be any product or component having a display function, such as a cellphone, a tablet computer, a television, a display, a laptop, a digital photo frame, and a navigator. No limits are made thereto in the embodiments of the disclosure.

Although the implementation modes of the present disclosure are disclosed above, the contents are only implementation modes used for ease of understanding of the present disclosure and not intended to limit the disclosure. Those skilled in the art may make any modification and variation to forms and details of implementations without departing from the spirit and scope disclosed by the present disclosure. However, the patent protection scope of the disclosure should still be subject to the scope defined by the appended claims.

The invention claimed is:

1. A display substrate, comprising a plurality of sub-pixels in a plane parallel to the display substrate, wherein at least one of the sub-pixels comprises a pixel driving circuit, the pixel driving circuit at least comprises a drive transistor; an active layer of the drive transistor comprises a channel region, the channel region comprises a first channel terminal segment extending in a first direction, an intermediate segment connected to the first channel terminal segment, and a second channel terminal segment connected to the intermediate segment; a first end of the first channel terminal segment away from the intermediate segment has a first width, and a second end of the first channel terminal segment close to the intermediate segment has a second width; the first width is greater than the second width; the first width and the second width are dimensions of the first channel terminal segment in a second direction, and the first direction is intersected with the second direction,
wherein the intermediate segment of the channel region comprises a second channel segment, a third channel segment, and a fourth channel segment; the second end of the first channel terminal segment is connected to a first end of the second channel segment; a second end of the second channel segment extends in a direction opposite to the second direction, to be connected to a first end of the third channel segment; a second end of the third channel segment extends in the first direction, to be connected to a first end of the fourth channel segment; a second end of the fourth channel segment extends in the second direction, to be connected to a first end of the second channel terminal segment; and a second end of the second channel terminal segment is connected to the second region of the active layer.

2. The display substrate according to claim 1, wherein the active layer of the drive transistor further comprises a first region connected to the first channel terminal segment and a second region connected to the second channel terminal segment, one end of the first region is connected to the first end of the first channel terminal segment, and the other end of the first region is connected to a transistor that receives a data signal; in the plane parallel to the display substrate, a shape of the second channel terminal segment comprises a rectangle.

3. The display substrate according to claim 2, wherein a ratio of the first width to the second width is 1.5 to 5.

4. The display substrate according to claim 1, wherein in the plane parallel to the display substrate, a shape of the first channel terminal segment comprises a trapezoid, the trapezoid comprises a lower base and an upper base of the trapezoid, the first end of the first channel terminal segment is the lower base of the trapezoid and has the first width, and the second end of the first channel terminal segment is the upper base of the trapezoid and has the second width.

5. The display substrate according to claim 4, wherein an angle between at least one side of the trapezoid and the first direction is greater than 0° and less than 90°.

6. The display substrate according to claim 4, wherein a ratio of the first width to the second width is 1.5 to 5.

7. The display substrate according to claim 1, wherein in the plane parallel to the display substrate, a shape of the first channel terminal segment comprises a combination of a trapezoid and a rectangle, the trapezoid comprises a lower base and an upper base of the trapezoid, and the rectangle comprises a lower edge and an upper edge of the rectangle; the first end of the first channel terminal segment is the lower base of the trapezoid and has the first width, the upper base of the trapezoid is connected to the lower edge of the rectangle and has the second width, and the second end of the first channel terminal segment is the upper edge of the rectangle.

8. The display substrate according to claim 7, wherein a ratio of the first width to the second width is 1.5 to 5.

9. The display substrate according to claim 7, wherein an angle between at least one side of the trapezoid and the first direction is greater than 0° and less than 90°.

10. The display substrate according to claim 1, wherein in the plane parallel to the display substrate, a shape of the first channel terminal segment comprises a combination of a rectangle and a trapezoid, the rectangle comprises a lower edge and an upper edge of the rectangle, and the trapezoid comprises a lower base and an upper base of the trapezoid; the first end of the first channel terminal segment is the lower edge of the rectangle, the upper edge of the rectangle is connected to the lower base of the trapezoid and has the first width, and the second end of the first channel terminal segment is the upper base of the trapezoid and has the second width.

11. The display substrate according to claim 10, wherein a ratio of the first width to the second width is 1.5 to 5.

12. The display substrate according to claim 10, wherein an angle between at least one side of the trapezoid and the first direction is greater than 0° and less than 90°.

13. The display substrate according to claim 1, wherein in the plane parallel to display substrate, the shape of the first channel terminal segment comprises a combination of a first trapezoid and a second trapezoid, the first trapezoid comprises a lower base and an upper base of the first trapezoid, and the second trapezoid comprises a lower base and an upper base of the second trapezoid; the first end of the first channel terminal segment is the lower base of the first trapezoid and has the first width, the upper base of the first trapezoid is connected to the lower base of the second trapezoid, and the second end of the first channel terminal segment is the upper base of the second trapezoid and has the second width.

14. The display substrate according to claim 13, wherein a ratio of the first width to the second width is 1.5 to 5.

15. The display substrate according to claim 1, wherein a ratio of the first width to the second width is 1.5 to 5.

16. The display substrate according to claim 1, wherein in a plane perpendicular to the display substrate, the display substrate comprises a semiconductor layer, a first conductive layer, a second conductive layer, and a third conductive layer that are sequentially arranged on a base substrate; the semiconductor layer comprises active layers of a plurality of poly-silicon transistors, the first conductive layer comprises gate electrodes of the plurality of poly-silicon transistors and a first plate of a storage capacitor, the second conductive layer comprises a second plate of the storage capacitor, and the third conductive layer comprises a first power supply line, a data signal line, and first electrodes and second electrodes of the plurality of poly-silicon transistors.

17. The display substrate according to claim 1, wherein in a plane perpendicular to the display substrate, the display substrate comprises a first semiconductor layer, a first conductive layer, a second conductive layer, a second semiconductor layer, a third conductive layer, a fourth conductive layer, and a fifth conductive layer that are sequentially arranged on a base substrate; the first semiconductor layer comprises active layers of a plurality of poly-silicon transistors, the first conductive layer comprises gate electrodes of the plurality of poly-silicon transistors and a first plate of a storage capacitor, the second conductive layer comprises a second plate of the storage capacitor, the second semiconductor layer comprises active layers of a plurality of oxide transistors, the third conductive layer comprises gate electrodes of the plurality of oxide transistors, the fourth conductive layer comprises first electrodes and second electrodes of the plurality of poly-silicon transistors, and comprises first electrodes and second electrodes of the plurality of oxide transistors, and the fifth conductive layer comprises a first power supply line and a data signal line.

18. A display apparatus, comprising the display substrate according to claim 1.

19. A method for preparing a display substrate, wherein the display substrate comprising a plurality of sub-pixels in the plane parallel to the display substrate, at least one sub-pixel comprises a pixel driving circuit, and the pixel driving circuit at least comprises a drive transistor, and the method comprises:

forming a semiconductor layer or a first semiconductor layer on a base substrate, wherein the semiconductor layer or the first semiconductor layer at least comprises an active layer of the drive transistor, the active layer of the drive transistor comprises a channel region, the channel region comprises a first channel terminal segment extending in a first direction, an intermediate segment connected to the first channel terminal segment, and a second channel terminal segment connected to the intermediate segment; a first end of the first channel terminal segment away from the intermediate segment, has a first width, and a second end of the first channel terminal segment close to the intermediate segment has a second width; the first width is greater than the second width; the first width and the second width are dimensions of the first channel terminal segment in a second direction, and the first direction is intersected with the second direction, wherein the intermediate segment of the channel region comprises a second channel segment, a third channel segment, and a fourth channel segment; the second end of the first channel terminal segment is connected to a first end of the second channel segment; a second end of the second channel segment extends in a direction opposite to the second direction, to be connected to a first end of the third channel segment; a second end of the third channel segment extends in the first direction, to be connected to a first end of the fourth channel segment; a second end of the fourth channel segment extends in the second direction, to be connected to a first end of the second channel terminal segment; and a second end of the second channel terminal segment is connected to the second region of the active layer.

* * * * *